(12) United States Patent
Ohchi et al.

(10) Patent No.: US 8,829,636 B2
(45) Date of Patent: Sep. 9, 2014

(54) SOLID-STATE IMAGE PICKUP DEVICE AND FABRICATION PROCESS THEREOF

(75) Inventors: Tomokazu Ohchi, Kumamoto (JP); Yuki Miyanami, Kanagawa (JP); Shinichi Arakawa, Kumamoto (JP)

(73) Assignee: Sony Corporation, Tokyo (JP)

( * ) Notice: Subject to any disclaimer, the term of this patent is extended or adjusted under 35 U.S.C. 154(b) by 72 days.

(21) Appl. No.: 12/860,158

(22) Filed: Aug. 20, 2010

(65) Prior Publication Data
US 2011/0204467 A1 Aug. 25, 2011

(30) Foreign Application Priority Data

Sep. 2, 2009 (JP) .................... 2009-202301
Jun. 3, 2010 (JP) .................... 2010-127960

(51) Int. Cl.
*H01L 31/102* (2006.01)

(52) U.S. Cl.
USPC .................... 257/446; 257/458; 257/E31.023

(58) Field of Classification Search
CPC ............. H01L 27/1463; H01L 27/146; H01L 27/14643; H01L 21/02521; H01L 21/02381; H01L 21/02505; H01L 2924/10253; H01L 21/02532; H01L 29/1608; H01L 25/167; H01L 27/14601; H01L 27/15; H01L 31/105; H01L 31/022408

USPC ................ 257/443, E33.046, 292, E31.003, 257/E31.023, E31.11, 458, 446
See application file for complete search history.

(56) References Cited

U.S. PATENT DOCUMENTS

| 6,844,251 B2 * | 1/2005 | Shenai et al. ............... 438/571 |
| 2005/0167709 A1 * | 8/2005 | Augusto ..................... 257/292 |
| 2007/0023796 A1 * | 2/2007 | Adkisson et al. ............ 257/290 |

FOREIGN PATENT DOCUMENTS

JP 2005-167125 6/2005

OTHER PUBLICATIONS

Akozaki et al., "Steep Channel & Halo Profiles utilizing Boron-Diffusion-Barrier (SiC) for 32nm Node and Beyond", 2008 Symposium VLSI Technology Digest of Technical Papers (2008).

* cited by examiner

*Primary Examiner* — Wael Fahmy
*Assistant Examiner* — Sarah Salerno
(74) *Attorney, Agent, or Firm* — Robert J. Depke; The Chicago Technology Law Group, LLC

(57) ABSTRACT

A solid-state image pickup device has photodiodes, each of which includes an N-type region formed in a semiconductor substrate, a first silicon carbide layer formed above the N-type region, and a P-type region including a first silicon layer formed above the first silicon carbide layer and doped with boron. A fabrication process of such a solid-state image pickup device is also disclosed.

12 Claims, 39 Drawing Sheets

IMPLANT P-TYPE IMPURITY

SOLID-STATE IMAGE PICKUP DEVICE AND FABRICATION PROCESS THEREOF

The present application claims priority to Japanese Patent Applications JP 2010-127690 and 2009-202301 filed in the Japanese Patent Office on Jun. 3, 2010 and Sep. 2, 2009, respectively, the entire contents of which is hereby incorporated by reference.

BACKGROUND OF THE INVENTION

1. Field of the Invention

This invention relates to a solid-state image pickup device and its fabrication process.

2. Description of the Related Art

For solid-state image pickup devices, it has been common to adopt the front-side illuminated structure that electrodes and wirings are formed over a surface of a substrate, in which photoelectric converting sections are formed, and light is allowed to enter from above the electrodes and wirings. In solid-state image pickup devices such as CCD (Charge Coupled Devices) and CMOS (Complementary Metal Oxide Semiconductor) sensors that make use of silicon substrates as such substrates, a buried structure is adopted in recent years for photoelectric converting sections as image sensors to reduce noise.

A sectional view of a solid-state image pickup device of the front-side illuminated structure is shown in FIG. 8.

As shown in FIG. 8, the solid-state image pickup device 100 is a CMOS solid-state image pickup device having the front-side illuminated structure.

A light-receiving sensor section of each pixel has a structure called "the HAD (Hole Accumulation Diode) structure," specifically a structure that a P-type impurity is implanted in a surface of the light-receiving sensor section to cause pinning of excess electrons. By this HAD structure, reductions of white spots and dark current are realized.

Each light-receiving sensor section has a configuration that a photodiode PD is formed in a silicon substrate 101, a multilayer wiring layer 103 is arranged on the silicon substrate 101 via an interlayer insulating film 102, and further, a color filter 104 and a lens 105 are arranged in upper layers above the wiring layer 103. Incident light L passes through the lens 105, the color filter 104, and the interlayer insulating film 102 between the adjacent individual parts of the wiring layer 103, and enters the photodiode PD in the light-receiving sensor section.

Referring now to FIGS. 9A and 9B, a description will be made of a fabrication process of each buried sensor in a front-side illuminated, CMOS solid-state image pickup device.

As shown in FIG. 9A, a P-type buried region 202 is first formed in a silicon substrate 201 through an oxide film 231 formed on a surface of the silicon substrate 201 by ion implantation. This ion implantation is performed to form an overflow barrier for the HAD sensor, and to prevent electrons, which are given off from the silicon substrate 201, from entering a light-receiving sensor section.

Through the above-described oxide layer 231, a P-type element isolation region 221 is next formed in the silicon substrate 201. This P-type element isolation region 221 is formed, as a region for forming and isolating elements between pixels, in the silicon substrate 201 above the above-described P-type buried region 202. Subsequently, the oxide film 231 is removed.

As illustrated in FIG. 9B, a gate insulting film 211 is next formed on the silicon substrate 201, and via the gate insulating film 211, a transfer gate 212 is formed. Subsequently, an oxide film is formed again on the silicon substrate 201 as designated at numeral 232. At this time, the gate insulating film 211 other than a part thereof located below the transfer gate 212 may have been removed or may still remain. In the figure, the case where it has been removed is illustrated.

The formation of the light-receiving sensor section of the HAD structure is then performed as will be described hereinafter.

Through the oxide film 232, an N-type region 203 is first formed in the silicon substrate 201 by ion implantation. This ion implantation is performed in two stages, one for the formation of a layer for providing the resulting pixel with higher sensitivity, and the other for the formation of another layer for forming the light-receiving sensor section. The ion implantation for providing the resulting pixel with higher sensitivity is performed to a great depth, while the ion implantation for the formation of the light-receiving sensor section is performed to a relatively shallower depth than the ion implantation for providing the resulting pixel with higher sensitivity.

A P-type region 204 is next formed by ion implantation in the silicon substrate 201 above the N-type region 203 through the above-described oxide film 232. This ion implantation is performed to enhance pinning in the surface of the light-receiving sensor section. On this occasion, ions are obliquely implanted in view of transfer of charge so that no ions are allowed to penetrate into the silicon substrate 201 at a region adjacent a side wall of the transfer gate 212.

The photodiode PD is constructed with a PN junction formed between the N-type region 203 and the P-type region 204 as described above.

By the solid-state image pickup device of the buried sensor configuration having the above-described HAD structure, it is possible to substantially reduce noises such as dark current which have heretofore been produced in the surface of the light-receiving sensor section.

The buried solid-state image pickup device having the HAD structure is, therefore, considered to make it possible to realize excellent characteristics as a solid-state image pickup device.

The buried solid-state image pickup device having the HAD structure, however, involves a problem in that in the course of its fabrication, the boron (B) in the P-type region 204 in the light-receiving sensor section diffuses into the N-type region 203 in the silicon substrate 201 and the final impurity concentration profile of boron hence becomes broader. In the figure, the impurity profile of boron (B) is indicated by a dotted curve, and the profile of the N-type impurity (for example, phosphorus) is indicated by a solid curve.

It is, therefore, difficult to form a steep impurity concentration profile. Due to the broadening of the PN junction in the light-receiving sensor section, the saturation charge quantity (Qs) decreases significantly.

Moreover, such deviations from individual device parameters cause deteriorations of the sensor characteristics, the occurrence of increased white spots and black spots by the penetration of boron into the channel region, and variations or the like of the sensor characteristics due to instability of the amount of boron diffusion.

To solve the above-described problems, it is desired to suppress the occurrence of diffusion of boron under heat.

In MOSFET (Metal Oxide Semiconductor Field-Effect Transistor), on the other hand, several technologies have been reported for the prevention of boron diffusion.

To suppress the short channel effect that gives a rise to a problem as a result of miniaturization, for example, in advanced MOS (Metal Oxide Semiconductor) devices (e.g., nMOSFET) after the 32 nm node, a device having a steep channel and Halo profile structure making use of an SiC layer has been proposed. This nMOSFET will be described with reference to a schematic sectional configuration view shown in FIG. 10A and sectional photographic views shown in FIGS. 10B and 10C.

As depicted in FIG. 10A, there has been reported a technology that silicon is caused to undergo epitaxial growth after implantation of ions for adjusting a threshold voltage Vt. For example, subsequent to the formation of a boron-diffused region 313, an epitaxially-grown silicon layer 311 is formed by epitaxial growth. In this case, the final channel implantation profile becomes broader because of the existence of a thermal budget throughout the formation step. This broader final channel implantation profile is attributed to the diffusion of boron under heat, so that the transistor characteristics of an nMOSFET 310 are significantly lowered to lead to increased variations in characteristics.

As illustrated in FIG. 10B, an SiC layer 312 is hence introduced. This SiC layer 312 has been formed as an impurity diffusion barrier against boron diffusion by epitaxial growth. As carbon (C) is considered to be one of materials that can reduce the diffusion of boron (B), a technology has been developed that in the nMOSFET 310, the SiC layer 312 is formed below the epitaxially-grown silicon layer 311. Owing to the formation of the SiC layer 312, the diffusion of boron can be suppressed (see, for example, A. Hakozaki, H. Itokawa, N. Kusanoki, I. Mizushima, S. Inaba, S. Kawanaka and Y. Toyoshima, "Steep Channel & Halo Profiles Utilizing Boron-Diffusion-Barrier (SiC) for 32 nm Node and Beyond," 2008 Symposium on VLSI Technology Digests of Technical Papers (2008), hereinafter referred to as Non-patent Document 1).

As a result of practice of this technology, it has become possible to stabilize the concentration of the impurity contained in the channel part between the epitaxially-grown silicon layer 311 and the boron-diffused region 313 as depicted in FIG. 11 (see, for example, Non-patent Document 1).

As illustrated in FIG. 12, it has also been indicated that the short channel effect is suppressed owing to the possibility of suppressing variations in threshold voltage (Vth) and deteriorations of mobility and the possibility of suppressing broadening of a depletion layer at the same time (see, for example, Non-patent Document 1).

With reference to a schematic sectional configuration view shown in FIG. 13, a description will next be made about a method for suppressing diffusion of boron into an SiC layer in a heterojunction bipolar transistor.

As illustrated in FIG. 13, in a heterojunction bipolar transistor 401 in which an emitter electrode 430 is formed from silicon and a base is formed from silicon-germanium (SiGe), a silicon-germanium layer 427 with carbon contained in a base layer is formed to realize a high-frequency high-output transistor.

Described specifically, trench isolation regions 422 are formed in a P-type silicon substrate 421, and a subcollector layer 423 is formed between the trench isolation regions 422. Above the subcollector layer 423, a second collector diffusion layer 424 is formed, and further, an N+-type collector lead layer 426 is formed with an element isolation region 425 interposed between the N+-type collector lead layer 426 and the second collector diffusion layer 424. In addition, the carbon-containing, silicon-germanium layer 427 is formed on the P-type silicon substrate 421 by epitaxial growth to decrease the parasitic capacitance. Boron (B) is introduced in the carbon-containing, silicon-germanium layer 427 during its epitaxial growth, so that the carbon-containing, silicon-germanium layer 427 is provided with P-type conductivity. Its carbon concentration is about 0.5%.

On the carbon-containing, silicon-germanium layer 427, an oxide film 428 is formed further. Through an opening 429 formed in the oxide film 428, the emitter electrode 430 is formed in connection to the carbon-containing, silicon-germanium layer 427.

At a temperature of about 900° C. or so, the phosphorus in the emitter electrode 430 is caused to diffuse into the carbon-containing, silicon-germanium layer 427 as the base layer to form an emitter layer 431.

In general, diffusion of high-concentration phosphorus releases interstitial silicon, and therefore, creates a situation that the boron (B) in the base layer is facilitated to diffuse. As described above, however, the formation of the base layer with the carbon-containing, silicon-germanium layer 427 allows carbon (C) to interact with interstitial silicon so that the interstitial silicon is eliminated instead of forming interstitial silicon carbide (SiC). It has been reported that for the reasons mentioned above, accelerated diffusion of boron (B) under heat can be suppressed (see, for example, Japanese Patent Laid-open No. 2005-167125).

SUMMARY OF THE INVENTION

It is a problem to be solved that as a result of the diffusion of boron from a P-type region into an N-type region in a light-receiving sensor section, the final impurity concentration profile of boron is broadened to substantially lower the saturation charge quantity.

The present invention can suppress the diffusion of boron from a P-type region into an N-type region in a light-receiving sensor section, thereby making it possible to suppress a decrease in saturation charge quantity.

A solid-state image pickup device according to an embodiment of the present invention has photodiodes, each of which includes an N-type region formed in a semiconductor substrate, a first silicon carbide layer formed above the N-type region, and a P-type region having a first silicon layer formed above the first silicon carbide layer and doped with boron.

In the solid-state image pickup device according to the embodiment of the present invention, the first silicon carbide layer is formed between the N-type region and the boron-doped P-type region, which make up the photodiode. Diffusion of boron from the P-type region into the N-type region is, therefore, suppressed by the first silicon carbide layer. As a consequence, the impurity concentration distribution in a proximity of a boundary between the P-type region and the N-type region becomes an impurity concentration distribution having a so-called steep concentration gradient.

A process according to another embodiment of the present invention for fabricating a solid-state image pickup device including the steps of: forming a first silicon carbide layer on a semiconductor substrate by epitaxial growth, forming a first silicon layer on the first silicon carbide layer by epitaxial growth, forming N-type regions of photodiodes in the semiconductor substrate by ion implantation, and implanting boron into the first silicon layer above the N-type regions to form P-type regions of the photodiodes.

According to the process of another embodiment of the present invention for fabricating the solid-state image pickup device, the first silicon carbide layer is formed between the N-type region and the P-type region formed by performing ion implantation of boron into the first silicon layer, the N-type region and P-type region making up the photodiode. Diffusion of boron from the P-type region into the N-type region is, therefore, suppressed by the first silicon carbide layer. As a consequence, the impurity concentration distribution in the proximity of the boundary between the P-type region and the N-type region becomes an impurity concentration distribution having a so-called steep concentration gradient.

In the solid-state image pickup device according to the embodiment of the present invention, the impurity concentration distribution in the proximity of the boundary between the P-type region and the N-type region becomes an impurity concentration distribution having a so-called steep concentration gradient. It is, therefore, possible to increase the saturation charge quantity Qs.

The process according to another embodiment of the present invention for fabricating the solid-state image pickup device can increase the saturation charge quantity Qs, because the impurity concentration distribution in the proximity of the boundary between the P-type region and the N-type region becomes an impurity concentration distribution having a so-called steep concentration gradient.

DETAILED DESCRIPTION OF THE PREFERRED EMBODIMENTS

A description will hereinafter be made about the embodiments of the present invention. The description will be made in the below-described order.

1. First Embodiment
2. Second embodiment
3. Third embodiment (the back-side illuminated type, with inter-pixel isolation regions extending through a substrate)
4. Fourth embodiment (the back-side illuminated type, with inter-pixel isolation regions not extending through a substrate)
5. Fifth embodiment (the back-side illuminated type, with inter-pixel isolation regions and P-type regions of photodiodes being different in impurity concentration)
6. Sixth embodiment (the back-side illuminated type, with acceptance surfaces of photodiodes being curved surfaces)
7. Others

1. First Embodiment

[First Example of the Configuration of Solid-State Image Pickup Device]

The first example of the configuration of the solid-state image pickup device according to the first embodiment of the present invention will be described with reference to the schematic sectional configuration view shown in FIG. 1.

Figure 1:
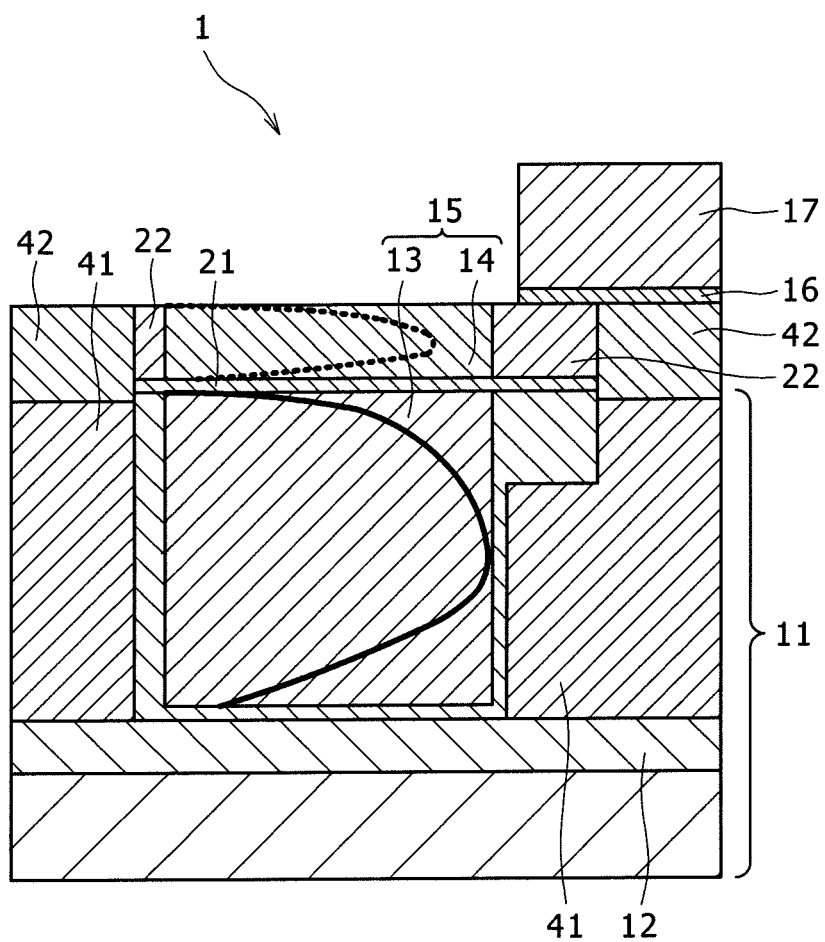
FIG. 1 is a schematic sectional configuration view illustrating a first example of the configuration of a solid-state image pickup device according to a first embodiment of the present invention.

As shown in FIG. 1, a silicon substrate is used as a semiconductor substrate 11, and a P-type buried region 12 doped with boron (B) is formed in the semiconductor substrate 11. This P-type buried region 12 serves as an overflow barrier region for a light-receiving sensor section (photodiode) of the HAD structure.

On the semiconductor substrate 11 above the P-type buried region 12, inter-pixel isolation regions 41 are formed to isolate pixels. These inter-pixel isolation regions 41 are formed, for example, of P-type impurity regions. These P-type impurity regions are formed, for example, of boron-doped regions.

On the semiconductor substrate 11, a first silicon carbide (SiC) layer 21 is formed. The film thickness of this first silicon carbide layer 21 may be set, for example, at from 5 nm to 10 nm. The concentration of carbon (C) in the first silicon carbide layer 21 may be set at from 0.1 atom % to 0.5 atom %.

The first silicon carbide layer 21 may be formed, for example, of an epitaxially grown layer of a crystalline structure inherited from the semiconductor substrate 11.

In addition, a first silicon layer 22 is formed on the first silicon carbide layer 21. This first silicon layer 22 may be formed, for example, of a non-doped silicon layer, and its film thickness may be set, for example, at from 10 nm to 20 nm. The first silicon layer 22 may also be formed, for example, of an epitaxially grown layer of a crystalline structure inherited from the first silicon carbide layer 21 as a base.

In the first silicon layer 22 above the inter-pixel isolation regions 41, inter-pixel isolation regions 42 are formed. These inter-pixel isolation regions 42 may be formed, for example, of P-type impurity regions. These P-type impurity regions may be formed, for example, of boron-doped regions.

In the semiconductor substrate 11 between the first silicon carbide layer 21 and the P-type buried region 12 and between the inter-pixel isolation regions 41, an N-type region 13 is formed. This N-type region 13 may be formed, for example, by doping an N-type impurity into the semiconductor substrate 11, and as the N-type impurity, phosphorus (P), arsenic (As), antimony (Sb) or the like can be used, for example. In this embodiment, phosphorus (P) is used as an example.

In the first silicon layer 22 between the inter-pixel isolation regions 42, a P-type region 14 is formed as an enhanced pinning region.

The photodiode 15 composed of the N-type region 13 and P-type region 14 is constructed as described above.

Although not illustrated in the figure, a silicon carbide layer may be formed between the P-type buried region 12 and the photodiode 15. By this silicon carbide layer, diffusion of boron from the P-type buried region 12 into the N-type region 13 can be prevented.

Above the first silicon layer 22 lateral to the photodiode 15 and an inter-pixel isolation region 42, a transfer gate 17 is formed via a gate insulating film 16. This transfer gate 17 may preferably be formed with a predetermined interval left from the P-type region 14 in view of a charge transfer. Although not shown in the figure, individual gate electrodes of pixel transistors, for example, reset transistors, amplification transistors, selection transistors and the like are also formed above the first silicon layer 22 via a gate insulating film (not shown).

The gate insulating film 16 may be formed, for example, of a silicon oxide film. The transfer gate 17, on the other hand, may be formed, for example, of a polysilicon film. The film thickness of this polysilicon film may be, for example, 180 nm. This film thickness can be changed as needed.

Each light-receiving sensor section of the solid-state image pickup device 1 is constructed as described.

In the above-described solid-state image pickup device 1, the impurity concentration distribution in the proximity of the boundary between the P-type region 14 and the N-type region 13 becomes an impurity concentration distribution having a so-called steep concentration gradient. It is, therefore, possible to increase the saturation charge quantity Qs.

As the penetration of boron into the channel region is prevented, the occurrence of white spots and black spots can be suppressed, and further, the diffusion of boron can also be suppressed. Therefore, the sensor characteristics remain stable.

[Second Example of the Configuration of Solid-State Image Pickup Device]

In the configuration described above in connection with the first example of the solid-state image pickup device, it is preferred to form silicon carbide layers around the inter-pixel isolation regions formed of the P-type impurity regions. As the second example of the configuration of the solid-state image pickup device according to the first embodiment of the present invention, its configuration will be described with reference to the schematic sectional configuration view shown in FIG. 2.

It is to be noted that a semiconductor substrate 11 shall include not only the semiconductor substrate 11 described above but also the first silicon carbide layer 21 and first silicon layer 22 formed on the semiconductor substrate 11.

Figure 2:
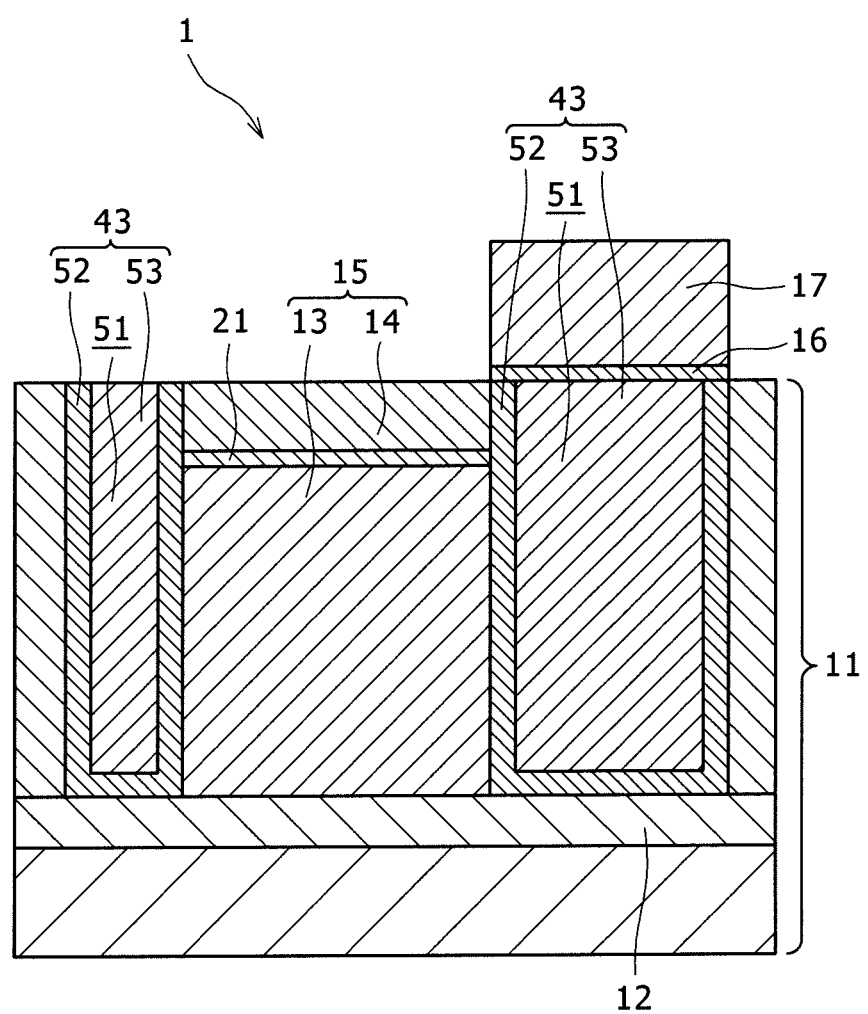
FIG. 2 is a schematic sectional configuration view illustrating a second example of the configuration of the solid-state image pickup device according to the first embodiment of the present invention.

As shown in FIG. 2, a silicon substrate is used as the semiconductor substrate 11, and a P-type buried region 12 doped with boron (B) is formed in the semiconductor substrate 11. This P-type buried region 12 serves as an overflow barrier region for a light-receiving sensor section (photodiode) of the HAD structure.

On the semiconductor substrate 11 above the P-type buried region 12, inter-pixel isolation trenches 51 are formed to isolate pixels. On inner walls of these isolation trenches 51, second silicon carbide (SiC) layers 52 are formed. The thickness of each second silicon carbide layer 52 may be set, for example, at from 10 nm to 25 nm. The concentration of carbon (C) in each second silicon carbide layer 52 may be set at from 0.1 atom % to 0.5 atom %.

Each second silicon carbide layer 52 may be formed, for example, of an epitaxially grown layer of a crystalline structure inherited from the semiconductor substrate 11.

Inside each isolation trench 51, a boron-doped silicon (Si) layer 53 is filled via the second silicon carbide layer 52. In this silicon layer 53, the concentration of boron (B) may be set, for example, at $3 \times 10^{16}$ atoms/cm$^3$.

An inter-pixel isolation region 43 is formed with the second silicon carbide layer 52 and the silicon layer 53.

In the semiconductor substrate 11 between the first silicon carbide layer 21 formed on the semiconductor substrate 11 and the P-type buried region 12 and between the inter-pixel isolation regions 43, an N-type region 13 is formed. This N-type region 13 may be formed by doping an N-type impurity into the semiconductor substrate 11, and as the N-type impurity, phosphorus (P), arsenic (As), antimony (Sb) or the like can be used, for example. In this embodiment, phosphorus (P) is used as an example.

In the first silicon layer 22 (see FIG. 1) between the inter-pixel isolation regions 43 and above the first silicon carbide layer 21, a P-type region 14 is formed as an enhanced pinning region.

The photodiode 15 composed of the N-type region 13 and P-type region 14 is constructed as described above.

Although not illustrated in the figure, a silicon carbide layer may be formed between the P-type buried region 12 and the photodiode 15. By this silicon carbide layer, diffusion of boron from the P-type buried region 12 into the N-type region 13 can be prevented.

Referring back to FIG. 1, the impurity concentration distribution in the N-type region 13 is indicated by a solid curve, and the impurity concentration distribution in the P-type region 14 is indicated by a dotted curve. According to these impurity concentration distributions, the concentrations become higher as the positions move rightward in the figure.

Now referring to FIG. 2 again, above the first silicon layer 22 lateral to the photodiode 15 and the inter-pixel isolation region 43, a transfer gate 17 is formed via a gate insulating film 16. This transfer gate 17 may preferably be formed with a predetermined interval left from the P-type region 14 in view of a charge transfer. Although not shown in the figure, individual gate electrodes of pixel transistors, for example, reset transistors, amplification transistors, selection transistors and the like are also formed above the first silicon layer 22 via a gate insulating film (not shown).

The gate insulating film 16 may be formed, for example, of a silicon oxide film. The transfer gate 17, on the other hand, may be formed, for example, of a polysilicon film. The film thickness of this polysilicon film may be, for example, 180 nm. This film thickness can be changed as needed.

Each light-receiving sensor section of the solid-state image pickup device 1 is constructed as described.

In the above-described solid-state image pickup device 1, the impurity concentration distribution in the proximity of the boundary between the P-type region 14 and the N-type region 13 becomes an impurity concentration distribution having a so-called steep concentration gradient. It is, therefore, possible to increase the saturation charge quantity Qs. In each inter-pixel isolation region 43, the second silicon carbide layer 52 is formed around the boron-doped silicon layer 53. It is, therefore, possible to prevent diffusion of boron (B) as in the first silicon carbide layer 21 formed at the PN junction between the P-type region 14 and the N-type region 13. Accordingly, the impurity concentration profile can be made steep.

As the penetration of boron into the channel region is prevented, the occurrence of white spots and black spots can be suppressed, and further, the diffusion of boron can also be suppressed. Therefore, the sensor characteristics remain stable.

2. Second Embodiment

[First Example of Fabrication Process of Solid-State Image Pickup Device]

The first example of the fabrication process of the solid-state image pickup device according to the second embodiment of the present invention will be described with reference to the schematic sectional fabrication-process views shown in FIGS. 3A through 3G. The description will be made taking a CMOS image sensor as an example. It is to be noted that concerning a removal step of a resist film and a formation step of a logic section, a description is omitted herein unless otherwise specifically indicated.

Figure 3A:
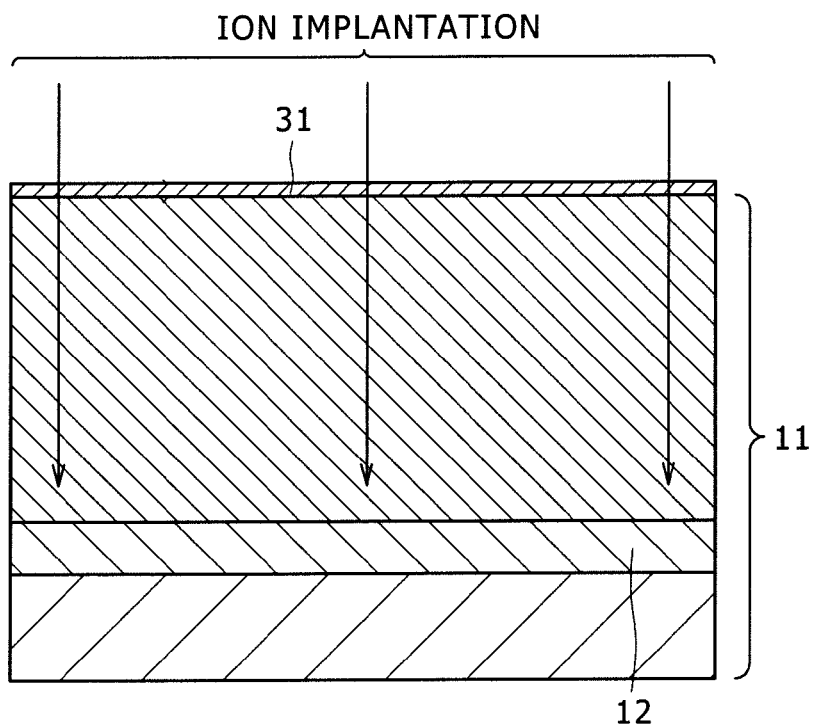
FIGS. 3A through 3G are schematic sectional fabrication-process views illustrating a first example of a fabrication process of a solid-state image pickup device according to a second embodiment of the present invention.

As illustrated in FIG. 3A, a silicon substrate is provided as a semiconductor substrate 11.

On the semiconductor substrate 11, an oxide film 31 is next formed to serve as a buffer film upon ion implantation. This oxide film 31 may be formed, for example, with a silicon oxide film, for example, by a thermal oxidation method, a chemical vapor growth method, or the like.

On the oxide film 31, a resist film (not shown) is next formed with an opening defined at a region where an overflow barrier for respective HAD sensors is to be formed. Using this resist film as a mask, boron (B) is introduced into the semiconductor substrate 11 through the oxide film 31 by ion implantation to form a P-type buried region 12. This P-type buried region 12 is formed to prevent electrons, which are given off from the semiconductor substrate 11, from entering light-receiving sensor sections to be formed. The above-described ion implantation requires high energy of, for example, 2,000 keV or greater as implantation energy. The P-type buried region 12 is formed as an overflow barrier region for HAD sensors as described above.

Although not illustrated in the figure, a silicon carbide layer may be formed above the P-type buried region 12, for example, by ion implantation. By this silicon carbide layer, diffusion of boron from the P-type buried region 12 into N-type regions of photodiodes to be formed subsequently can be prevented.

Subsequently, the resist film is removed.

Figure 3B:
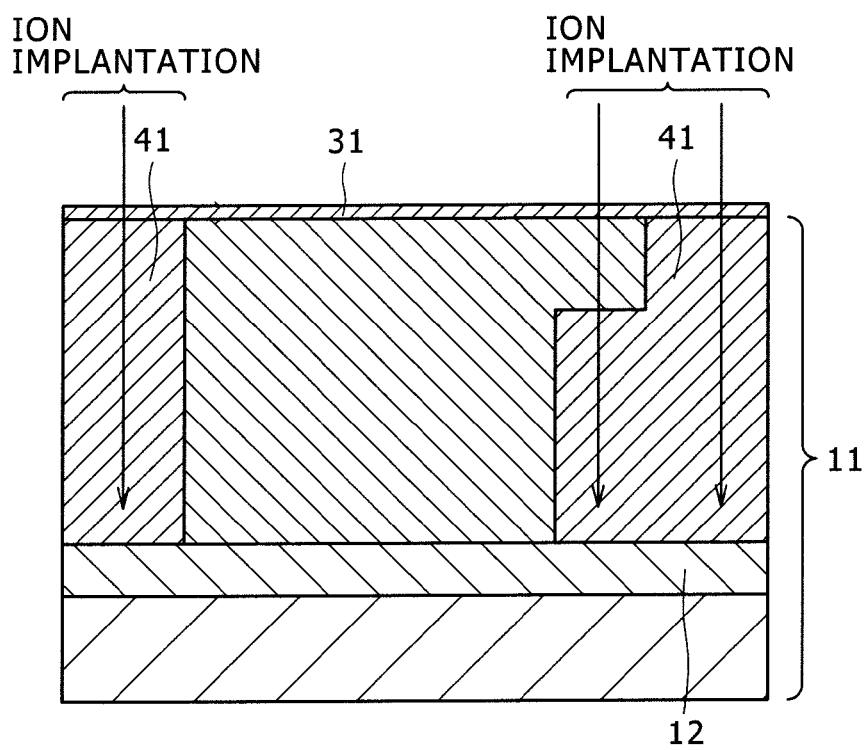

As illustrated in FIG. 3B, a resist film (not shown) with openings defined at regions where inter-pixel isolation regions 41 are to be formed is formed next. Using this resist film as a mask, boron (B) is introduced into the semiconductor substrate 11 through the oxide film 31 by ion implantation. By this ion implantation, the inter-pixel isolation regions 41 are formed in the semiconductor substrate 11 above the P-type buried region 12.

Subsequently, the resist film is removed.

The oxide film 31 is next removed with fluoric acid. In the figure, a state immediately before the removal of the oxide film 31 is illustrated.

Figure 3C:
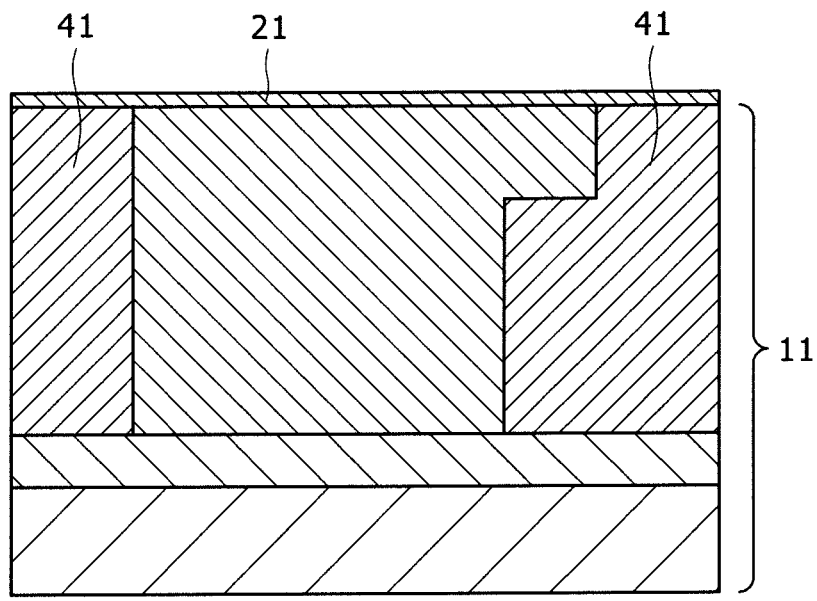

As illustrated in FIG. 3C, a first silicon carbide (SiC) layer 21 is then formed on the semiconductor substrate 11 by epitaxial growth. This epitaxial growth is a technology that subjects a silicon (Si) precursor gas to thermal decomposition in hydrogen ($H_2$) gas to form a thin silicon film having a similar crystalline structure as prime wafers. The film thickness of the first silicon carbide layer 21 may be set, for example, at from 5 nm to 10 nm. The concentration of carbon (C) in the first silicon carbide layer 21 may be set at from 0.1 atom % to 0.5 atom %.

One example of specific conditions for the epitaxial growth that forms the first silicon carbide layer 21 will hereinafter be described.

For example, monosilane ($SiH_4$), monomethylsilane ($SiH_3CH_3$, MMS) and hydrogen ($H_2$) are used as feed gases. The pressure of an atmosphere for the epitaxial growth is set at 1.33 kPa, the flow rate of monosilane ($SiH_4$) is set at 150 $cm^3$/min, the flow rate of monomethylsilane ($SiH_3CH_3$, MMS) is set at 100 $cm^3$/min, the flow rate of hydrogen ($H_2$) is set at 20 L/min, and the substrate temperature is set at 600° C.

It is to be noted that conditions for the epitaxial growth of the first silicon carbide layer 21 can be set, for example, in ranges to be described hereinafter. The pressure of an atmosphere for the epitaxial growth may be set at from 0.67 to 2.67 kPa. The flow rate of monosilane ($SiH_4$) may be set at from 100 $cm^3$/min to 300 $cm^3$/min, the flow rate of monomethylsilane (MMS) may be set at from 50 $cm^3$/min to 200 $cm^3$/min, and the flow rate of hydrogen ($H_2$) may be set at from 10 L/min to 30 L/min. Further, the substrate temperature may be set at from 550° C. to 650° C.

Figure 3D:
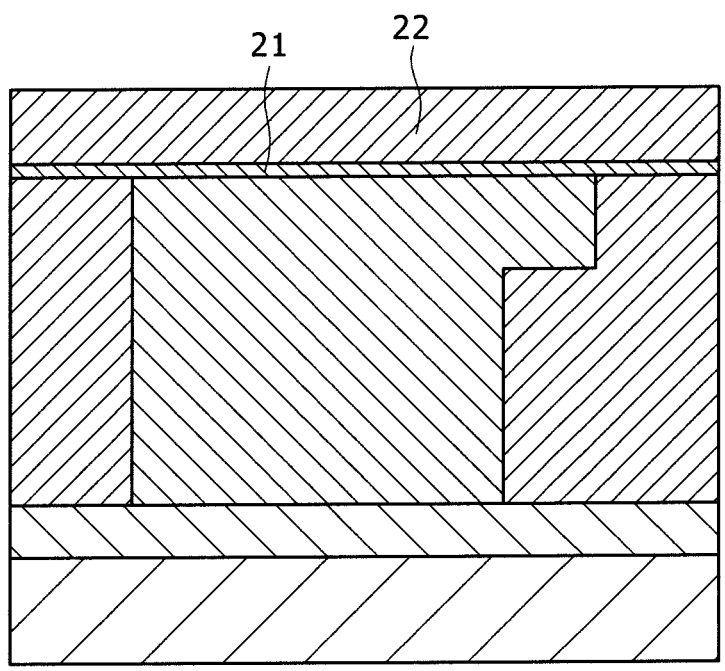

As illustrated in FIG. 3D, a first silicon layer 22 is next formed on the first silicon carbide layer 21 by epitaxial growth. This first silicon layer 22 may be formed, for example, with a non-doped silicon layer. The film thickness of the first silicon layer 22 may be set, for example, at from 10 nm to 20 nm.

One example of specific conditions for the epitaxial growth that forms the first silicon layer 22 will hereinafter be described.

For example, dichlorosilane ($SiCl_2H_2$: DCS) and hydrogen ($H_2$) are used as feed gases. The pressure of an atmosphere for the epitaxial growth is set at 1.33 kPa, the flow rate of dichlorosilane ($SiCl_2H_2$: DCS) is set at 25 $cm^3$/min, the flow rate of hydrogen ($H_2$) is set at 20 L/min, and the substrate temperature is set at 750° C.

It is to be noted that conditions for the epitaxial growth of the first silicon layer 22 can be set, for example, in ranges to be described hereinafter. The pressure of an atmosphere for the epitaxial growth may be set at from 0.67 to 2.67 kPa, the flow rate of dichlorosilane ($SiCl_2H_2$: DCS) may be set from 10 $cm^3$/min to 50 $cm^3$/min, the flow rate of hydrogen ($H_2$) may be set at from 10 L/min to 30 L/min, and the substrate temperature may be set at from 700° C. to 800° C.

Figure 3E:
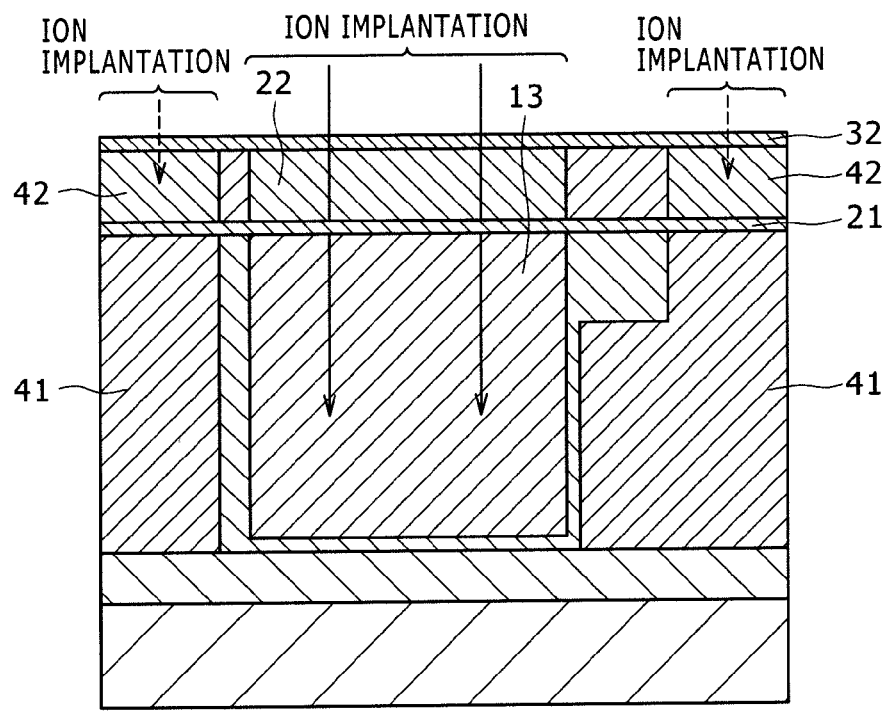

As illustrated in FIG. 3E, an oxide film 32 is next formed on the first silicon layer 22 to serve as a buffer film upon ion implantation. This oxide film 32 may be formed, for example, with a silicon oxide film, for example, by a thermal oxidation method, a chemical vapor growth method, or the like.

A resist film (not shown) with openings defined at regions where inter-pixel isolation regions 42 are to be formed is next formed on the oxide film 32. Using this resist film as a mask, boron (B) is introduced into the first silicon layer 22 through the oxide film 32 by ion implantation. By this ion implantation, the inter-pixel isolation regions 42 are formed in the first silicon layer 22 above the inter-pixel isolation regions 41.

Figure 3F:
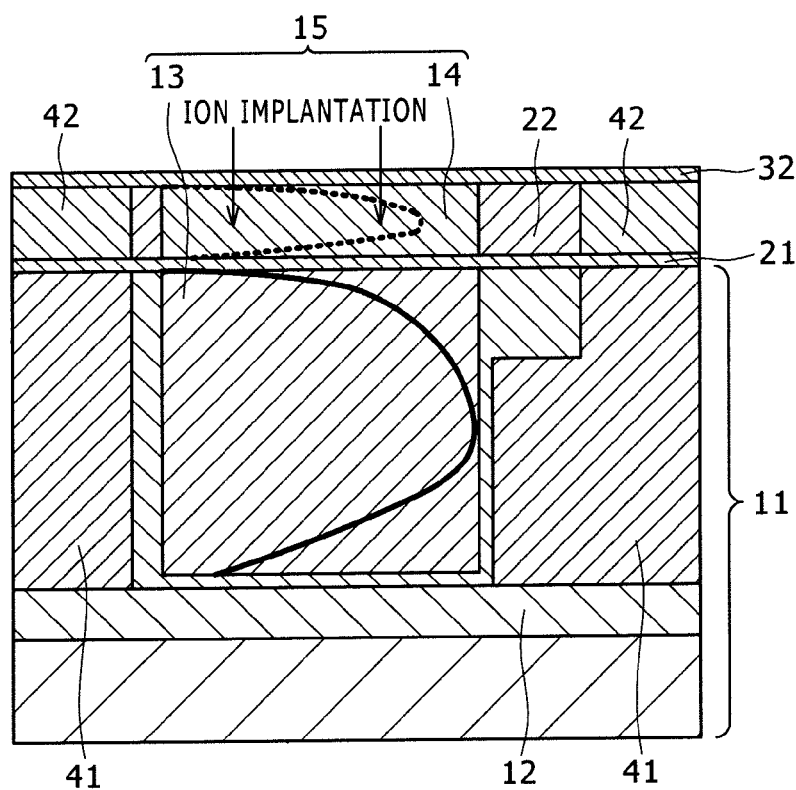

The resist film is removed subsequently. As illustrated in FIG. 3F, a resist film (not shown) with openings defined above regions where light-receiving sensor sections are to be formed is formed further on the oxide film 32. Using this resist film as a mask, phosphorus is introduced by ion implantation into the semiconductor substrate 11 through the oxide film 32, the first silicon layer 22, the first silicon carbide layer 21 and the like. By this ion implantation, N-type regions 13 are formed in the semiconductor substrate 11 between the inter-pixel isolation regions 41 above the P-type buried region 12.

The resist film is removed subsequently.

A resist film (not shown) with openings defined above regions where pinning is to be enhanced is next formed on the oxide film 32. Using this resist film as a mask, ion implantation of boron is performed through the oxide film 32. By this ion implantation, P-type regions 14 which serve as enhanced pinning regions are formed in the first silicon layer 22 between the inter-pixel isolation regions 42.

Photodiodes 15 are formed with the N-type regions 13 and P-type regions 14 as described above.

Further, the impurity concentration distribution in the N-type region 13 is indicated by a solid curve, and the impurity concentration distribution in the P-type region 14 is indicated by a dotted curve. According to these impurity concentration distributions, the concentrations become higher as the positions move rightward in the figure.

The oxide film 32 is next removed, for example, by wet etching. In the figure, a state immediately before the removal of the oxide film 32 is illustrated.

Figure 3G:
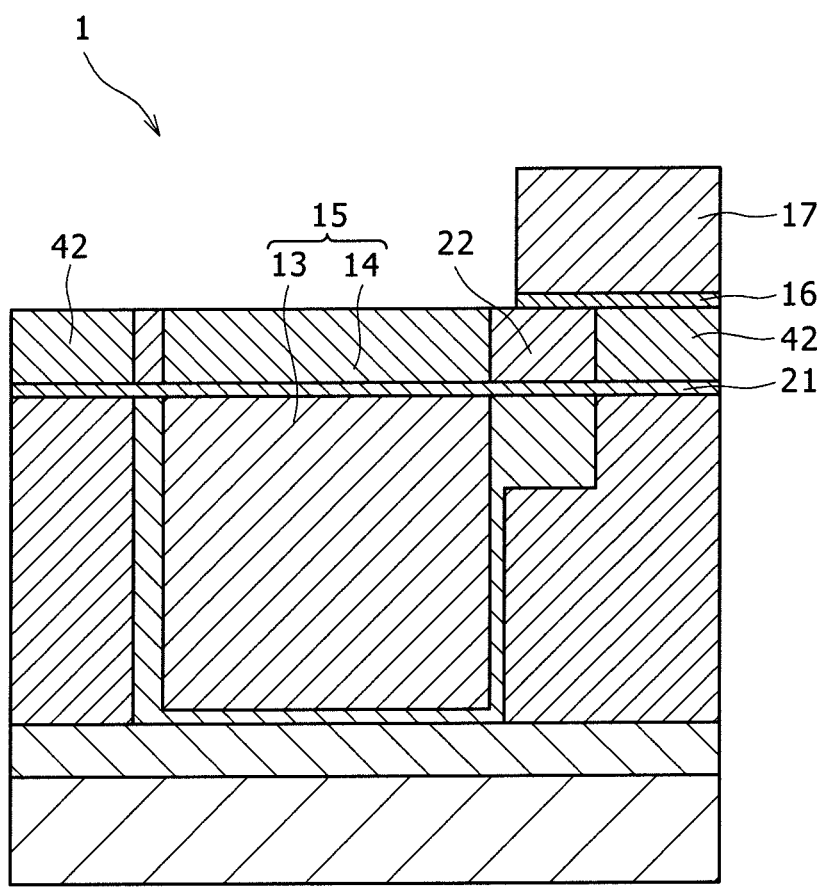

As illustrated in FIG. 3G, a transfer gate 17 is formed via a gate insulating film 16 above the first silicon layer 22, which is lateral to the photodiode 15 formed of the N-type region 13 and P-type region 14, and the inter-pixel isolation region 42. At this time, the transfer gate 17 may preferably be formed with a predetermined interval left from the P-type region 14 in view of a charge transfer. Although not shown in the figure, individual gate electrodes of pixel transistors, for example, reset transistors, amplification transistors, selection transistors and the like can also be formed at the same time as the above-described transfer gate 17.

The gate insulating film 16 may be formed by forming a silicon oxide film on the first silicon layer 22. As a conductive film useful in forming a transfer gate on the gate insulating film 16, a polysilicon film is next formed, for example. The film thickness of this polysilicon film may be set at 180 nm.

A resist film (not shown) is then formed such that regions, in which transfer gates of pixel sections are to be formed, are covered. Using this resist film as a mask, dry etching of the polysilicon film is performed. By this dry etching, the transfer gate 17 is formed. Subsequent steps can be performed without problem in the same manner as in known processes.

It is to be noted that, although not illustrated in the figure, the individual gate electrodes of reset transistors, amplification transistors, selection transistors and the like can also be formed at predetermined forming positions of such pixel transistors at the same time as the formation of the transfer gate 17.

The solid-state image pickup device 1 is formed as described.

In the above-described fabrication process of the solid-state image pickup device 1, the impurity concentration distribution in the proximity of the boundary between the P-type region 14 and the N-type region 13 becomes an impurity concentration distribution having a so-called steep concentration gradient. It is, therefore, possible to increase the saturation charge quantity Qs.

As the penetration of boron into the channel region is prevented, the occurrence of white spots and black spots can be suppressed, and further, the diffusion of boron can also be suppressed. Therefore, the sensor characteristics remain stable.

[Second Example of Fabrication Process of Solid-State Image Pickup Device]

The fabrication process of the solid-state image pickup device according to the second embodiment of the present invention will be described with reference to the sectional fabrication-process views shown in FIGS. 4A through 4E. Here, a description will be made of a method for forming the inter-pixel isolation regions 41, 42 by shallow trench isolation. It is to be noted that a semiconductor substrate 11 may be considered to include not only the above-described semiconductor substrate 11 and the first silicon carbide layer 21 and first silicon layer 22 formed on the semiconductor substrate 11. Concerning the formation of an inter-pixel isolation region 43, a description will be made including the first silicon carbide layer 21 and first silicon layer 22.

Figure 4A:
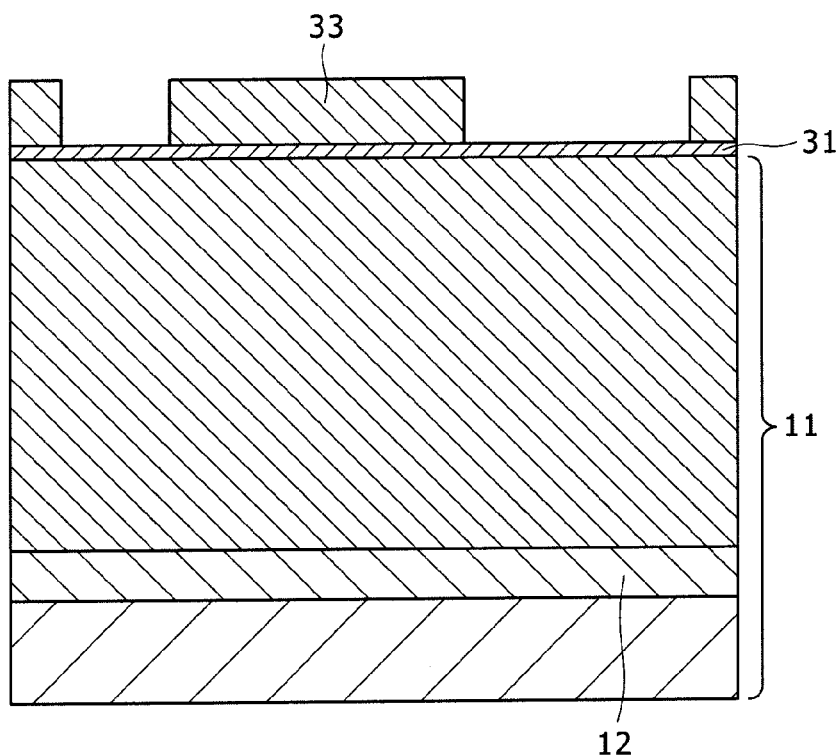
FIGS. 4A through 4E are schematic sectional fabrication-process views illustrating a second example of the fabrication process of the solid-state image pickup device according to the second embodiment of the present invention.

As illustrated in FIG. 4A, an oxide film 31 is next formed on the semiconductor substrate 11 to serve as a buffer film upon ion implantation. This oxide film 31 may be formed, for example, with a silicon oxide film, for example, by a thermal oxidation method, a chemical vapor growth method, or the like.

On the oxide film 31, a resist film (not shown) is next formed with an opening defined at a region where an overflow barrier for respective HAD sensors is to be formed. Using this resist film as a mask, boron (B) is introduced into the semiconductor substrate 11 through the oxide film 31 by ion implantation to form a P-type buried region 12. This P-type buried region 12 is formed to prevent electrons, which are given off from the semiconductor substrate 11, from entering light-receiving sensor sections to be formed. The above-described ion implantation requires high energy of, for example, 2,000 keV or greater as implantation energy. The P-type buried region 12 is formed as an overflow barrier region for HAD sensors as described above.

Subsequently, the resist film is removed.

An insulating film 33 is then formed as a hard mask on the oxide film 31. This insulating film 33 may desirably be formed, for example, with a silicon nitride film.

A resist film (not shown) with openings defined at regions where element isolation trenches are to be formed is next formed on the insulating film 33. Using the resist film as a mask, the insulating film 33 is processed by dry etching.

Figure 4B:
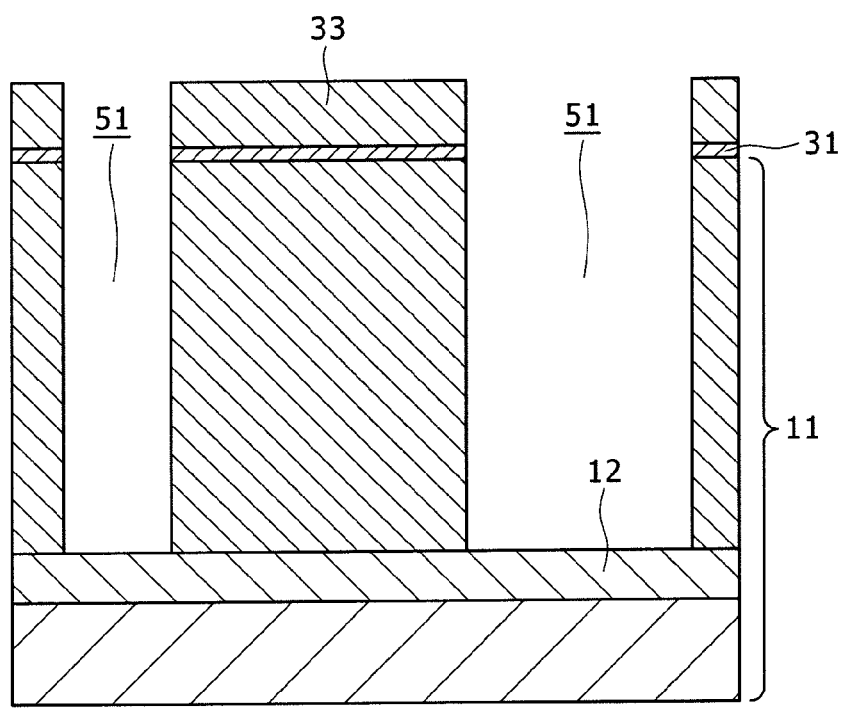

As illustrated in FIG. 4B, using the insulating film 33 as a mask, processing of the semiconductor substrate 11 is performed by dry etching to form inter-pixel isolation trenches 51. These inter-pixel isolation trenches 51 are formed in the semiconductor substrate 11 above the P-type buried regions 12. Illustrative processing of the semiconductor substrate 11 by the above-described dry etching will be described below.

In the above-described dry etching, hydrogen bromide (HBr), nitrogen fluoride ($NF_3$) and oxygen ($O_2$) are used as an example. The pressure of an etching atmosphere is set at 16.7 kPa, and the bias power is set at 450 W. As illustrative flow rates of the respective gases, the flow rate of hydrogen bromide (HBr) is set at 230 $cm^3$/min, the flow rate of nitrogen fluoride ($NF_3$) is set at 35 $cm^3$/min, and the flow rate of oxygen ($O_2$) is set at 17 $cm^3$/min.

It is to be noted that conditions for the above-described dry etching can be set, for example, in ranges to be described hereinafter. The pressure of the etching atmosphere can be set at from 2.67 to 26.7 kPa, and the bias power can be set at from 200 W to 1,000 W. The flow rate of hydrogen bromide (HBr) can be set in a range of from 200 $cm^3$/min to 400 $cm^3$/min, the flow rate of nitrogen fluoride ($NF_3$) can be set in a range of from 0.0 $cm^3$/min to 50 $cm^3$/min, and the flow rate of oxygen ($O_2$) can be set in a range of from 5 $cm^3$/min to 50 $cm^3$/min.

When processed under the above-described conditions, the inter-pixel isolation trenches 51 were finished with a width of 0.25 μm.

When the insulating film 33 as a hard mask for the drying etching is formed with a silicon nitride film, it is removed by wet etching making use of hot phosphoric acid.

Figure 4C:
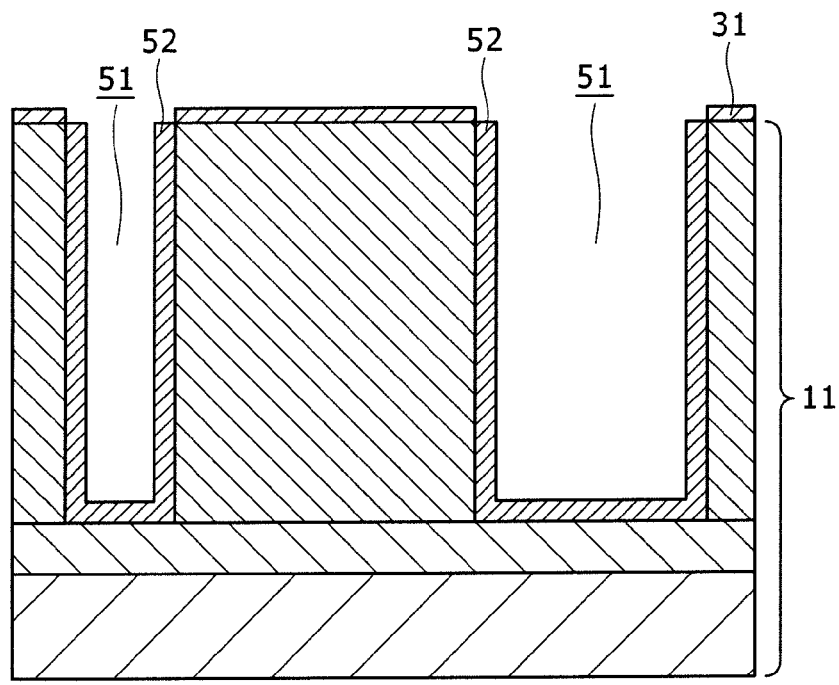

As illustrated in FIG. 4C, selective epitaxial growth is next applied to the semiconductor substrate 11 to form second silicon carbide (SiC) layers 52 on the inner walls of the respective inter-pixel isolation trenches 51. At this time, the oxide film 31 is formed on the surface of the semiconductor substrate 11, so that no epitaxial growth takes place there.

This epitaxial growth is a technology that subjects a silicon (Si) precursor gas to thermal decomposition in hydrogen ($H_2$) gas to form a thin silicon film having a similar crystalline structure as prime wafers. The film thickness of each second silicon carbide layer 52 may be set, for example, at from 10 nm to 25 nm. The concentration of carbon (C) in the second silicon carbide layer 52 may be set at from 0.1 atom % to 0.5 atom %.

One example of specific conditions for the selective epitaxial growth that forms the second silicon carbide layers 52 will hereinafter be described.

For example, dichlorosilane ($SiCl_2H_2$: DCS), hydrogen chloride (HCl), monomethylsilane ($SiH_3CH_3$: MMS) and hydrogen ($H_2$) are used as feed gases. The pressure of an atmosphere for the epitaxial growth is set at 6.7 kPa, the flow rate of dichlorosilane ($SiCl_2H_2$: DCS) is set at 80 $cm^3$/min, the flow rate of hydrogen chloride (HCl) is set at 15 $cm^3$/min, the flow rate of monomethylsilane ($SiH_3CH_3$: MMS) is set at 50 $cm^3$/min, the flow rate of hydrogen ($H_2$) is set at 20 L/min, and the substrate temperature is set at 700° C.

It is to be noted that the conditions for the epitaxial growth of the second silicon carbide layers 52 can be set, for example, in ranges to be described hereinafter. The pressure of a film-forming atmosphere can be set in a range of from 2.67 to 10.7 kPa. The flow rate of dichlorosilane (DCS) can be set in a range of from 40 $cm^3$/min to 120 $cm^3$/min, the flow rate of hydrogen chloride (HCl) can be set in a range of from 5 $cm^3$/min to 125 $cm^3$/min, the flow rate of monomethylsilane (MMS) can be set in a range of from 25 $cm^3$/min to 100 $cm^3$/min, and the flow rate of hydrogen ($H_2$) can be set in a range of from 10 L/min to 30 L/min. Further, the substrate temperature can be set in a range of from 650° C. to 750° C.

Figure 4D:
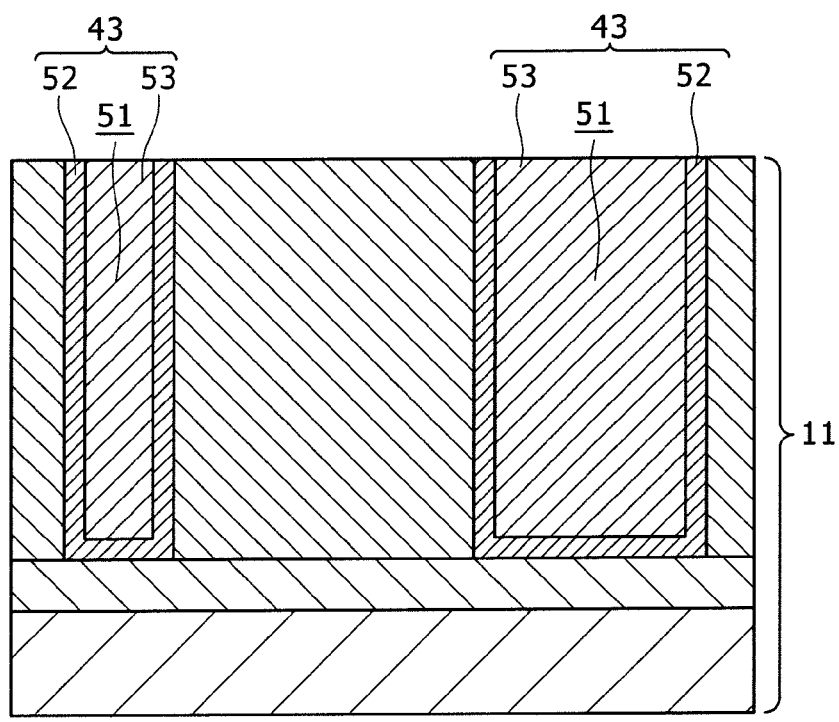

As illustrated in FIG. 4D, each inter-pixel isolation trench 51 is filled with a boron-doped silicon (Si) layer 53 formed by selective epitaxial growth on the semiconductor substrate 11 (practically, the second silicon carbide (SiC) layer 52). The film thickness of the boron-doped silicon (Si) layer 53 may be set, for example, at from 0.2 nm to 0.23 nm, and the boron (B) concentration of the boron-doped silicon (Si) layer 53 may be set, for example, at $3 \times 10^{16}$ atoms/$cm^3$. The inter-pixel isolation regions 43 are formed as described above.

As specific conditions, conditions for the selective epitaxial growth of the boron-doped silicon (Si) layers 53 will hereinafter be described.

For example, monosilane ($SiH_4$), diborane ($B_2H_6$), hydrogen chloride (HCl) and hydrogen ($H_2$) are used as feed gases, and the pressure of an atmosphere for the epitaxial growth is set at 1.33 kPa.

The flow rate of monosilane ($SiH_4$) is set at 150 $cm^3$/min, the flow rate of diborane ($B_2H_6$) (the concentration of diborane ($B_2H_6$) is set at 100 ppm/$H_2$) is set at 5 $cm^3$/min, the flow rate of hydrogen chloride (HCl) is set at 150 $cm^3$/min, and the flow rate of hydrogen ($H_2$) is set at 20 L/min.

The substrate temperature is set at 750° C.

It is to be noted that the conditions for the epitaxial growth can be set, for example, in ranges to be described hereinafter.

For example, the pressure of the atmosphere for the epitaxial growth can be set in a range of from 0.67 kPa to 2.67 kPa. Further, the flow rate of monosilane ($SiH_4$) can be set in a range of from 100 $cm^3$/min to 200 $cm^3$/min, the flow rate of diborane ($B_2H_6$) can be set in a range of from 1 $cm^3$/min to 10 $cm^3$/min, the flow rate of hydrogen chloride (HCl) can be set in a range of from 100 $cm^3$/min to 200 $cm^3$/min, and the flow rate of hydrogen ($H_2$) can be set in a range of from 10 L/min to 30 L/min. Further, the substrate temperature can be set at from 700° C. to 800° C.

The oxide film 31 is next removed, for example, by wet etching. In the figure, a state that the oxide film 31 has been removed is illustrated.

Figure 4E:
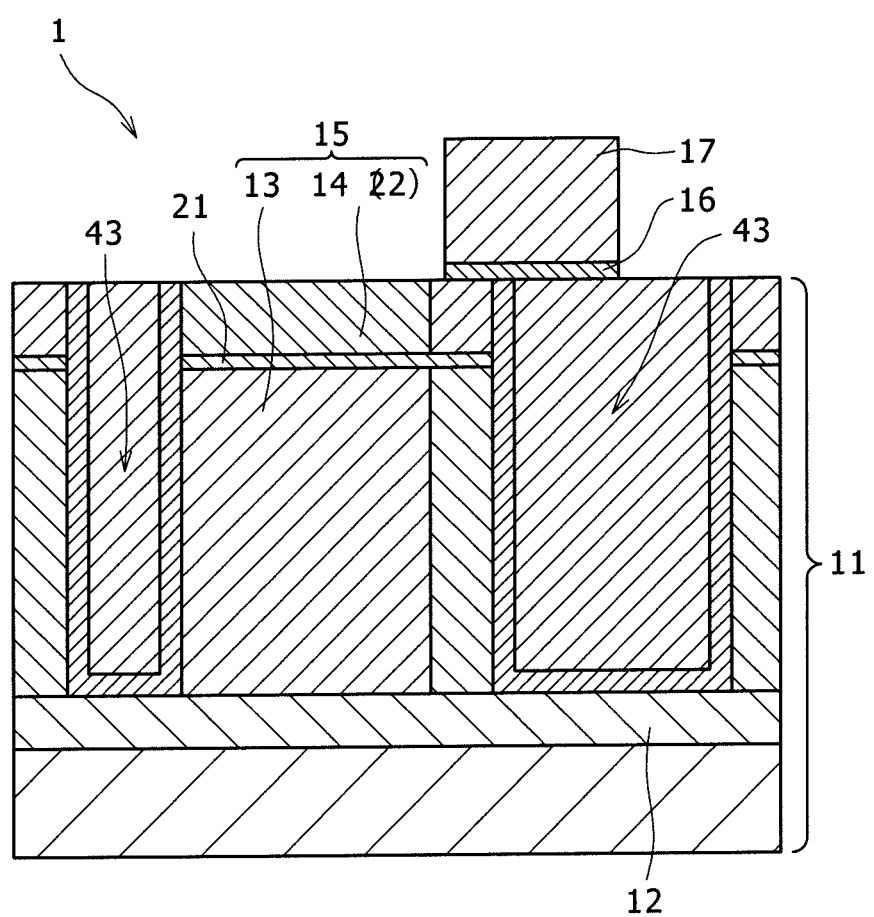

As illustrated in FIG. 4E, a resist film (not shown) with openings defined above regions where light-receiving sensor sections are to be formed is next formed on the semiconductor substrate 11. Using this resist film as a mask, phosphorus is introduced by ion implantation into the semiconductor substrate 11. By this ion implantation, N-type regions 13 are formed in the semiconductor substrate 11 between the inter-pixel isolation regions 43 above the P-type buried region 12.

Each P-type region 14 is next formed as an enhanced pinning region in the semiconductor substrate 11 above the corresponding N-type region 13.

At this time, it is preferred that using as a boundary the first silicon carbide layer 21 formed beforehand in the semiconductor substrate 11, the N-type region 13 is formed in the semiconductor substrate 11 on a side of a lower part thereof and the P-type region 14 is formed in the semiconductor substrate 11 (practically, the first silicon layer 22) on a side of an upper part thereof.

Each transfer gate 17 is formed via a gate insulating film 16 above the first silicon layer 22, which is lateral to the photodiode 15 formed of the N-type region 13 and P-type region 14 formed as described above, and the inter-pixel isolation region 43. At this time, the transfer gate 17 may preferably be formed with a predetermined interval left from the P-type region 14 in view of a charge transfer.

Although not shown in the figure, individual gate electrodes of pixel transistors, for example, reset transistors, amplification transistors, selection transistors and the like can also be formed at the same time as the above-described transfer gates 17.

The gate insulating film 16 may be formed by forming a silicon oxide film on the first silicon layer 22. As a conductive film useful in forming the transfer gates on the gate insulating film 16, a polysilicon film is next formed, for example. The film thickness of this polysilicon film may be set at 180 nm.

A resist film (not shown) is then formed such that regions, in which the transfer gates of pixel sections are to be formed, are covered. Using this resist film as a mask, dry etching of the polysilicon film is performed. By this dry etching, the transfer gates 17 are formed. Subsequent steps can be performed without problem in the same manner as in the processes hitherto known.

It is to be noted that, although not illustrated in the figure, the individual gate electrodes of the reset transistors, amplification transistors, selection transistors and the like can also be formed at predetermined forming positions of such pixel transistors at the same time as the formation of the transfer gates 17.

The solid-state image pickup device 1 is formed as described.

In the above-described fabrication process of the solid-state image pickup device, the impurity concentration distribution in the proximity of the boundary between the P-type region 14 and the N-type region 13 becomes an impurity concentration distribution having a so-called steep concentration gradient. It is, therefore, possible to increase the saturation charge quantity Qs. Further, the second silicon carbide layer 52 is formed around the boron-doped silicon layer 53 in the inter-pixel isolation region 43, and therefore, diffusion of boron (B) can be prevented as in the PN junction between the P-type region 14 and the N-type region 13. Accordingly, the impurity concentration profile can be made steep.

As the penetration of boron into the channel region is prevented, the occurrence of white spots and black spots can be suppressed, and further, the diffusion of boron can also be suppressed. Therefore, the sensor characteristics remain stable.

In the case of an oxide film, it has a high aspect-ratio shape, and therefore, involves a problem in buriability. On the other hand, a silicon layer is formed by epitaxial growth, and therefore, it is unnecessary to consider its buriability.

[Modification of Fabrication Process of Solid-State Image Pickup Device]

The modification of the fabrication process of the solid-state image pickup device according to the second embodiment of the present invention will be described with reference to the sectional fabrication-process views shown in FIGS. 5A and 5B. This modification of the fabrication process of the solid-state image pickup device is a modification of the second example of the fabrication process of the solid-state image pickup device.

Figure 5A:
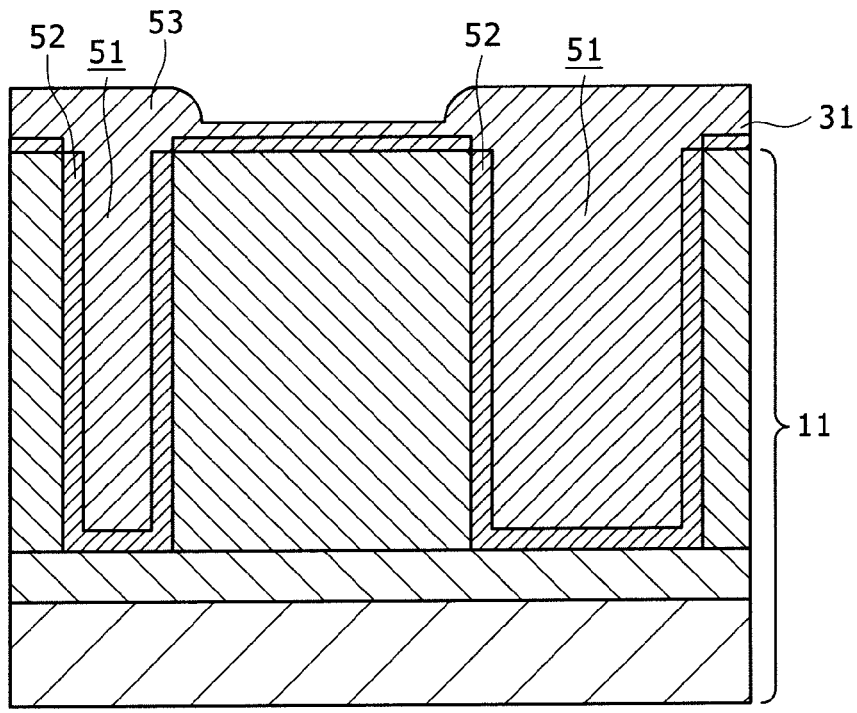
FIGS. 5A and 5B are schematic sectional fabrication-process views illustrating a modification of the second example of the fabrication process of the solid-state image pickup device.

As illustrated in FIG. 5A, up to the step described above with reference to FIG. 4C, similar fabrication steps as in the above-described second example are followed. Described specifically, epitaxial growth is applied to a semiconductor substrate 11 to form second silicon carbide (SiC) layers 52 on inner walls of respective inter-pixel isolation trenches 51 formed in the semiconductor substrate 11.

By ordinary epitaxial growth, each inter-pixel isolation trench 51 is filled with a silicon (Si) layer 53 formed by applying epitaxial growth to the semiconductor substrate 11 (practically, the second silicon carbide (SiC) layer 52) and doped with boron (B). At this time, the silicon layer 53 also grows in a lateral direction over the oxide film 31, and therefore, is also formed on the oxide layer 31. In epitaxial growth under such non-selective conditions, the silicon layer 53 is allowed to grow conformally.

The film thickness of the silicon layer 53 may be set, for example, at from 0.2 nm to 0.23 nm, and the boron (B) concentration of the silicon layer 53 may be set, for example, at $3 \times 10^{16}$ atoms/cm$^3$.

One example of conditions for the epitaxial growth of the silicon layers 53 doped with boron (B) will hereinafter be described.

Monosilane (SiH$_4$), diborane (B$_2$H$_6$), hydrogen chloride (HCl) and hydrogen (H$_2$) are used as feed gases, and the pressure of an atmosphere for the epitaxial growth is set at 1.33 kPa.

The flow rate of monosilane (SiH$_4$) is set at 150 cm$^3$/min, the flow rate of diborane (B$_2$H$_6$) (the concentration of diborane (B$_2$H$_6$) is set at 100 ppm/H$_2$) is set at 5 cm$^3$/min, the flow rate of hydrogen chloride (HCl) is set at 150 cm$^3$/min, and the flow rate of hydrogen (H$_2$) is set at 20 L/min.

Further, the substrate temperature is set at 800° C.

It is to be noted that the conditions for the epitaxial growth can be set, for example, in ranges to be described hereinafter. For example, the pressure of the atmosphere for the epitaxial growth can be set in a range of from 0.67 kPa to 2.67 kPa. Further, the flow rate of monosilane (SiH$_4$) can be set in a range of from 100 cm$^3$/min to 200 cm$^3$/min, the flow rate of diborane (B$_2$H$_6$) can be set in a range of from 1 cm$^3$/min to 10 cm$^3$/min, the flow rate of hydrogen chloride (HCl) can be set in a range of from 100 cm$^3$/min to 200 cm$^3$/min, and the flow rate of hydrogen (H$_2$) can be set in a range of from 10 L/min to 30 L/min. Further, the substrate temperature can be set at from 700° C. to 900° C.

Figure 5B:
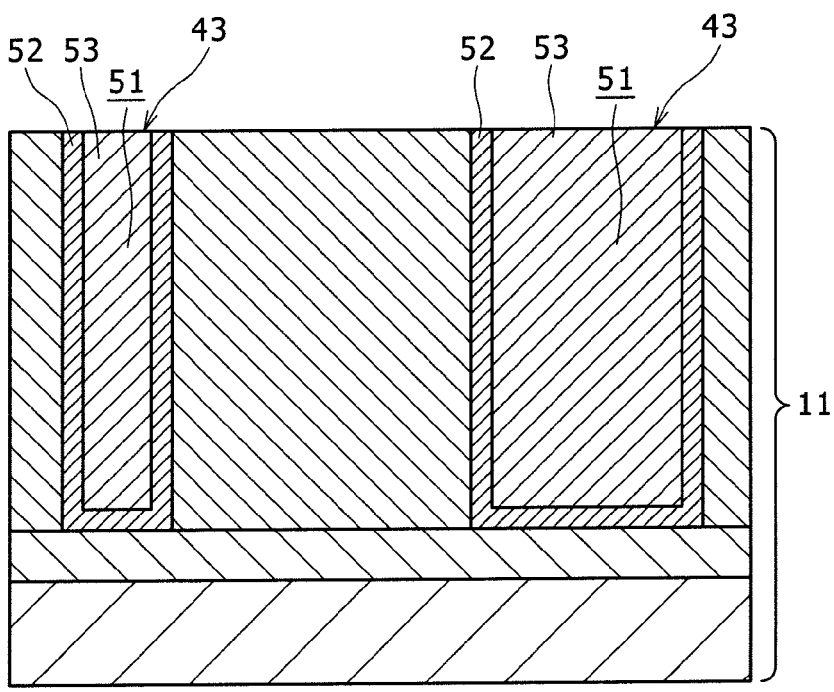

As illustrated in FIG. 5B, the boron-doped silicon layer 53 (see FIG. 5A) existing on the oxide film 31 (see FIG. 5A) is next removed by dry etching. Further, the oxide film 31 is removed by etching. As an alternative, any surplus silicon layer 53 and oxide film 31 on the surface of the semiconductor substrate 11 may be removed by chemical mechanical polishing (CMP).

As a result, an inter-pixel isolation region 43 is formed with the boron-doped silicon layer 53 formed inside the inter-pixel isolation trench 51 via the second silicon carbide layer 52.

It is then necessary to perform the step described above with reference to FIG. 4E and its subsequent steps.

In this modification, the silicon layer 53 is allowed to grow conformally, so that during the growth of the silicon layer 53, the occurrence of voids inside the inter-pixel isolation trench 51 can be suppressed.

[Third Example of Fabrication Process of Solid-State Image Pickup Device]

The third example of the fabrication process of the solid-state image pickup device according to the second embodiment of the present invention will be described with reference to the sectional fabrication-process views shown in FIGS. 6A through 6D.

Figure 6A:
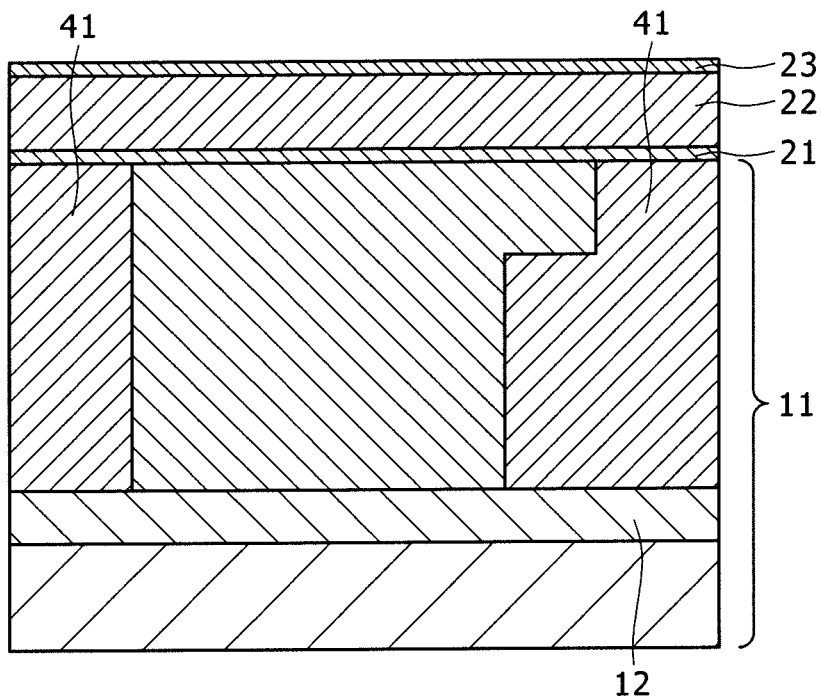
FIGS. 6A through 6D are schematic sectional fabrication-process views illustrating a third example of the fabrication process of the solid-state image pickup device according to the second embodiment of the present invention.

As illustrated in FIG. 6A, a P-type buried region 12 is formed by introducing boron (B) into a semiconductor substrate 11 by ion implantation as in the above-described first example. Further, boron (B) is introduced by ion implantation into the semiconductor substrate 11 above the P-type buried region 12 to form an inter-pixel isolation region 41.

Subsequently, a first silicon carbide layer 21 and a first silicon layer 22 are formed on the semiconductor substrate 11.

On the first silicon layer 22, a third silicon carbide layer 23 is then formed by epitaxial growth.

This epitaxial growth is a technology that subjects a silicon (Si) precursor gas to thermal decomposition in hydrogen ($H_2$) gas to form a thin silicon film having a similar crystalline structure as prime wafers. The film thickness of the third silicon carbide layer 23 may be set, for example, at from 5 nm to 10 nm. The concentration of carbon (C) in the third silicon carbide layer 23 may be set at from 0.1 atom % to 0.5 atom %.

One example of specific conditions for the epitaxial growth that forms the third silicon carbide layer 23 will hereinafter be described.

For example, monosilane ($SiH_4$), monomethylsilane ($SiH_3CH_3$: MMS) and hydrogen ($H_2$) are used as feed gases. The pressure of an atmosphere for the epitaxial growth is set at 1.33 kPa, the flow rate of monosilane ($SiH_4$) is set at 150 cm$^3$/min, the flow rate of monomethylsilane ($SiH_3CH_3$: MMS) is set at 100 cm$^3$/min, the flow rate of hydrogen ($H_2$) is set at 20 L/min, and the substrate temperature is set at 600° C.

It is to be noted that conditions for the epitaxial growth of the first silicon carbide layer 21 can be set, for example, in ranges to be described hereinafter. The pressure of the atmosphere for the epitaxial growth may be set at from 0.67 to 2.67 kPa. The flow rate of monosilane ($SiH_4$) may be set at from 100 cm$^3$/min to 300 cm$^3$/min, the flow rate of monomethylsilane (MMS) may be set at from 50 cm$^3$/min to 200 cm$^3$/min, and the flow rate of hydrogen ($H_2$) may be set at from 10 L/min to 30 L/min. Further, the substrate temperature may be set at from 550° C. to 650° C.

Figure 6B:
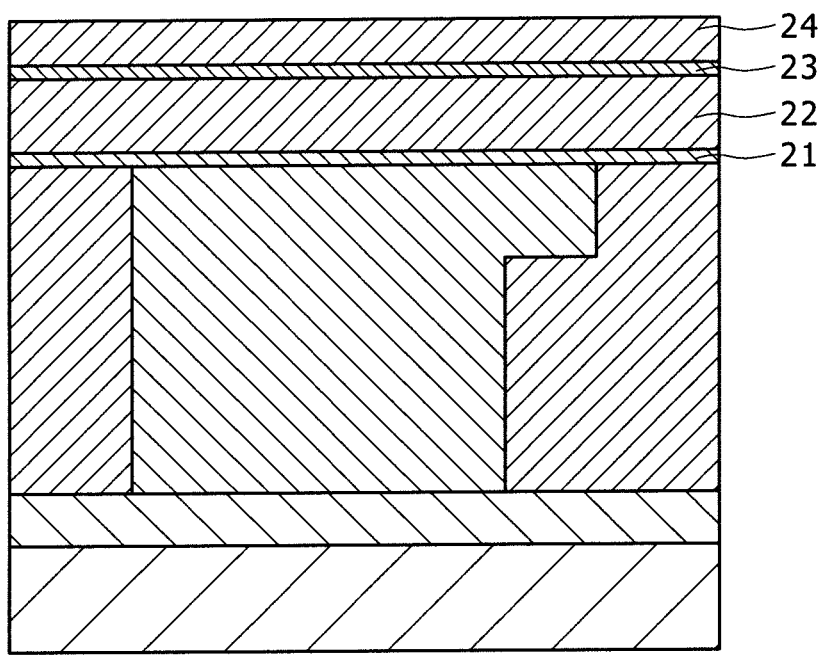

As illustrated in FIG. 6B, a second silicon layer 24 is next formed on the third silicon carbide layer 23 by epitaxial growth. This second silicon layer 24 may be formed, for example, with a non-doped silicon layer. The film thickness of the second silicon layer 24 may be set, for example, at from 10 nm to 20 nm.

One example of specific conditions for the epitaxial growth that forms the second silicon layer 24 will hereinafter be described.

For example, dichlorosilane ($SiCl_2H_2$: DCS) and hydrogen ($H_2$) are used as feed gases. The pressure of an atmosphere for the epitaxial growth is set at 1.33 kPa, the flow rate of dichlorosilane ($SiCl_2H_2$: DCS) is set at 25 cm$^3$/min, the flow rate of hydrogen ($H_2$) is set at 20 L/min, and the substrate temperature is set at 750° C.

It is to be noted that conditions for the epitaxial growth of the second silicon layer 24 can be set, for example, in ranges to be described hereinafter. The pressure of the atmosphere for the epitaxial growth may be set at from 0.67 to 2.67 kPa, the flow rate of dichlorosilane ($SiCl_2H_2$: DCS) may be set at from 10 cm$^3$/min to 50 cm$^3$/min, the flow rate of hydrogen ($H_2$) may be set at from 10 L/min to 30 L/min, and the substrate temperature may be set at from 700° C. to 800° C.

Figure 6C:
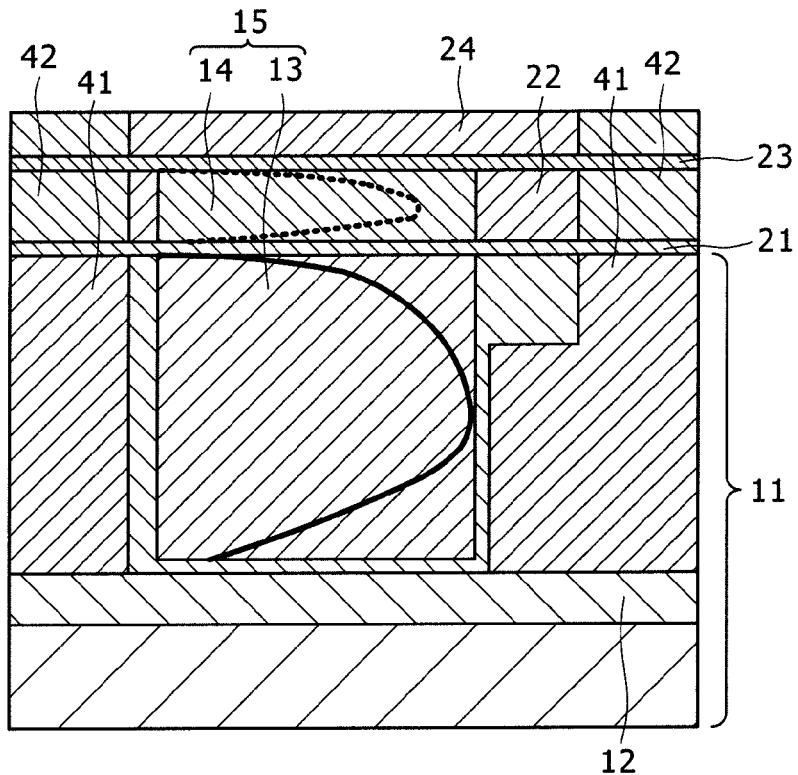

As illustrated in FIG. 6C, an oxide film (not shown) is next formed on the second silicon layer 24 and first silicon layer 22 to serve as a buffer film upon ion implantation. This oxide film may be formed, for example, with a silicon oxide film, for example, by a thermal oxidation method, a chemical vapor growth method, or the like.

A resist film (not shown) with openings defined at regions where inter-pixel isolation regions are to be formed is next formed on the oxide film. Using this resist film as a mask, boron (B) is introduced into the second silicon layer 24 and first silicon layer 22 through the oxide film by ion implantation. By this ion implantation, inter-pixel isolation regions 42 are formed in the second silicon layer 24 and first silicon layer 22 above the inter-pixel isolation regions 41.

The resist film is removed subsequently.

A resist film (not shown) with openings defined above regions where light-receiving sensor sections are to be formed is formed further on the oxide film. Using this resist film as a mask, phosphorus is introduced by ion implantation into the semiconductor substrate 11 through the oxide film, the second silicon layer 24, the third silicon carbide layer 23, the first silicon layer 22, the first silicon carbide layer 21 and the like. By this ion implantation, N-type regions 13 are formed in the semiconductor substrate 11 between the inter-pixel isolation regions 41 above the P-type buried region 12.

The resist film is removed subsequently.

A resist film (not shown) with openings defined above regions where pinning is to be enhanced is next formed on the oxide film. Using this resist film as a mask, ion implantation of boron is performed into the first silicon layer 22 through the oxide film, second silicon layer 24 and third silicon carbide layer 23. By this ion implantation, P-type regions 14 which serve as enhanced pinning regions are formed in the first silicon layer 22 between the inter-pixel isolation regions 42.

Photodiodes 15 are formed with the N-type regions 13 and P-type regions 14 as described above.

Further, the impurity concentration distribution in the N-type region 13 is indicated by a solid curve, and the impurity concentration distribution in the P-type region 14 is indicated by a dotted curve. According to these impurity concentration distributions, the concentrations become higher as the positions move rightward in the figure.

The oxide film, second silicon layer 24 and third silicon carbide layer 23 are next removed, for example, by wet etching. In the figure, a state immediately before the removal of the oxide film and the like is illustrated.

Figure 6D:
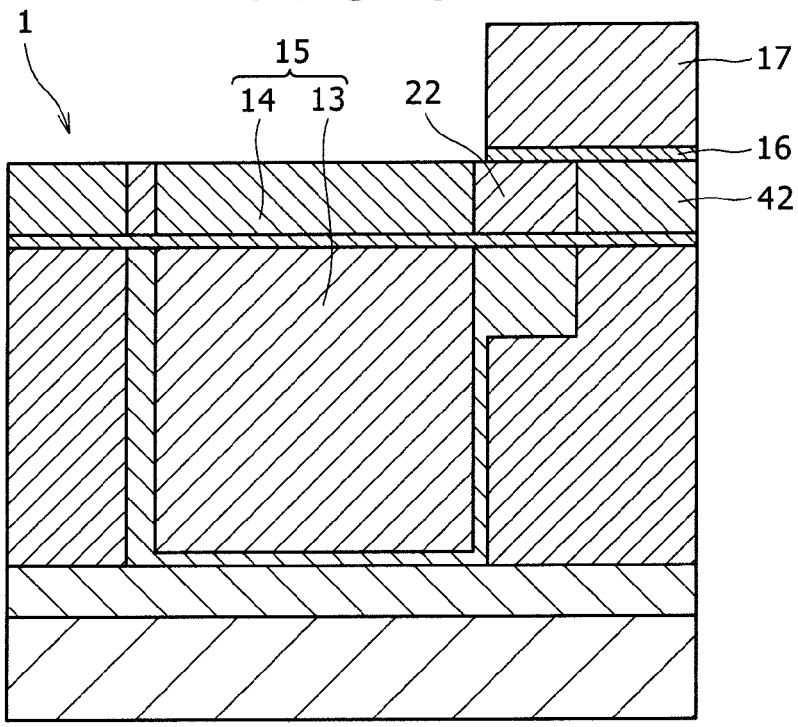

As illustrated in FIG. 6D, a transfer gate 17 is formed via a gate insulating film 16 above the first silicon layer 22, which is lateral to the photodiode 15, and the inter-pixel isolation region 42. At this time, the transfer gate 17 may preferably be formed with a predetermined interval left from the P-type region 14 in view of a charge transfer. Although not shown in the figure, individual gate electrodes of pixel transistors, for example, reset transistors, amplification transistors, selection transistors and the like can also be formed at the same time as the above-described transfer gate 17.

The gate insulating film 16 may be formed by forming a silicon oxide film on the first silicon layer 22. As a conductive film useful in forming a transfer gate on the gate insulating film, a polysilicon film is next formed, for example. The film thickness of this polysilicon film may be set at 180 nm.

A resist film (not shown) is then formed such that regions, in which the transfer gates of pixel sections are to be formed, are covered. Using this resist film as a mask, dry etching of the polysilicon film is performed. By this dry etching, the transfer gates 17 are formed. Subsequent steps can be performed without problem in the same manner as in the known processes.

It is to be noted that, although not illustrated in the figure, the individual gate electrodes of the reset transistors, amplification transistors, selection transistors and the like can also be formed at predetermined forming positions of such pixel transistors at the same time as the formation of the transfer gates 17.

A solid-state image pickup device 1 is formed as described above.

In the above-described fabrication process of the solid-state image pickup device, the first silicon layer 22 in which the P-type region 14 is to be formed is flanked by the first silicon carbide layer 21 and the third silicon carbide layer 23, so that diffusion of boron can be suppressed during processing. The impurity concentration distribution in the proximity of the boundary between the P-type region 14 and the N-type region 13, therefore, becomes an impurity concentration distribution having a so-called steep concentration gradient, and hence, the saturation charge quantity Qs can be increased. In addition, the formation of the second silicon layer 24 makes it possible to form a through film (for example, a silicon oxide film) for ion implantation at a position remote from photodiodes.

As the penetration of boron into the channel region is prevented, the occurrence of white spots and black spots can be suppressed, and further, the diffusion of boron can also be suppressed. Therefore, the sensor characteristics remain stable.

In each of the above-described fabrication processes, annealing treatment may preferably be applied to the first silicon carbide layer 21, second silicon carbide layer 52 and third silicon carbide layer 23. The application of annealing treatment provides the first silicon carbide layer 21, second silicon carbide layer 52 and third silicon carbide layer 23 with improved reliability, thereby making it possible to also improve the suppressing effect for boron diffusion.

[Example of Configuration of Image Pickup Device]

One example of the configuration of an image pickup system to which the solid-state image pickup device of the present invention has been applied will be described with reference to the block diagram shown in FIG. 7. This image pickup system makes use of the solid-state image pickup device of the embodiments of the present invention.

Figure 7:
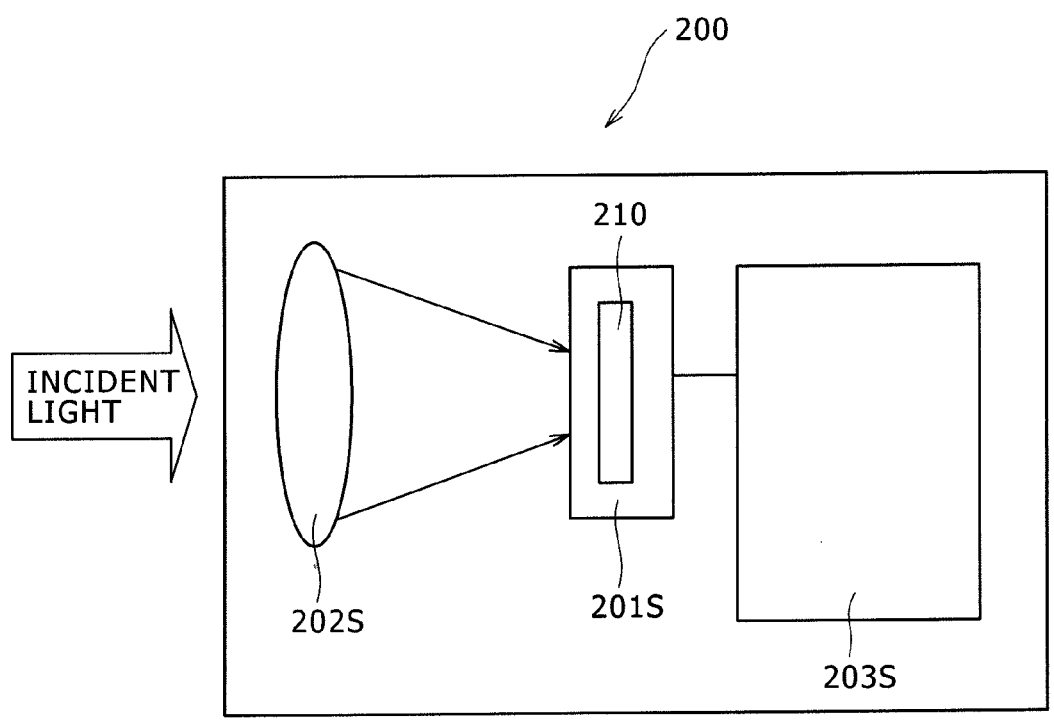
FIG. 7 is a block diagram illustrating one example of an image pickup system to which a solid-state image pickup device according to the embodiments of the present invention has been applied.
Figure 8:
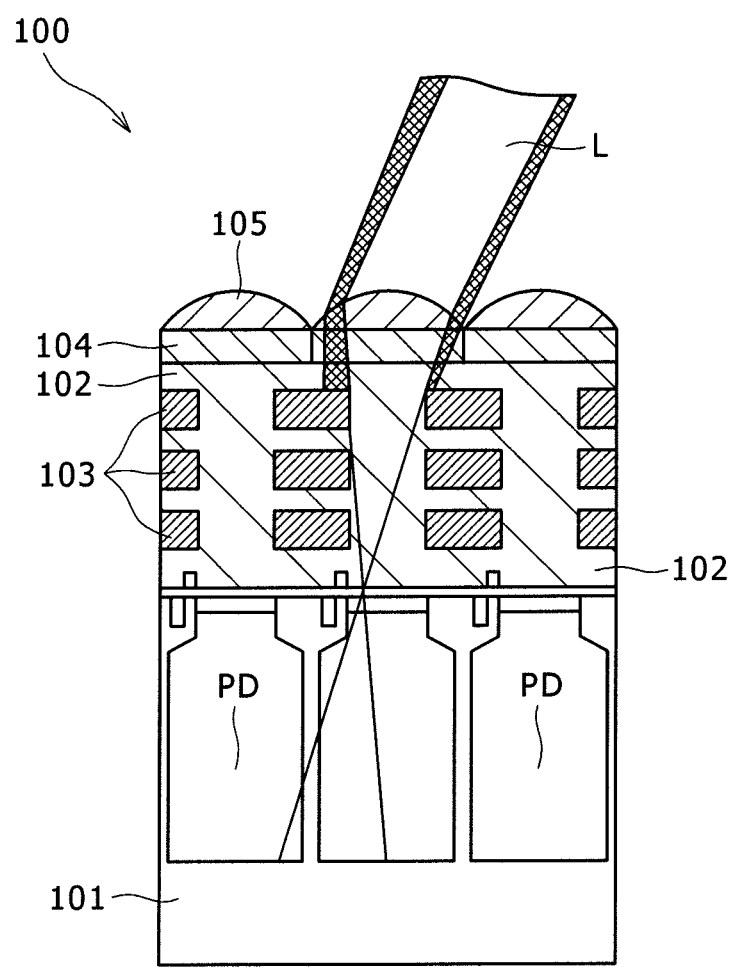
FIG. 8 is a fragmentary sectional view illustrating one example of a known solid-state image pickup device of the front-side illuminated structure.
Figure 9A:
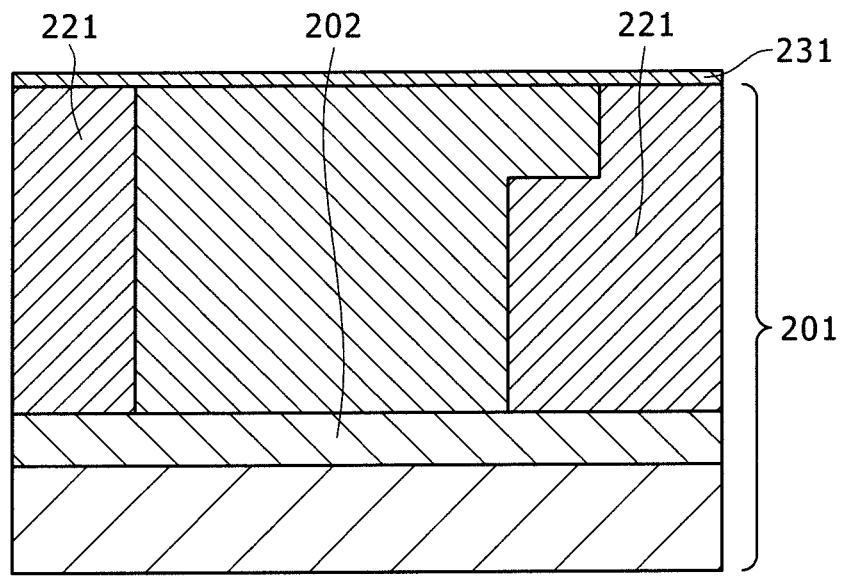
FIGS. 9A and 9B are sectional fabrication-process views illustrating a fabrication process of buried sensors in a known CMOS solid-state image pickup device of the front-side illuminated type.
Figure 9B:
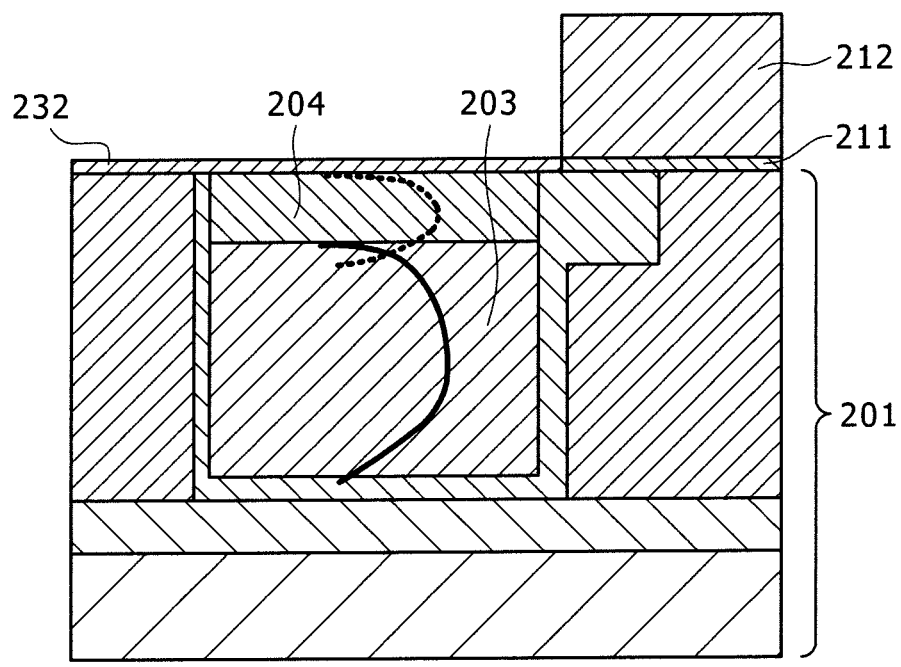
Figure 10A:
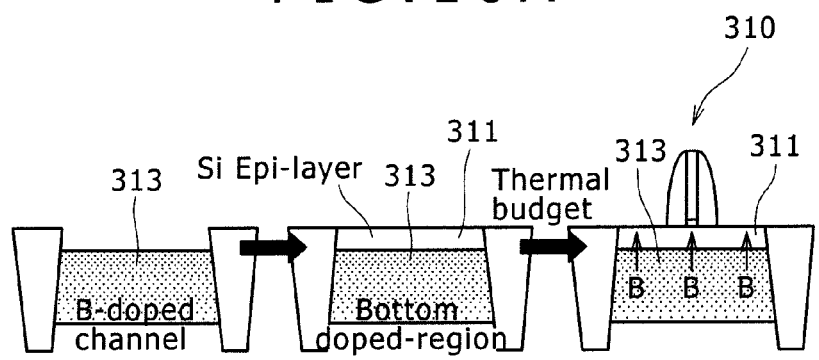
FIG. 10A is a schematic sectional configuration view illustrating an nMOSFET having a steep channel and Halo profile structure making use of an SiC layer.
Figures 10B, 10C:
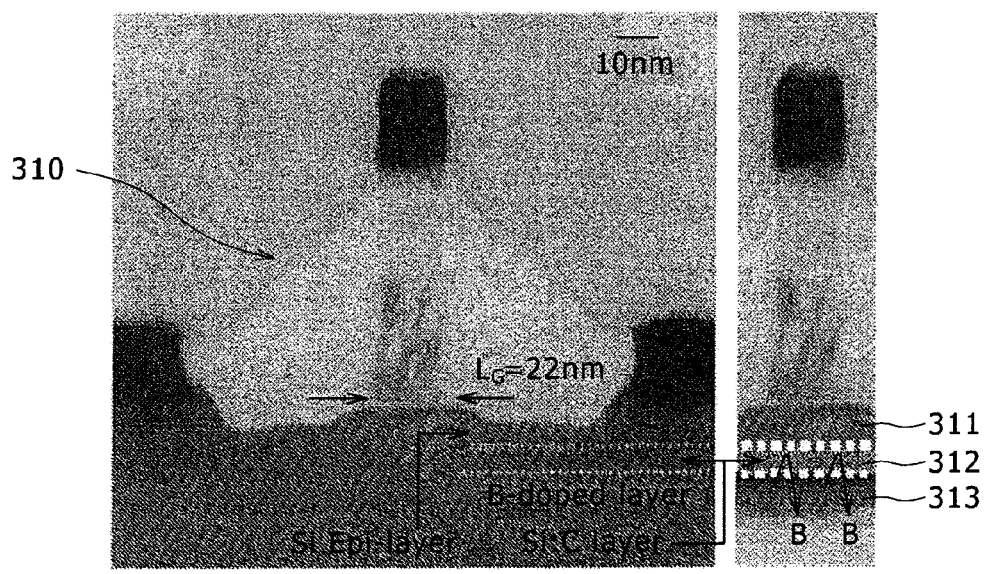
FIGS. 10B and 10C are sectional photographic views illustrating the nMOSFET.
Figure 11:
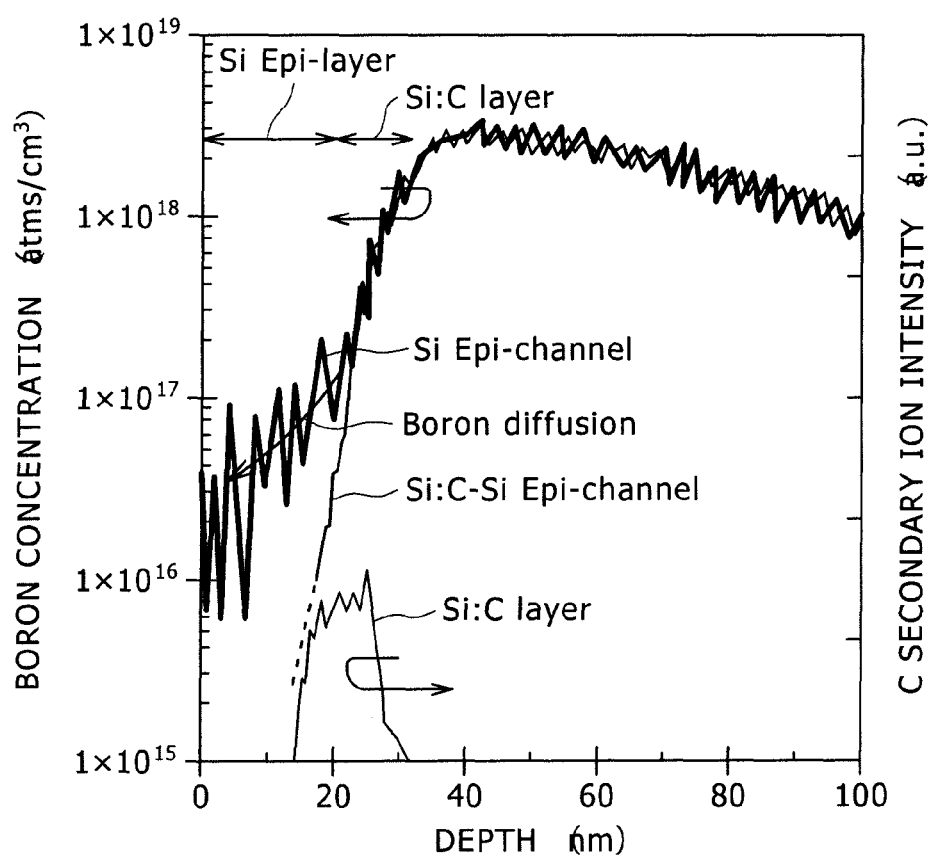
FIG. 11 is a concentration distribution diagram of boron in a depth direction.
Figure 12:
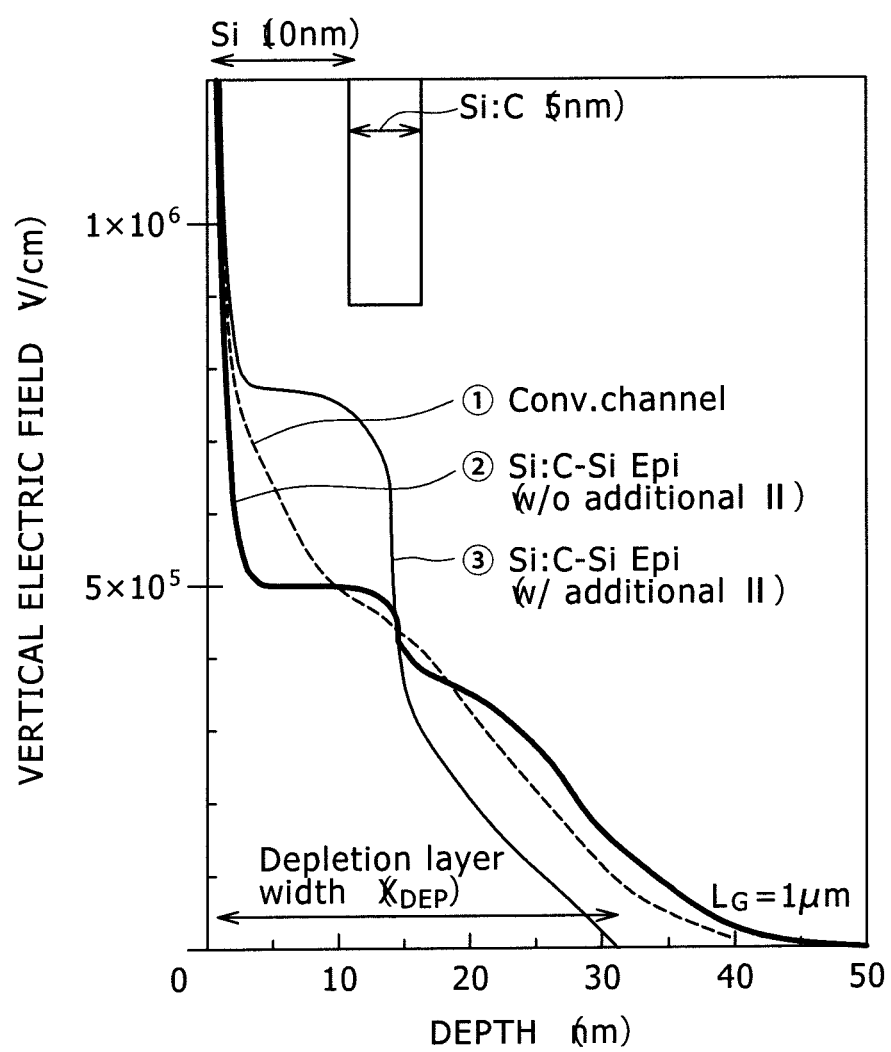
FIG. 12 is a distribution diagram of a vertical electric field in a depth direction.
Figure 13:
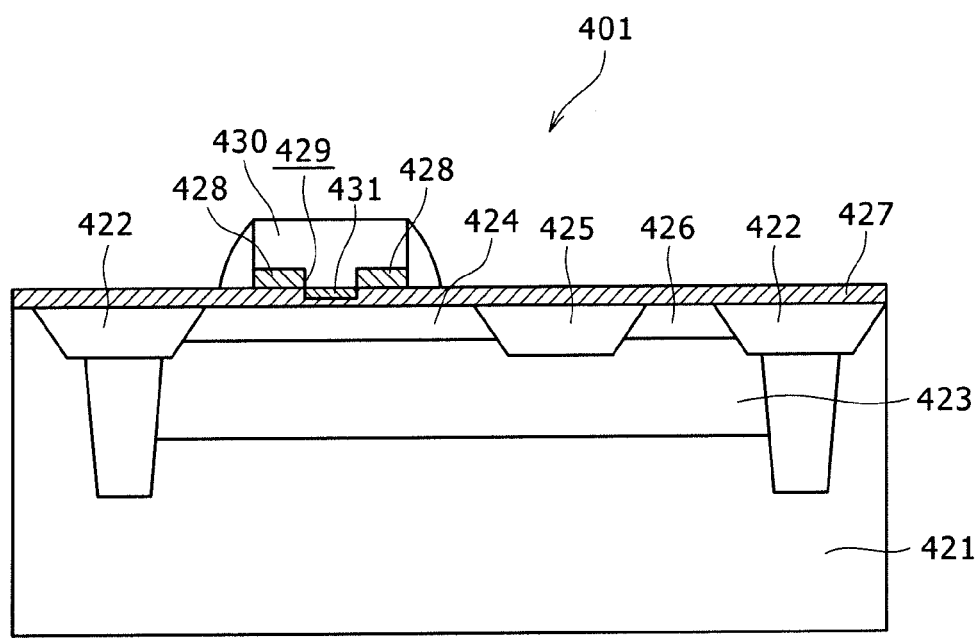
FIG. 13 is a schematic sectional configuration view illustrating a method for suppressing diffusion of boron into an SiC layer in a heterojunction bipolar transistor.

As illustrated in FIG. 7, an image pickup unit 201S is provided with a solid-state image pickup device 210 in the image pickup system 200. This image pickup unit 201S is provided on a light-condensing side thereof with a light-condensing optical unit 202S that can focus an image. Connected to the image pickup unit 201S is a signal processing unit 203S having a signal processing circuit or the like for processing signals, which have been photoelectrically converted at the solid-state image pickup device 210, into an image. Image signals processed by the signal processing unit 203S can be stored in an image storage unit (not shown). In the above-described image pickup system 200, the solid-state image pickup device 1 described above in any one of the embodiments can be used as the solid-state image pickup device 210.

The solid-state image pickup device 1 according to the embodiments of the present invention is used in the image pickup system 200. Similar to the foregoing, it is hence possible to improve the spatial resolution power and to suppress color mixing. Highly-detailed, high-quality images can be obtained accordingly. As a consequence, improvements can be made in image quality.

It is to be noted that the image pickup system 200 is not limited to the above-described configuration and that the solid-state image pickup device 1 according to the embodiments of the present invention can be applied to any image pickup system irrespective of its configuration insofar as it is one making use of a solid-state image pickup device.

For example, the image pickup system 200 may be in a form that it is fabricated as a single chip, or in a module form that includes the image pickup unit and the signal processing unit or optical system packaged together and having an image pickup function.

The term "image pickup system" as used herein means for example, a camera or a portable appliance having an image pickup function. Further, the term "image pickup" encompasses not only the capturing of an image at the time of shooting by a general camera but also the detection of a fingerprint or the like in a broad sense.

3. Third Embodiment

[A] Device Configuration, Etc

Figure 14:
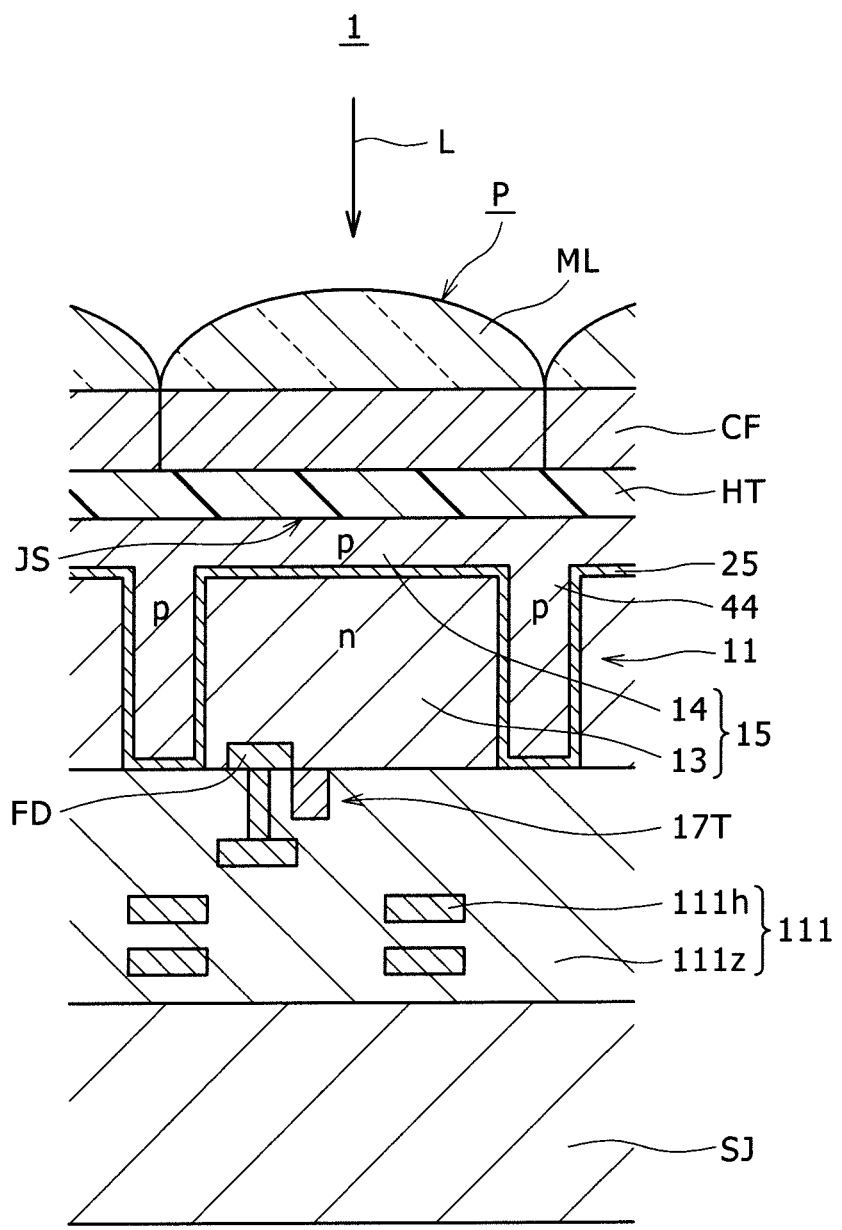
FIG. 14 is a fragmentary sectional view of a solid-state image pickup device in a third embodiment according to the present invention.
Figure 15:
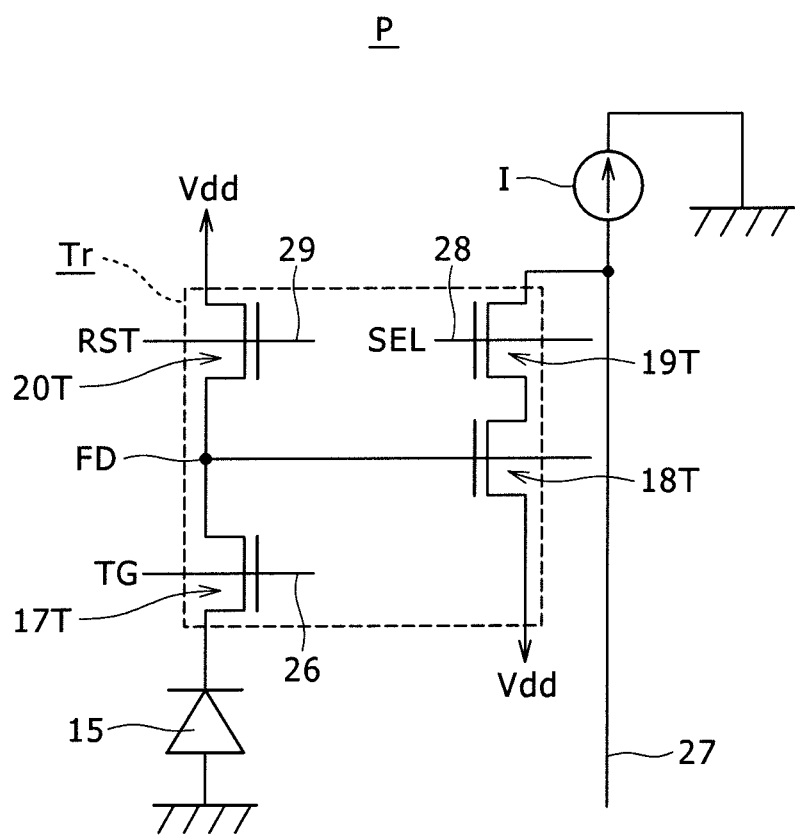
FIG. 15 is a fragmentary block diagram of the solid-state image pickup device in the third embodiment according to the present invention.

FIGS. 14 and 15 are views illustrating certain essential parts of the solid-state image pickup device 1 according to the third embodiment of the present invention. In FIG. 14, a section of a pixel P is illustrated. On the other hand, FIG. 15 illustrates a circuit configuration of the pixel P.

As illustrated in FIGS. 14 and 15, this embodiment is different in some configuration from the first embodiment, but includes certain common parts. With respect to these common parts, a description is thus omitted wherever appropriate.

As illustrated in FIGS. 14 and 15, the solid-state image pickup device 1 has pixels P. These pixels P are arranged such that in a plane (x-y plane) of a semiconductor substrate 11, plural ones of them are arrayed in each of a horizontal direction x and a vertical direction y extending at right angles relative to the horizontal direction x.

Each pixel P includes a photodiode 15 and a pixel transistor Tr as illustrated in FIGS. 14 and 15. In this embodiment, the pixel transistor Tr includes, as illustrated in FIG. 15, a transfer transistor 17T, an amplification transistor 18T, a selection transistor 19T and a reset transistor 20T, and performs an operation that reads signal charge from the photodiode 15.

As illustrated in FIG. 14, the solid-state image pickup device 1 has the semiconductor substrate 11 made of a monocrystalline silicon semiconductor, and photodiodes 15 are arranged on this semiconductor substrate 11.

In the solid-state image pickup device 1, each transfer transistor 17T is arranged, as illustrated in FIG. 14, on a surface (a lower surface in FIG. 14) of the semiconductor substrate 11. Although not illustrated in FIG. 14, the transistors forming the pixel transistor Tr, the transistors being other than the transfer transistor 17T, are also arranged on the surface of the semiconductor substrate 11.

As illustrated in FIG. 14, a wiring layer 111 is arranged such that it covers pixel transistors such as the transfer transistors 17T. A supporting substrate SJ is arranged on a surface of the wiring layer 111, the surface being on a side opposite to the side of the semiconductor substrate 11.

On a back surface of the semiconductor substrate 11 (an upper surface in FIG. 14), on other hand, an antireflective film HT is arranged. In addition, color filters CF and microlenses ML are arranged for every pixels P on the back surface of the semiconductor substrate 11. The semiconductor substrate 11 is, therefore, constructed such that incident light L entering from the side of the back surface is captured at the photodiodes 15.

In other words, the solid-state image pickup device 1 of this embodiment is a "CMOS image sensor of the back-side illuminated type."

Details of each section will be described.

(a) Photodiode 15

In the solid-state image pickup device 1, each photodiode 15, as illustrated in FIG. 14, includes an N-type region 13 and a P-type region 14, and is constructed such that incident light L is captured at an acceptance surface JS and is photoelectrically converted to produce and accumulate signal charge.

In the photodiode 15, the N-type region 13, as illustrated in FIG. 14, is arranged inside the semiconductor substrate 11 which is, for example, a silicon semiconductor, and functions as a charge accumulating region.

As illustrated in FIG. 14, inter-pixel isolation regions 44 are arranged inside the semiconductor substrate 11 such that they electrically isolate the plural pixels P from each other. In each region defined by its corresponding inter-pixel isolation regions 44, the N-type region 13 of the photodiode 15 is arranged. Each inter-pixel isolation region 44 is arranged by filling a silicon semiconductor layer, which is doped with boron (B), in a trench arranged in the semiconductor substrate 11, although its details will be mentioned subsequently herein.

In this embodiment, the trench arranged in the semiconductor substrate 11 is covered at a surface thereof by a silicon carbide layer 25, and the corresponding inter-pixel isolation region 44 is arranged inside the trench covered by the silicon carbide layer 25.

In the photodiode 15, the P-type region 14 is arranged on a surface of the N-type region 13, said surface being on a side where the incident light L enters, as shown in FIG. 14, functions as a hole accumulation region, and suppresses the occurrence of dark current. The P-type region 14 is a silicon semiconductor layer doped with boron (B), and has been arranged by epitaxial growth.

Although not illustrated in the figure, another P-type region (not shown) is also arranged on a surface, which is on a side opposite to the surface where the incident light L enters, in the photodiode 15, and similar to the P-type region 14, functions as a hole accumulation region and suppresses the occurrence of dark current.

As described above, the photodiode 15 is formed to have an HAD (Hole Accumulation Diode) structure.

In this embodiment, the photodiode 15 is arranged such that the silicon carbide layer 25 is interposed between the N-type region 13 and the P-type region 14.

Described specifically, the silicon carbide layer 25 is integrally formed with a lower surface of the P-type region 14 and that of the inter-pixel isolation region 44 in the photodiode 15.

The silicon carbide layer 25 has been formed by epitaxial growth, although its details will be mentioned subsequently herein.

As illustrated in FIG. 15, the photodiode 15 is grounded at an anode, and is constructed such that accumulated signal charge (electrons in this embodiment) is read by a pixel transistor Tr and is outputted as an electric signal to a vertical signal line 27.

Figure 16A:
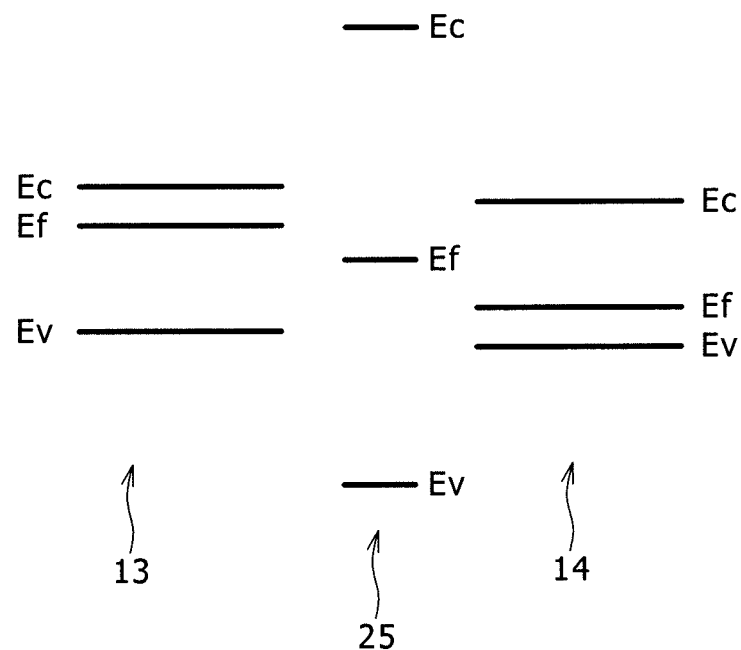
FIGS. 16A and 16B are band diagrams of the section of a photodiode in the third embodiment according to the present invention.
Figure 16B:
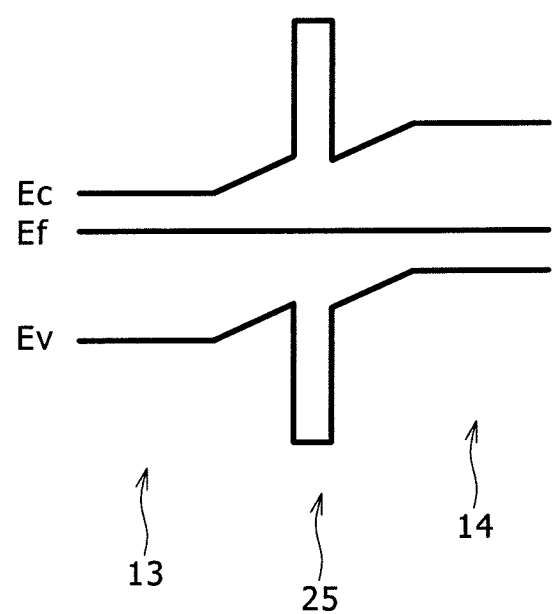

FIGS. 16A and 16B are band diagrams of the section of the photodiode 15 in the third embodiment according to the present invention.

FIG. 16A shows a band diagram of individual elements that make up the photodiode 15, while FIG. 16B is a band diagram of the photodiode 15 in which the individual elements are joined together.

As illustrated in FIG. 16A, the N-type region 13 and P-type region 14, both of which are formed of silicon (Si), are narrower in band gap than the silicon carbide layer 25 formed of silicon carbide (SiC). Described specifically, the band gap of silicon (Si) is 1.2 eV, and the band gap of silicon carbide (SiC) is about 3 eV or so.

As illustrated in FIG. 16B, a large barrier therefore exists at the part of the silicon carbide layer 25 interposed between the N-type region 13 and the P-type region 14. In this embodiment, however, the width of the silicon carbide layer 25 is so small that carriers are allowed to penetrate and migrate by the tunnel effect.

(b) Pixel Transistor Tr

In the solid-state image pickup device 1, each pixel transistor Tr includes, as illustrated in FIG. 15, the transfer transistor 17T, amplification transistor 18T, selection transistor 19T and reset transistor 20T, and performs an operation that reads signal charge from the photodiode 15.

Although not illustrated in FIG. 14, the individual transistors which make up the pixel transistor Tr are arranged on the front side of the semiconductor substrate 11, on which the wiring layer 111 is arranged. For example, each transistor is an N-channel MOS transistor, and is arranged in the P-type region (not shown) arranged on the side of the front side of the semiconductor substrate 11. Each gate is formed, for example, with polysilicon. Further, each transistor is covered by the wiring layer 111.

In the pixel transistor Tr, the transfer transistor 17T is constructed such that as illustrated in FIG. 15, signal charge produced at the photodiode 15 is transferred to a floating diffusion FD.

Described specifically, as illustrated in FIG. 15, the transfer transistor 17T is arranged between a cathode of the photodiode 15 and the floating diffusion FD. To the gate of the transfer transistor 17T, a transfer line 26 is electrically connected. Upon application of a transfer signal TG from the transfer line 26 to the gate of the transfer transistor 17T, signal charge accumulated at the photodiode 15 is transferred to the floating diffusion FD.

In the pixel transistor Tr, the amplification transistor 18T is constructed such that as illustrated in FIG. 15, an electrical signal which has been converted from charge into a voltage at the floating diffusion FD is amplified and outputted.

Described specifically, as illustrated in FIG. 15, the gate of the amplification transistor 18T is electrically connected to the floating diffusion FD. Further, the drain of the amplification transistor 18T is electrically connected to a power supply line Vdd, and its source is electrically connected to the selection transistor 19T. When the selection transistor 19T is selected to take an "ON" state, a constant current is supplied from a constant current source I to the amplification transistor 18T so that the amplification transistor 18T operates as a source follower. When a selection signal is supplied to the selection transistor 19T, an electrical signal converted from charge into a voltage at the floating diffusion FD is, therefore, amplified at the amplification transistor 18T.

As illustrated in FIG. 15, the pixel transistor Tr is constructed such that upon input of a selection signal, the selection transistor 19T outputs to the vertical signal line 27 the electrical signal outputted from the amplification transistor 18T.

Described specifically, as illustrated in FIG. 15, the gate of the selection transistor 19T is connected to an address line 18 via which a selection signal is supplied. When the selection signal is supplied, the selection transistor 19T is brought into an "ON" state so that the output signal amplified by the amplification transistor 18T as described above is outputted to the vertical signal line 27.

In the pixel transistor Tr, the reset transistor 20T is constructed to reset the gate potential of the amplification transistor 18T as illustrated in FIG. 15.

Described specifically, as illustrated in FIG. 15, the gate of the reset transistor 20T is electrically connected to a reset line 29 through which a reset signal is supplied. Further, the drain of the reset transistor 20T is electrically connected to the power supply line Vdd, and its source is electrically connected to the floating diffusion FD. When the reset signal is supplied from the reset line 29 to the gate of the reset transistor 20T, the reset transistor 20T resets the gate potential of the amplification transistor 18T to a power supply voltage via the floating diffusion FD.

In the foregoing, the individual wirings of the transfer line 26, address line 28 and reset line 29 are routed such that they are connected to the gates of the individual transistors of the plural pixels P arrayed in the horizontal direction (row direction) x. Therefore, operations of the above-described individual transistors are performed at the same time with respect to the pixels P in the single row.

(c) Wiring Layer 111

In the solid-state image pickup device 1, the wiring layer 111 includes wirings 111h and an insulating layer 111z as illustrated in FIG. 14. The wiring layer 111 is formed such that in the wiring layer 111z, the wirings 111h are electrically connected to the individual elements.

In this embodiment, the individual wirings 111h are formed in a stacked configuration such that they function as individual wirings such as the transfer line 26, address line 28, vertical signal line 27 and reset line 29 illustrated in FIG. 15.

For example, the wiring 111h is formed with a conductive metal material such as aluminum in the wiring layer 111. On the other hand, the insulating layer 111z is formed, for example, with an insulating material such as silicon oxide.

Further, the supporting substrate SJ is arranged on one side of the wiring layer 111, said one side being on an side opposite to the side where the semiconductor substrate 11 is located. For example, a substrate formed of a silicon semiconductor having a thickness of several hundreds micrometers is arranged as the supporting substrate SJ.

(d) Antireflection Film HT

In the solid-state image pickup device 1, the antireflective film HT is arranged, as illustrated in FIG. 14, on the back side (the upper side in FIG. 14) of the semiconductor substrate 11, said back side being on a side opposite to the front side (the lower side in FIG. 14) on which the individual elements such as the wiring layer 111 are arranged.

The antireflective film HT is constructed to prevent the incident light L, which is entering from the side of the back side of the semiconductor substrate 11, from being reflected at the back side of the semiconductor substrate 11. In other words, the antireflective film HT is formed by suitably selecting its material and film thickness such that an antireflecting function can be exhibited by optical interferential action. In this embodiment, it is preferred to form the antireflective film HT with a material having a high refractive index. Particularly preferred is to form it with a material the refractive index is 1.5 or higher.

For example, an insulating film such as a silicon nitride film may be arranged as the antireflective film HT. As an alternative, an insulating film such as a hafnium oxide film (HfO$_2$ film) (refractive index, n: 2.0) may also be arranged as the antireflective film HT.

(f) Others

As illustrated in FIG. 14, the color filters CF and microlenses ML are additionally arranged on the side of the back side of the semiconductor substrate 11, specifically on the upper side of the antireflective film HT.

The color filters CF include, for example, a red filter layer (not shown), a green filer layer (not shown) and a blue filter layer (not shown). The individual filter layers of the three primary colors are arranged in a Bayer array such that they correspond to the individual pixels P. In other words, the color filters CF are configured such that light of different colors are transmitted between the respective pixels P arrayed adjacent to each other in the horizontal direction x and vertical direction y.

The microlenses ML are arranged corresponding to the individual pixels P. The microlenses ML are convex lenses curving outward in a convex form, and are formed such that the incident light L is condensed onto the photodiodes 15 of the respective pixels P. The microlenses ML are formed, for example, with an organic material such as a resin.

[B] Fabrication Process

A description will be made about certain essential parts of a fabrication process of the solid-state image pickup device 1.

FIGS. 17A through 17I show the fabrication process of the solid-state image pickup device 1 in the third embodiment according to the present invention.

Similar to FIG. 14, FIGS. 17A through 17I show sections and by going through the steps illustrated in the respective figures, the solid-state image pickup device 1 illustrated in FIG. 14 and the like is fabricated.

(a) Thinning of the Semiconductor Substrate 11

Figure 17A:
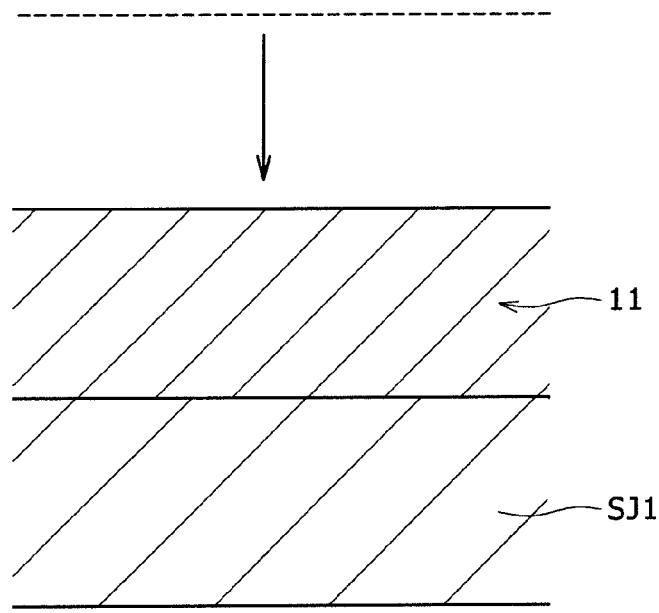
FIGS. 17A through 17I are views illustrating a fabrication process of the solid-state image pickup device in the third embodiment according to the present invention.

As illustrated in FIG. 17A, thinning of the semiconductor substrate 11 is first performed.

In this embodiment, the thinning is performed, as illustrated in FIG. 17A, by bonding the supporting substrate SJ1 on the front side (the lower side in FIGS. 17A through 17I) of the semiconductor substrate 11 and then removing portions of the semiconductor substrate 11 from the back side (the upper side in FIGS. 17A through 17I) of the semiconductor substrate 11.

By performing, for example, RIE (Reactive Ion Etching) treatment or CMP (Chemical Mechanical Polishing) treatment, the semiconductor substrate 11 is thinned to have a thickness of from 3 to 7 μm.

(b) Formation of the Trenches TR

Figure 17B:
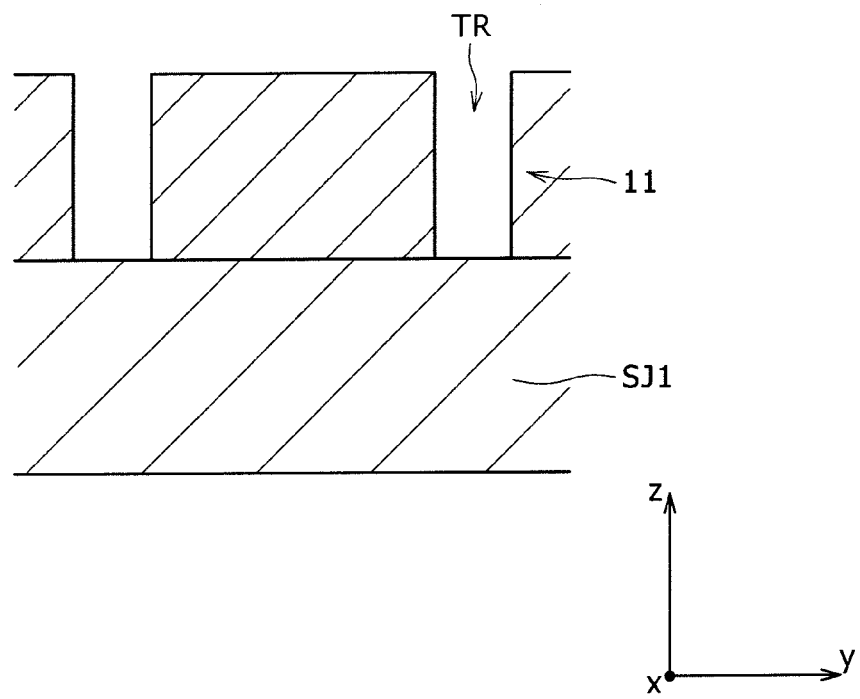

As illustrated in FIG. 17B, the trenches TR are next formed in the semiconductor substrate 11.

In this embodiment, the trenches TR are formed, as illustrated in FIG. 17B, by removing the semiconductor substrate 11 at portions where the inter-pixel isolation regions 44 (see FIG. 14) are to be formed.

Described specifically, a resist pattern (not shown) is formed by photolithography on the semiconductor substrate 11 such that the backside of the semiconductor substrate 11 is exposed at areas corresponding to the boundaries of the plural pixels P but is covered at the remaining areas. Using the resist pattern as a mask, portions of the semiconductors 11 are then selectively etched off to form the trenches TR.

In this embodiment, the trenches TR are formed, as illustrated in FIG. 17B, by subjecting the semiconductor substrate 11 to etching treatment until the front side of the supporting substrate SJ1 is exposed.

(c) Formation of the Silicon Carbide Layer 25

Figure 17C:
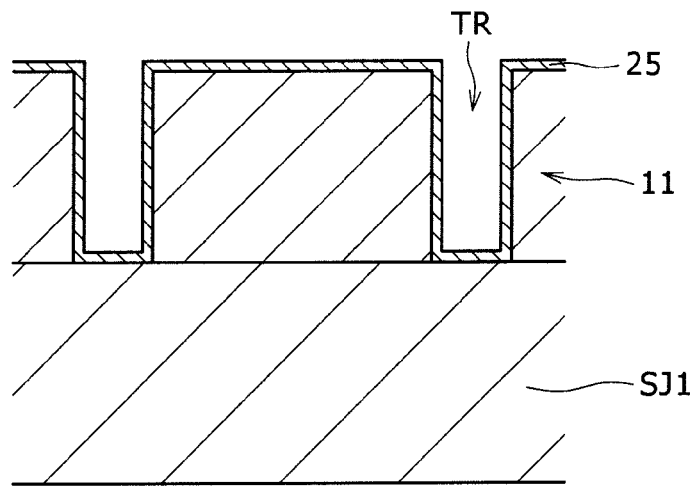

As illustrated in FIG. 17C, the silicon carbide layer 25 is next formed.

In this embodiment, the silicon carbide layer 25 is formed such that as illustrated in FIG. 17C, the back side (upper side) with the trenches TR formed therein is covered. In other words, the silicon carbide layer 25 is formed to integrally cover the inner surfaces of the trenches TR, in which the inter-pixel isolation regions 44 are to be formed, and also the upper side of the semiconductor substrate 11 at areas where the N-type regions of the photodiodes 15 are to be formed.

In this embodiment, the silicon carbide layer 25 is arranged by forming SiC into a film by epitaxial growth. For example, the silicon carbide layer 25 is arranged such that its carbon (C) concentration ranges from 0.1 to 0.5 atom % and its film thickness ranges from 5 to 10 μm.

For example, the silicon carbide layer 25 may be arranged under the following epitaxial growth conditions.

Feed gases: dichlorosilane ($SiCl_2H_2$: DCS), hydrogen chloride (HCl), monomethylsilane ($SiH_3CH_3$: MMS), and hydrogen ($H_2$)
Pressure of atmosphere for epitaxial growth: 6.7 kPa
Flow rate of dichlorosilane ($SiCl_2H_2$: DCS): 80 $cm^3$/min
Flow rate of hydrogen chloride (HCl): 15 $cm^3$/min
Flow rate of monomethylsilane ($SiH_3CH_3$: MMS): 50 $cm^3$/min
Flow rate of hydrogen ($H_2$): 20 L/min
Substrate temperature: 700° C.

It is to be noted that the above-described epitaxial growth conditions can be set in the following ranges.
Pressure of film-forming atmosphere: 2.67 kPa to 10.7 kPa
Flow rate of dichlorosilane (DCS): 40 $cm^3$/min to 120 $cm^3$/min
Flow rate of hydrogen chloride (HCl): 5 $cm^3$/min to 125 $cm^3$/min
Flow rate of monomethylsilane (MMS): 25 $cm^3$/min to 100 $cm^3$/min
Flow rate of hydrogen ($H_2$): 10 L/min to 30 L/min
Substrate temperature: 650° C. to 1,000° C.

(d) Formation of P-Type Region 14 and Inter-Pixel Isolation Regions 44

Figure 17D:
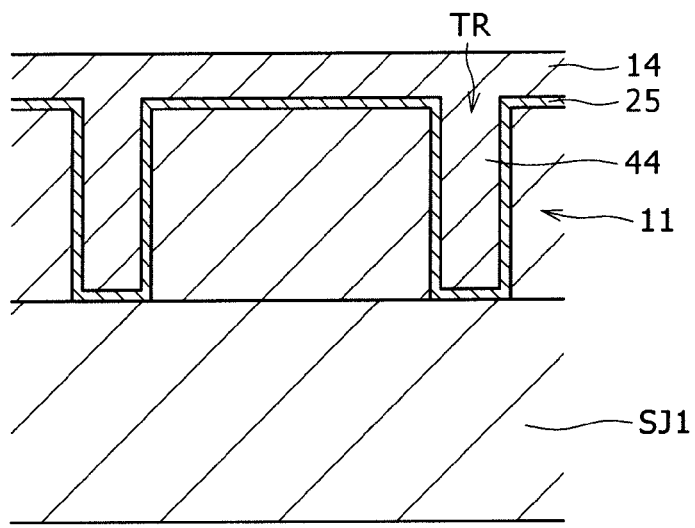
Figure 17D:
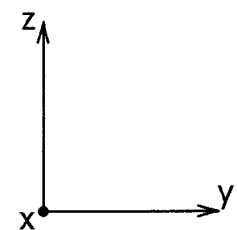

As illustrated in FIG. 17D, the P-type region 14 and inter-pixel isolation regions 44 are next formed.

In this fabrication process, the P-type region 14 which makes up each photodiode 15 is formed, as illustrated in FIG. 17D, on the back side of the semiconductor substrate 11 at each area where the N-type region 13 making up the same photodiode 15 is to be formed. The back side has been covered at the area by the silicon carbide layer 25 (see FIG. 14).

At the same time, the inter-pixel isolation regions 44 are also formed inside the trenches TR formed in the semiconductor substrate 11 and covered by the silicon carbide layer 25.

In this embodiment, the P-type region 14 and inter-pixel isolation regions 44 are formed by forming boron (B)-doped silicon semiconductor as a film by epitaxial growth. Described specifically, the boron (B)-doped silicon semiconductor is formed as a film such that the inner walls of the trenches TR and the areas of the upper side of the semiconductor substrate 11, where the N-type regions 13 of the photodiodes 15 are to be formed, are integrally covered.

For example, the P-type region 14 and inter-pixel isolation regions 44 may be formed to have a boron (B) concentration of $3 \times 10^{16}$ $atoms/cm^3$.

For example, the P-type region 14 and inter-pixel isolation regions 44 may be arranged under the following epitaxial growth conditions.

Feed gases: monosilane ($SiH_4$), diborane ($B_2H_6$), hydrogen chloride (HCl), and hydrogen ($H_2$)
Pressure of atmosphere for epitaxial growth: 1.33 kPa
Flow rate of monosilane ($SiH_4$): 150 $cm^3$/min
Flow rate of diborane ($B_2H_6$): 5 $cm^3$/min (the concentration of diborane ($B_2H_6$) is set at 100 ppm/$H_2$)
Flow rate of hydrogen chloride (HCl): 150 $cm^3$/min
Flow rate of hydrogen ($H_2$): 20 L/min
Substrate temperature: 750° C.

It is to be noted that the above-described epitaxial growth conditions can be set in the following ranges.
Pressure of atmosphere for epitaxial growth: 0.67 kPa to 2.67 kPa
Flow rate of monosilane ($SiH_4$): 100 $cm^3$/min to 200 $cm^3$/min
Flow rate of diborane ($B_2H_6$): 1 $cm^3$/min to 10 $cm^3$/min
Flow rate of hydrogen chloride (HCl): 100 $cm^3$/min to 200 $cm^3$/min
Flow rate of hydrogen ($H_2$): 10 L/min to 30 L/min
Substrate temperature: 700° C. to 1,000° C.

(e) Formation of Antireflective Film HT

Figure 17E:
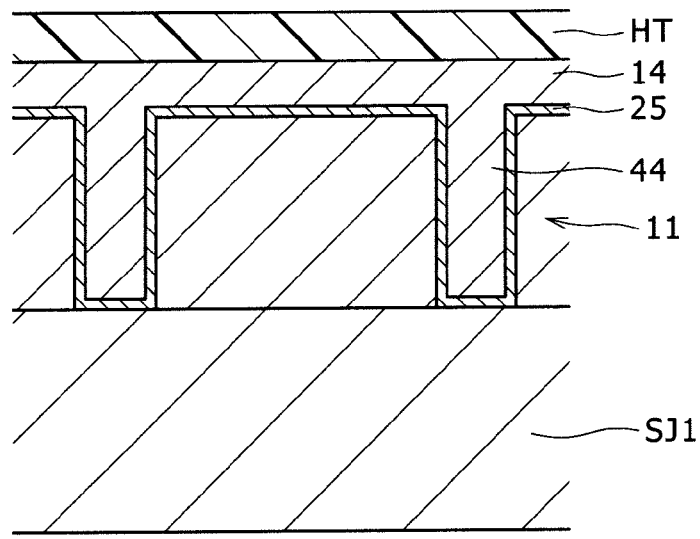

The antireflective film HT is next formed as illustrated in FIG. 17E.

In this embodiment, the antireflective film HT is formed such that as illustrated in FIG. 17E, it covers the upper side of the P-type region 14.

For example, the antireflective film HT is formed by depositing an insulating film in accordance with a CVD (Chemical Vapor Deposition) process.

(f) Arrangement of Supporting Substrate SJ2

Figure 17F:
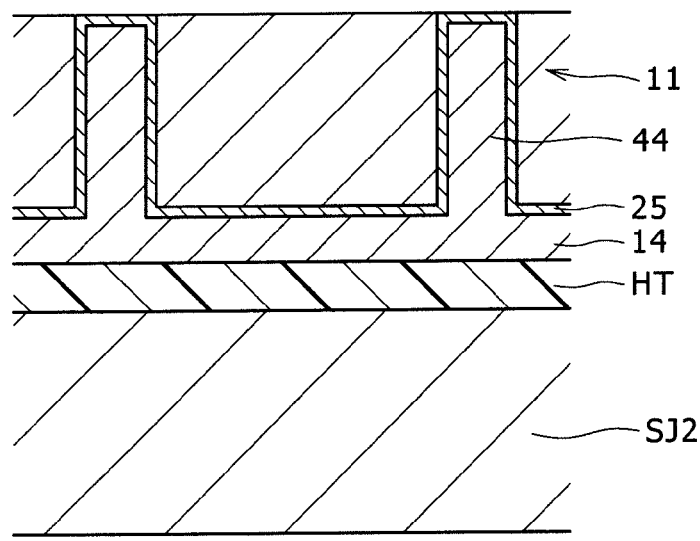
Figure 17F:
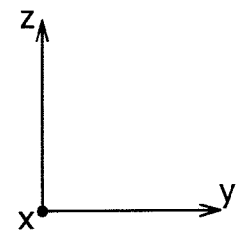

As illustrated in FIG. 17F, a supporting substrate SJ2 is next arranged.

In this fabrication process, the supporting substrate SJ2 is bonded to the side of the back side of the semiconductor substrate 11, where the P-type region 14 and antireflective film HT are arranged, as illustrated in FIG. 17F. Subsequently, the supporting substrate SJ1 bonded on the front side of the semiconductor substrate 11, said front side being opposite to the back side where the P-type region 14 and antireflective layer HT are arranged, is detached.

As a result, the semiconductor substrate 11 is brought into a state that it is exposed at the front side thereof.

(g) Formation of N-Type Regions 13 and Transfer Transistors 17T

Figure 17G:
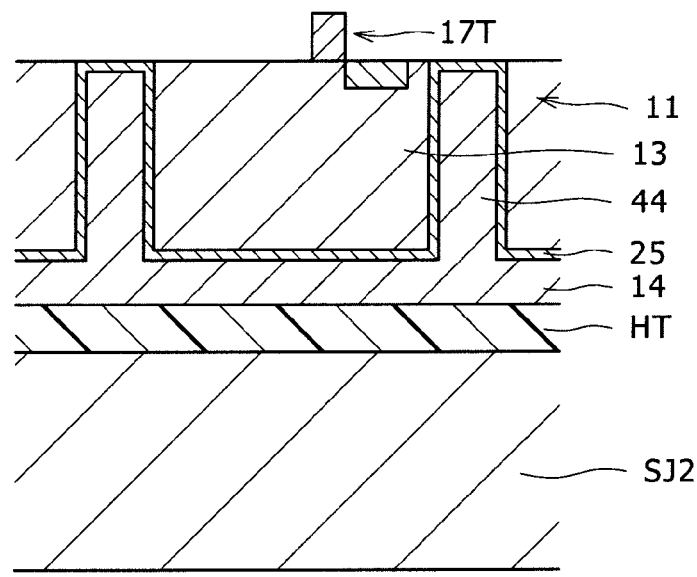

The N-type regions 13 and transfer transistors 17T are next formed as illustrated in FIG. 17G.

In this fabrication process, the N-type regions 13 are formed by introducing an N-type impurity into the semiconductor substrate 11 from the side of the exposed front side thereof as illustrated in FIG. 17G.

After gate insulating films and gate electrodes are formed on P-type regions (not shown) in the exposed front side of the semiconductor substrate 11, an N-type impurity is introduced by ion implantation to form source-drain regions, whereby the transfer transistors 17T are formed. The transistors, which make up the pixel transistors Tr and exclude the transfer transistors 17T, are also arranged likewise on the front side of the semiconductor substrate 11.

(h) Formation of Wiring Layer 111

Figure 17H:
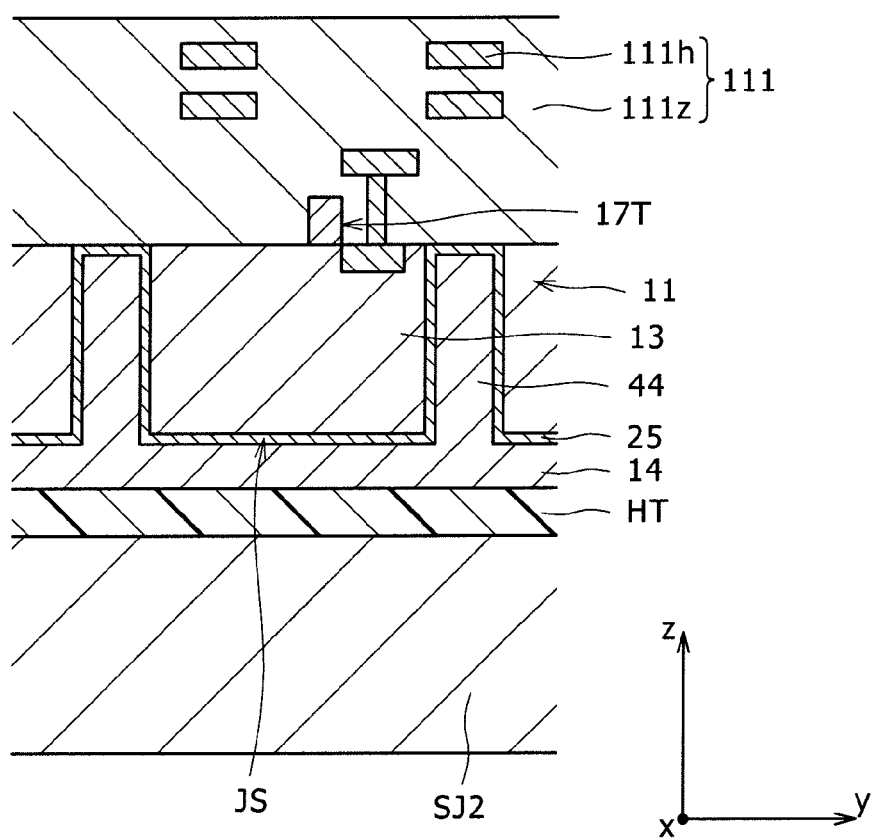

The wiring layer 111 is next formed as illustrated in FIG. 17H.

In this fabrication process, the wiring layer 111 is formed on the front side of the semiconductor substrate 11, where the elements such as the transfer transistors 17T are arranged. Specifically, the wiring layer 111 is formed such that contacts connected to the individual elements and the wirings 111h connected to the individual elements are covered by the insulating film 111z.

(i) Arrangement of Supporting Substrate SJ

Figure 17I:
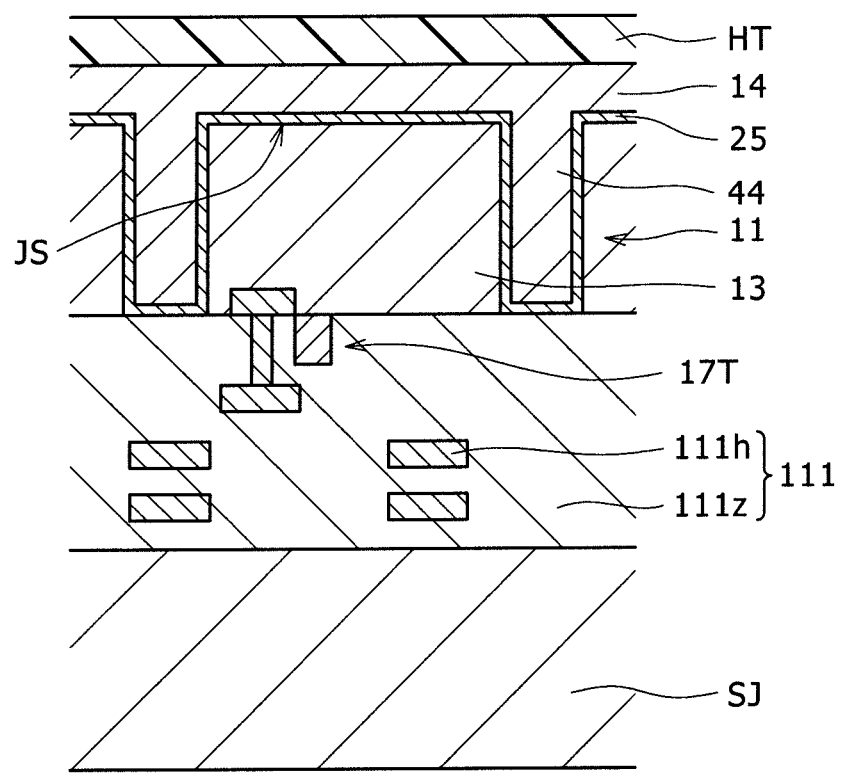

As illustrated in FIG. 17I, a supporting substrate SJ is next arranged.

In this fabrication process, the supporting substrate SJ is bonded to the side of the front side of the semiconductor substrate 11, on which the wiring layer 111 is arranged, as illustrated in FIG. 17I. Subsequently, the supporting substrate SJ2 is detached from the side of the back side of the semiconductor substrate 11, where the antireflective layer HT is arranged.

As a result, the semiconductor substrate 11 is brought into a state that it is exposed at the back side thereof.

(j) Formation of Color Filters CF and Microlenses ML

The color filters CF and microlenses ML are next formed as illustrated in FIG. 14.

In this fabrication process, the color filters CF are arranged on the side of the back side of the semiconductor substrate 11, where the antireflective film HT is arranged, as illustrated in FIG. 14. The microlenses MF are arranged on the color filters CF.

By performing the fabrication process as described above, the solid-state image pickup device 1 is completed as a CMOS image sensor of the back-side illuminated type.

[C] Conclusion

As has been described above, the P-type region 14 of each photodiode 15 is formed with boron-doped silicon semiconductor in this embodiment. In the photodiode 15, the silicon carbide layer 25 is arranged between the P-type region 14 and the N-type region 13. This silicon carbide layer 25 blocks diffusion of the boron doped in the P-type region 14 (see FIG. 14).

In this embodiment, the plural pixels P including the photodiodes 15 are arrayed in the semiconductor substrate 11, and the inter-pixel isolation regions 44 are arranged between the plural photodiodes 15. In this embodiment, the N-type regions 13 are formed inside the semiconductor substrate 11, and the inter-pixel isolation regions 44 are formed with boron-doped silicon semiconductor. Further, the silicon carbide layer 25 is arranged such that it is interposed between the N-type regions 13 and the inter-pixel isolation regions 44, and therefore, blocks diffusion of the boron doped in the inter-pixel isolation regions 44 (see FIG. 14).

The diffusion of boron (B) is, therefore, suppressed by the silicon carbide layer 25.

It is, therefore, possible in this embodiment to retain a steep PN junction in each photodiode 15 even after going through the respective fabrication steps, and to realize an increase in saturation charge quantity.

In addition, an upper part of the back side is also of an HAD structure having a steep PN junction, so that the pinning of excess electrons can be fully achieved to reduce the occurrence of white spots and dark current.

In this embodiment, the silicon carbide layer 25 has been formed by epitaxial growth, and therefore, is lattice-matched to the semiconductor substrate 11. At the interface between the N-type region 13 and the P-type region 14 that make up the photodiode 15, no strain exists although it would otherwise be produced due to a difference in lattice constant. Accordingly, the occurrence of stress-induced crystal defects is suppressed. The occurrence of white spots and dark current can, therefore, be reduced.

Further, the P-type regions 14 and inter-pixel isolation regions 44 have been formed by epitaxial growth, and therefore, are lattice-matched to the silicon carbide layer 25. Because the inter-pixel isolation regions 44 have been formed by epitaxial growth as described above, the occurrence of crystal defects is suppressed. As a consequence, the occurrence of white spots and dark current can be reduced. Therefore, the image quality can be improved.

In this embodiment, the solid-state image pickup device 1 corresponds to the solid-state image pickup device of the present invention. Further, the photodiodes 15 in this embodiment correspond to the photodiodes in the present invention. The semiconductor substrate 11 in this embodiment corresponds to the semiconductor substrate in the present invention. The N-type regions 13 in this embodiment correspond to the N-type regions in the present invention. The P-type region in this embodiment corresponds to the first silicon layer in the present invention. The inter-pixel isolation regions 44 in this embodiment correspond to the second silicon layers (element isolation regions) in the present invention. The portions of the silicon carbide layer 25, the portions being between the N-type regions 13 and the P-type region 14, in this embodiment correspond to the first silicon carbide layer in the present invention. The portions of the silicon carbide layer 25, the portions being arranged on the side walls and bottom walls of the inter-pixel isolation regions 44, in this embodiment correspond to the second silicon carbide layers (element isolation regions) in the present invention. The wiring layer 111 in this embodiment corresponds to the wiring layer in the present invention. The wirings 111h in this embodiment correspond to the wirings in the present invention. The insulating layer 111z in this embodiment corresponds to the insulating layer in the present invention.

4. Fourth Embodiment

[A] Device Configuration, Etc.

Figure 18:
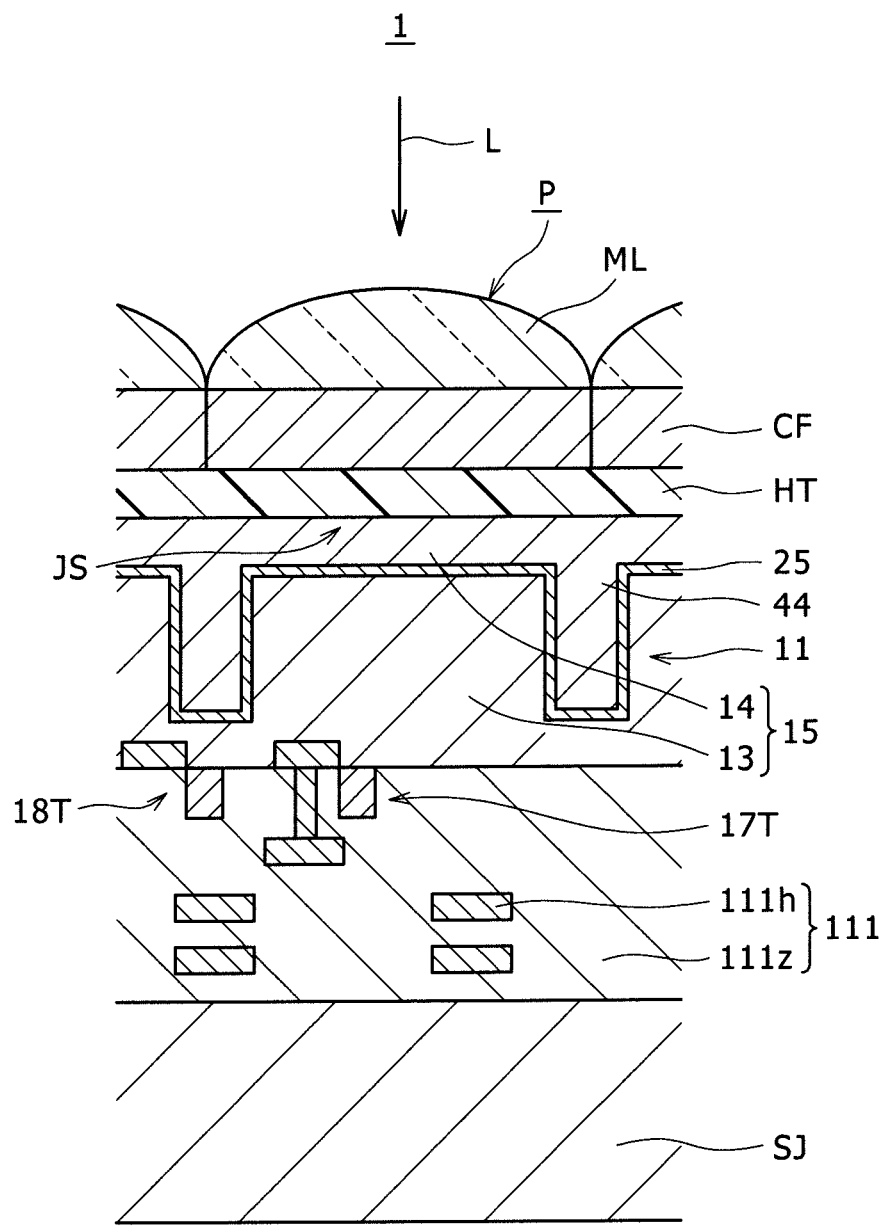
FIG. 18 is a fragmentary sectional view of a solid-state image pickup device in a fourth embodiment according to the present invention.

FIG. 18 is a view showing certain essential parts of a solid-state image pickup device 1 in the fourth embodiment according to the present invention. Similar to FIG. 14, FIG. 18 shows a section of a pixel P.

As illustrated in FIG. 18, this embodiment is different in the configuration of each inter-pixel isolation region 44 from the third embodiment. Except for this matter and those associated with this matter, this embodiment is similar to the third embodiment. With respect to the common features, their description is omitted herein.

As illustrated in FIG. 18, each inter-pixel isolation region 44 is arranged extending from the back side (upper side) of a semiconductor substrate 11 partway towards its front side (lower side). In other words, each inter-pixel isolation region 44 is not formed to extend through the semiconductor substrate 11 from its back side (upper side) to its front side (lower side) unlike the third embodiment.

As illustrated in FIG. 18, pixel transistors other than transfer transistors 17T are arranged on the front side of the semiconductor substrate 11 at areas corresponding to regions where the inter-pixel isolation regions 44 are formed. For example, amplification transistors 18T are arranged.

[B] Fabrication Process

A description will be made about certain essential parts of a fabrication process of the solid-state image pickup device 1.

Figure 19A:
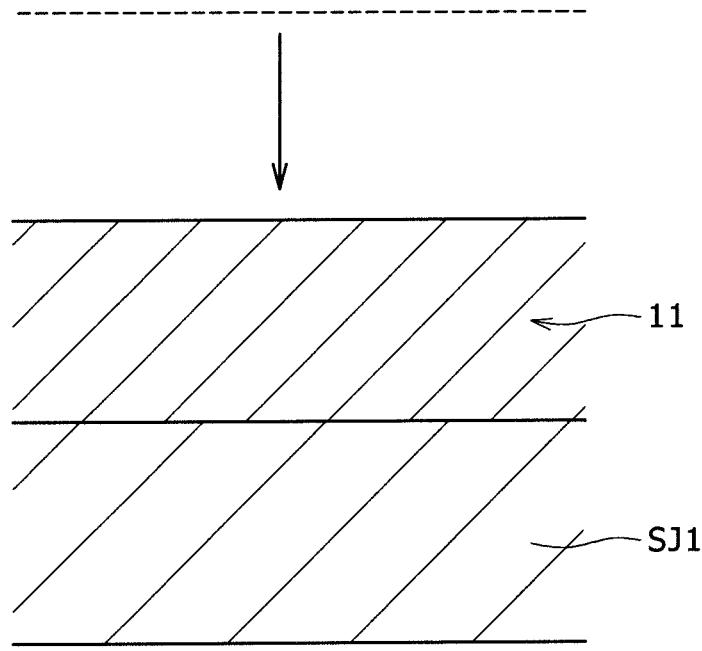
FIGS. 19A and 19B are views illustrating a fabrication process of the solid-state image pickup device in the fourth embodiment according to the present invention.
Figure 19B:
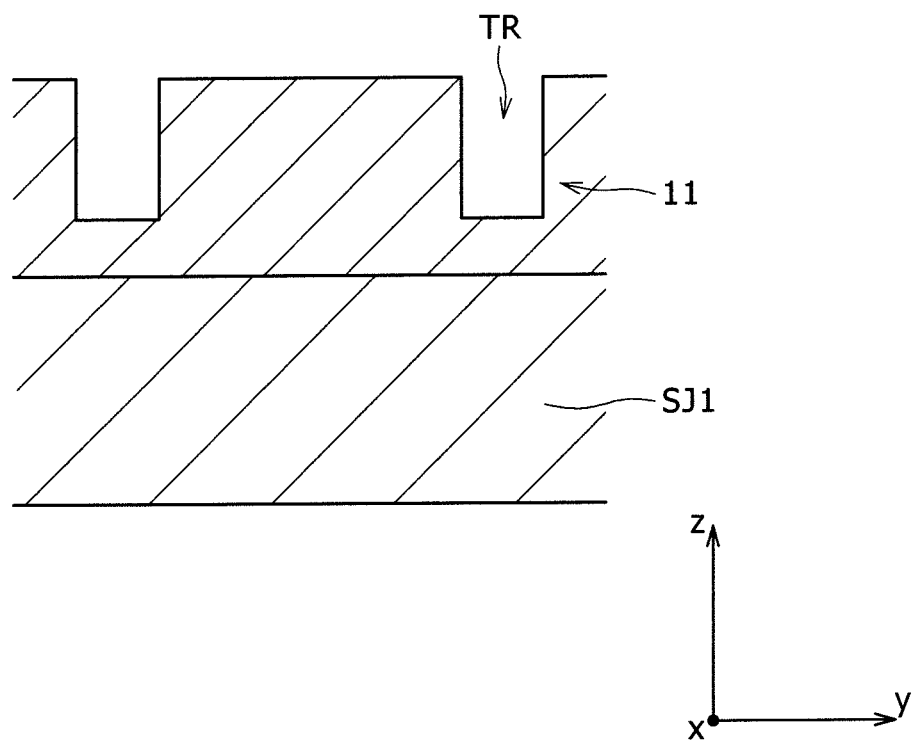

FIGS. 19A and 19B are views illustrating the fabrication process of the solid-state image pickup device 1 in the fourth embodiment according to the present invention.

Similar to FIG. 18, FIGS. 19A and 19B show sections, and by going through the steps illustrated in the respective figures, the solid-state image pickup device 1 illustrated in FIG. 18 is fabricated.

(a) Thinning of Semiconductor Substrate 11

As illustrated in FIG. 19A, thinning of the semiconductor substrate 11 is first performed.

In this fabrication process, the thinning is performed in a similar manner as in the third embodiment.

(b) Formation of Trenches TR

As illustrated in FIG. 19B, trenches TR are next formed in the semiconductor substrate 11.

In this fabrication process, the trenches TR are formed, as illustrated in FIG. 19B, by removing the semiconductor substrate 11 at portions where the inter-pixel isolation regions 44 (see FIG. 18) are to be formed.

In this embodiment, the depth of each trench TR is set such that the trench TR extends from the back side (upper side) of the semiconductor substrate 11 partway toward its front side (lower side). In other words, the semiconductor substrate 11 is not subjected to etching treatment to such an extent that the front side of the supporting substrate SJ1 is exposed.

For example, each trench TR is formed such that the thickness of the semiconductor substrate 11 ranges from 0.1 to 1 μm at the part of the trench TR.

(c) Formation of Individual Elements

By forming the individual elements next, the solid-state image pickup device 1 is completed as illustrated in FIG. 18.

In this embodiment, the individual elements are formed in a similar manner as in the third embodiment (see FIGS. 17C to 17I).

[C] Conclusion

As has been described above, the silicon carbide layer 25 in this embodiment is constructed such that similar to the first embodiment, diffusion of the boron doped in the P-type region 14 and inter-pixel isolation regions 44 is blocked (see FIG. 18).

It is, therefore, possible in this embodiment to retain a steep PN junction in each photodiode 15 even after going through the respective fabrication steps, and to realize an increase in saturation charge quantity.

In addition, an upper part of the back side is also of an HAD structure having a steep PN junction, so that the pinning of excess electrons can be fully achieved to reduce the occurrence of white spots and dark current.

In this embodiment, the inter-pixel isolation regions 44 are arranged extending from the back side (upper side) of the semiconductor substrate 11, where incident light L enters, partway toward its front side (lower side). In addition to the above-described advantageous effect, the arrangement of the individual elements that make up each pixel P can be freely set. In other words, the freedom of their layout can be enhanced.

It is to be noted that similar to the third embodiment, the individual elements which make up this embodiment correspond to the individual elements in the present invention.

5. Fifth Embodiment

[A] Device Configuration, Etc.

Figure 20:
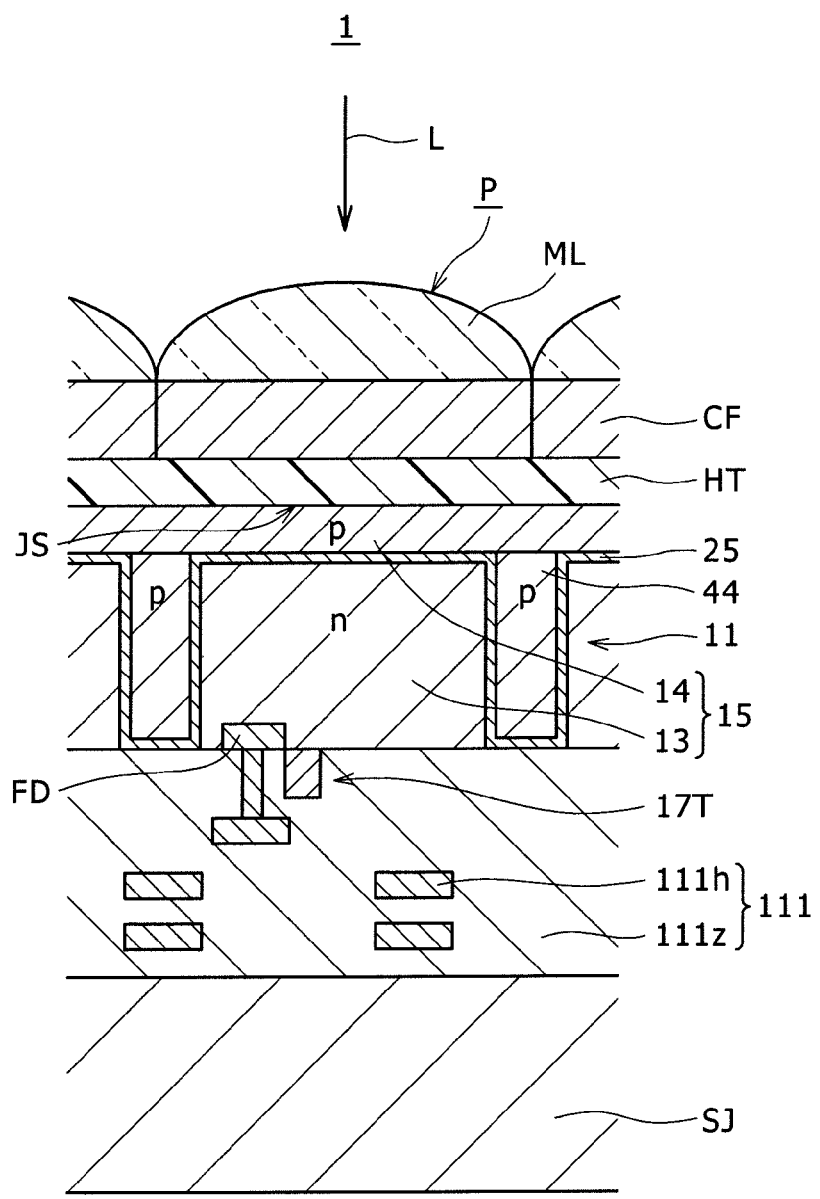
FIG. 20 is a fragmentary sectional view of a solid-state image pickup device in a fifth embodiment according to the present invention.

FIG. 20 is a view showing certain essential parts of a solid-state image pickup device 1 in the fifth embodiment according to the present invention. Similar to FIG. 14, FIG. 20 shows a section of a pixel P.

As illustrated in FIG. 20, P-type region 14 and inter-pixel isolation regions 44 are formed at different impurity concentrations, respectively, in this embodiment. Except for this matter and those associated with this matter, this embodiment is similar to the third embodiment. With respect to the common features, their description is omitted herein.

In this embodiment, the inter-pixel isolation regions 44 are formed in a similar manner as in the third embodiment. However, the P-type region 14 is formed to have a higher impurity concentration than the inter-pixel isolation regions 44.

[B] Fabrication Process

A description will be made about certain essential parts of a fabrication process of the solid-state image pickup device 1.

[B-1] Fabrication Process 1

Figure 21A:
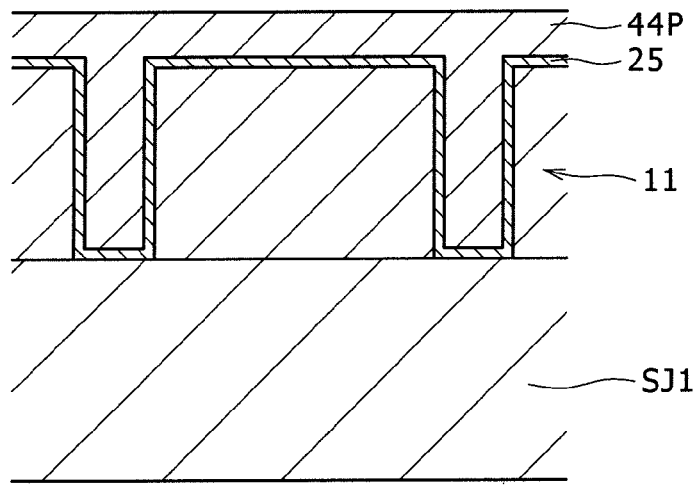
FIGS. 21A and 21B are views illustrating a first example of a fabrication process of the solid-state image pickup device in the fifth embodiment according to the present invention.
Figure 21B:
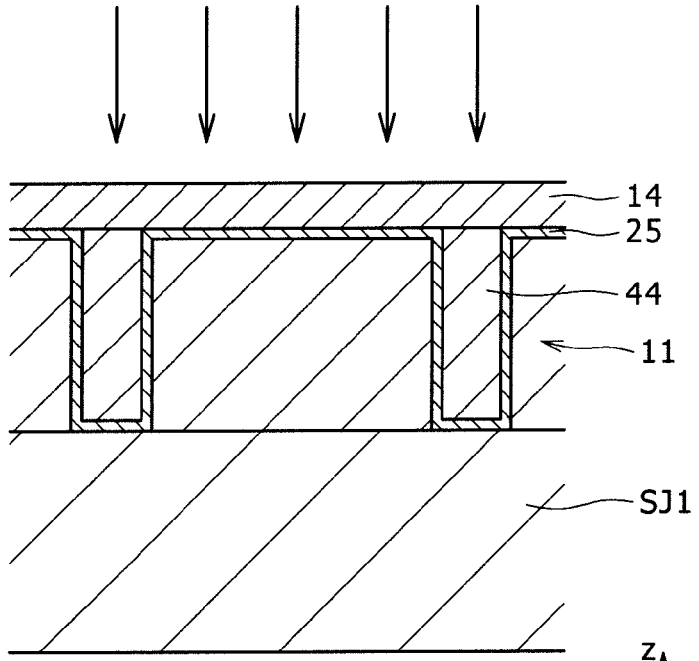

FIGS. 21A and 21B are views illustrating one example of the fabrication process of the solid-state image pickup device 1 in the fifth embodiment according to the present invention.

Similar to FIG. 20, FIGS. 21A and 21B show sections, and by going through the steps illustrated in the respective figures, the solid-state image pickup device 1 illustrated in FIG. 20 is fabricated.

(a) Formation of P-Type Silicon Layer 44P

As illustrated in FIG. 21A, a P-type silicon layer 44P is first formed.

In this fabrication process, the P-type silicon layer 44P is formed by subjecting boron (B)-doped silicon semiconductor to epitaxial growth in a similar manner as shown in FIG. 17D with respect to the third embodiment.

Described specifically, the P-type silicon layer 44P is formed on the back side of the semiconductor substrate 11 at areas where the N-type regions 13 making up the photodiodes 15 are to be formed (see FIG. 20). The back side has been covered at the areas by the silicon carbide layer 25.

At the same time, the P-type silicon layer P is also formed inside the trenches TR (see FIGS. 17B to 17D) formed in the semiconductor substrate 11 and covered by the silicon carbide layer 25.

(b) Ion Implantation of Impurity

Ion implantation of a P-type impurity is next performed as illustrated in FIG. 21B.

In this fabrication process, boron (B) is introduced by ion implantation into the P-type silicon layer 44P in portions where the P-type regions 14 are to be formed (see FIG. 21A).

Described specifically, $BF_2$ is introduced at implantation energy of 30 eV by ion implantation to achieve an implantation dose of $5 \times 10^{13}$ atoms/cm$^2$.

As a result, the P-type regions 14 are formed at a higher impurity concentration than the inter-pixel isolation regions 44.

It is to be noted that the ion implantation conditions are not limited to the above-described conditions and can be selectively determined as needed insofar as the P-type regions 14 can be provided with a higher impurity concentration than the inter-pixel isolation regions 44.

(c) Formation of Individual Elements

By forming the individual elements next, the solid-state image pickup device 1 is completed as illustrated in FIG. 20.

In this fabrication process, the individual elements are formed in a similar manner as in the third embodiment (see FIGS. 17C to 17I).

[B-2] Fabrication Process 2

The fabrication process of the solid-state image pickup device 1 of this embodiment is not limited to the above-described one example.

Figure 22A:
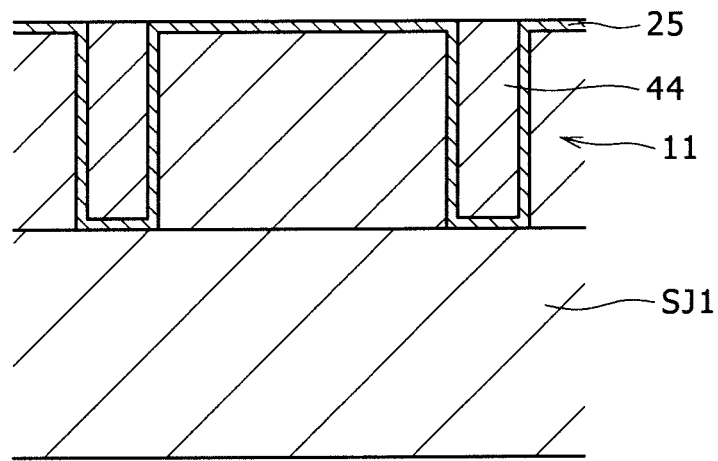
FIGS. 22A and 22B are views illustrating a second example of the fabrication process of the solid-state image pickup device in the fifth embodiment according to the present invention.
Figure 22B:
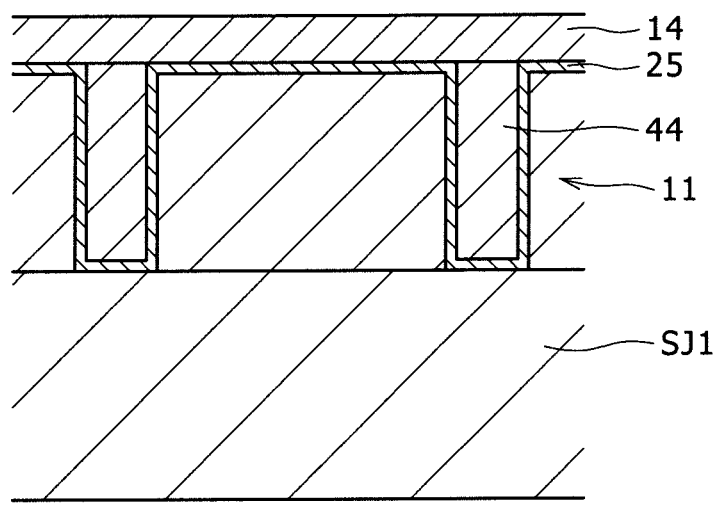
Figure 22B:
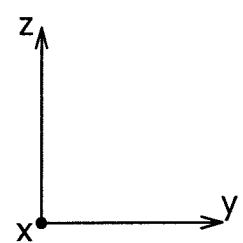

FIGS. 22A and 22B are views illustrating another example of the fabrication process of the solid-state image pickup device 1 in the fifth embodiment according to the present invention.

Similar to FIG. 20, FIGS. 22A and 22B show sections, and by going through the steps illustrated in the respective figures, the solid-state image pickup device 1 illustrated in FIG. 20 is fabricated.

(a) Surface Exposure of Silicon Carbide Layer 25

In this embodiment, the surface of the silicon carbide layer 25 may be exposed as illustrated in FIG. 22A after the formation of the P-type silicon layer 44P as illustrated in FIG. 21A.

The surface of silicon carbide layer 25 may be exposed by removing an upper part of the P-type silicon layer 44P in accordance with RIE treatment or CMP treatment.

(b) Formation of P-Type Region 14

The P-type region 14 is next formed as illustrated in FIG. 22B.

In this fabrication process, the P-type region 14 is formed by depositing boron (B)-doped silicon semiconductor as a film such that the P-type region 14 is provided with a higher impurity concentration than the P-type silicon layer 44P. Described specifically, the P-type region 14 is formed by increasing the gas flow rate of diborane ($B_2H_6$).

(c) Formation of Individual Elements

By forming the individual elements next, the solid-state image pickup device 1 is completed as illustrated in FIG. 20.

In this fabrication process, the individual elements are formed in a similar manner as in the third embodiment (see FIGS. 17C to 17I).

[C] Conclusion

As has been described above, the silicon carbide layer 25 in this embodiment is constructed such that similar to the first embodiment, diffusion of the boron doped in the P-type region 14 and inter-pixel isolation regions 44 is blocked (see FIG. 20).

It is, therefore, possible in this embodiment to retain a steep PN junction in each photodiode 15 even after going through the respective fabrication steps, and to realize an increase in saturation charge quantity.

In this embodiment, the P-type region 14 has a higher impurity concentration of boron than the inter-pixel isolation regions 44. The pinning effect can, therefore, be enhanced in this embodiment, thereby making it possible to further reduce the occurrence of white spots and dark current. Therefore, the image quality can be improved.

It is to be noted that similar to the third embodiment, the individual elements which make up this embodiment correspond to the individual elements in the present invention.

6. Sixth Embodiment

[A] Device Configuration, Etc.

Figure 23:
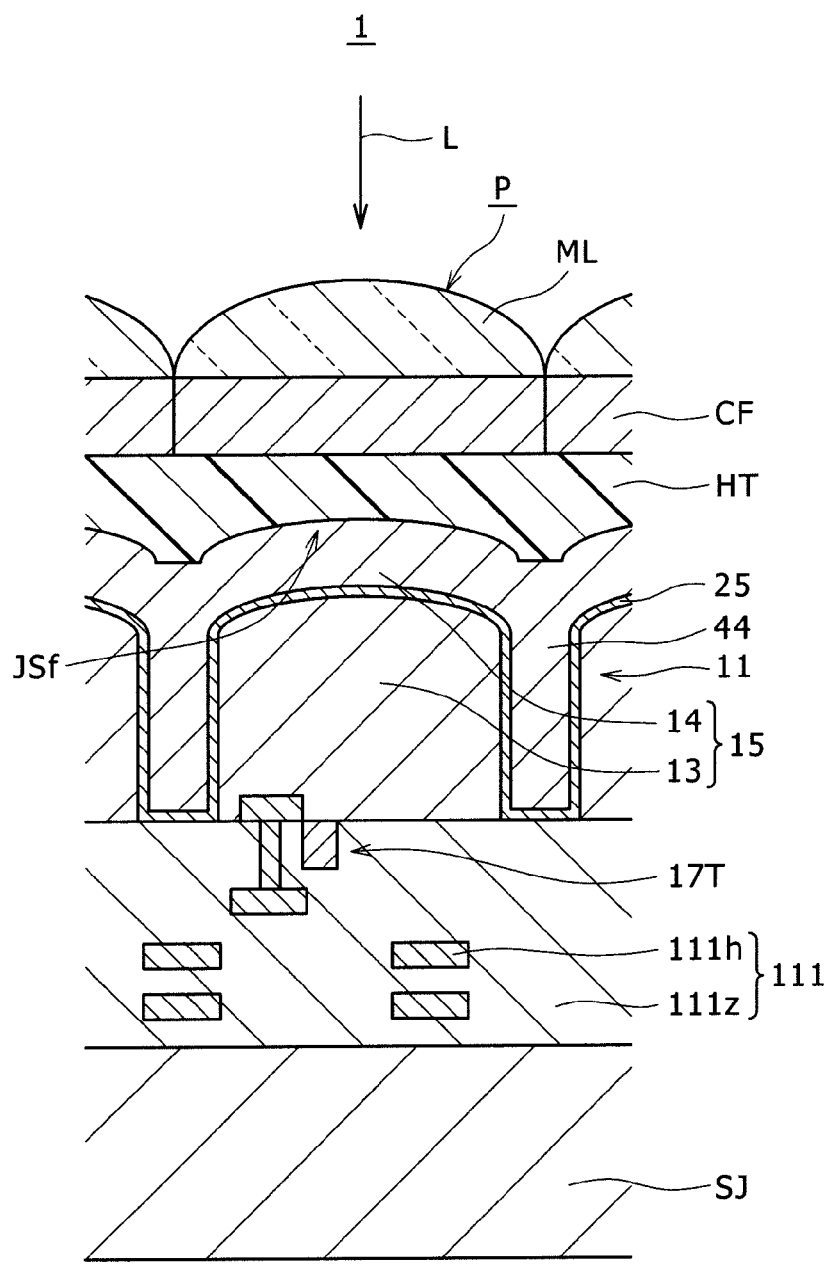
FIG. 23 is a fragmentary sectional view of a solid-state image pickup device in a sixth embodiment according to the present invention.

FIG. 23 is a view showing certain essential parts of a solid-state image pickup device 1 in the sixth embodiment according to the present invention. Similar to FIG. 14, FIG. 23 shows a section of a pixel P.

As illustrated in FIG. 23, an acceptance surface JSf of each photodiode 15 in this embodiment is different in shape from that in the third embodiment. Except for this matter and those associated with this matter, this embodiment is similar to the third embodiment. With respect to the common features, their description is omitted herein.

As illustrated in FIG. 23, an upper surface of a P-type region 14 in each photodiode 15 is formed such that similar to a microlens ML, the upper surface defines at a central part thereof a curved surface protruding toward a side on which incident light L enters. In addition, an upper surface of an N-type region 14 in each photodiode 15 is formed such that the upper surface defines at a central part thereof a curved surface protruding toward the side on which incident light L enters.

A silicon carbide layer (refractive index, n: 2.63) is arranged to cover the curved surface.

In other words, the P-type region 14, silicon carbide layer 25 and N-type region 13 are each formed in the shape of a lens such that incident light L is condensed to a center.

[B] Fabrication Process

A description will be made about certain essential parts of a fabrication process of the above-described solid-state image pickup device 1.

Figure 24A:
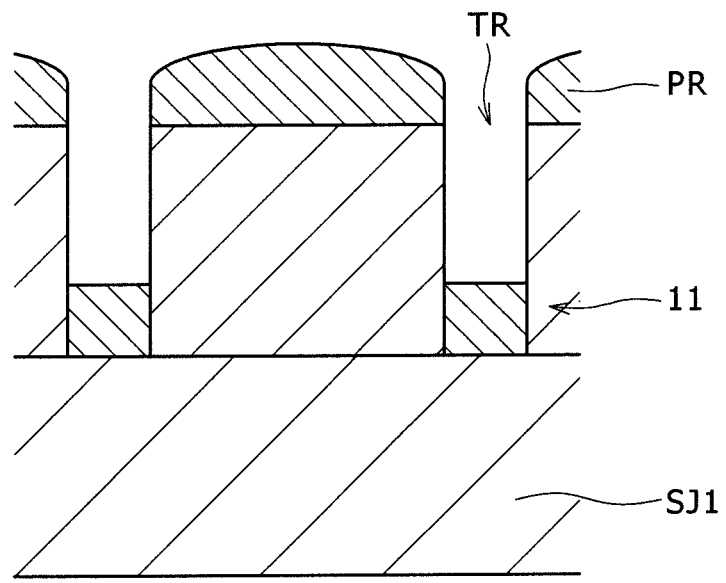
FIGS. 24A through 24G are views illustrating a fabrication process of the solid-state image pickup device in the sixth embodiment according to the present invention.
Figure 24B:
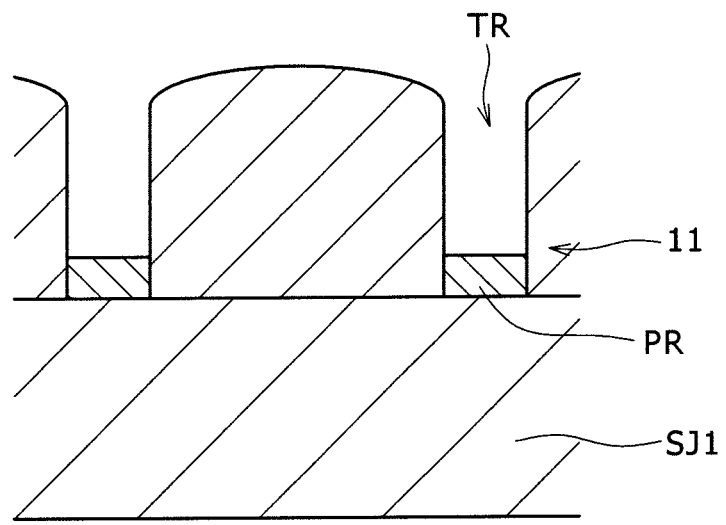
Figure 24B:
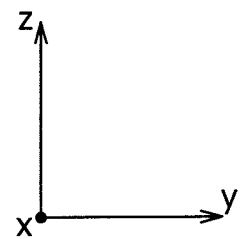

FIGS. 24A and 24B are views illustrating the fabrication process of the solid-state image pickup device 1 in the sixth embodiment according to the present invention.

Similar to FIG. 23, FIGS. 24A to and 24G show sections, and by going through the steps illustrated in the respective figures, the solid-state image pickup device 1 illustrated in FIG. 23 is fabricated.

(a) Formation of Resist Pattern PR

A resist pattern PR is first formed as illustrated in FIG. 24A.

In this fabrication process, trenches TR are formed before the formation of the resist pattern PR as illustrated in FIG. 17B with respect to the third embodiment. Subsequently, as illustrated in FIG. 24A, the resist pattern PR is formed such that it corresponds to the shapes of the acceptance surfaces JSf of the photodiodes 15.

Described specifically, after a photoresist film (not shown) is formed on the upper side of a semiconductor substrate 11 where the trenches TR have been formed and is processed patternwise, reflow treatment is applied to cause a thermal deformation such that the resist pattern PR is formed.

At this time, the resist pattern PR is formed such that the photoresist film remains on bottom walls of the respective trenches.

(b) Processing of Semiconductor Substrate 11

The semiconductor substrate 11 is next processed as illustrated in FIG. 24B.

In this fabrication process, by using the resist pattern PR as a mask and performing etch-back treatment, the semiconductor substrate 11 is processed such that the upper surfaces of its portions where the N-type regions 13 are to be formed are formed into curved surfaces.

Described specifically, etching treatment is performed with $O_2$ gas to expose the semiconductor substrate 11 at areas lateral to the trenches TR. $CF_4$-based gas is then added to bring the etching rate of silicon and that of the resist material close to each other, and the etching treatment is continued. In this manner, the semiconductor substrate 1 is formed into curved surfaces at the upper surfaces of its portions where the N-type regions 13 are to be formed.

(c) Removal of Resist Pattern PR

Figure 24C:
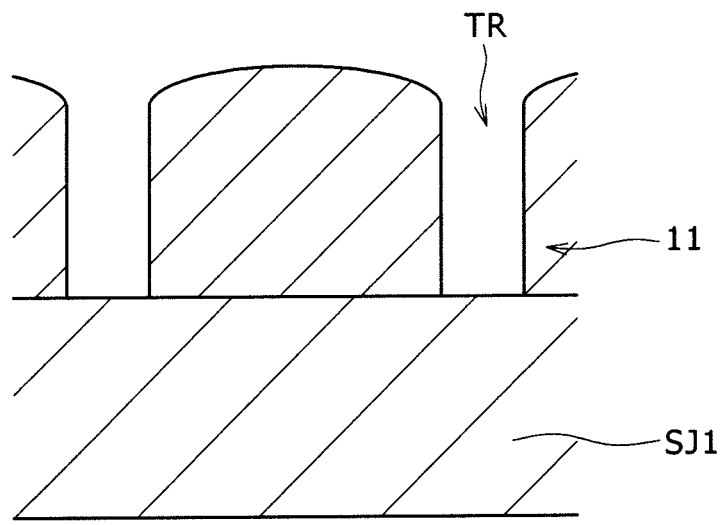

Removal of the resist pattern PR is next performed as illustrated in FIG. 24C.

According to this fabrication process, the resist pattern PR still remaining on the bottom walls of the respective trenches TR is removed in the above-described step.

(d) Formation of Silicon Carbide Layer 25

Figure 24D:
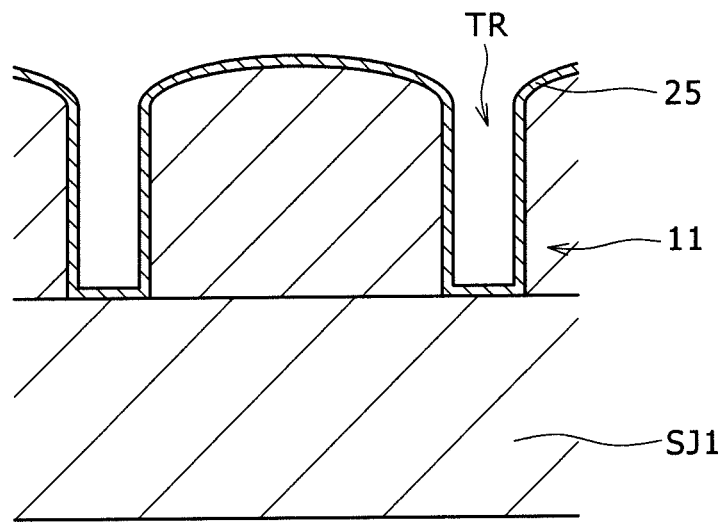
Figure 24D:
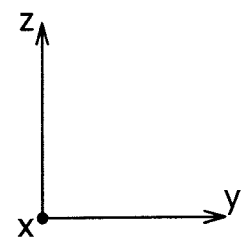

As illustrated in FIG. 24D, the silicon carbide layer 25 is next formed.

In this fabrication process, the silicon carbide layer 25 is formed such that in a similar manner as illustrated in FIG. 17C, the back side (upper side) of the semiconductor substrate 11, where the trenches TR are formed, is covered. In other words, the silicon carbide layer 25 is formed by epitaxial growth to cover the inner walls of the trenches TR, in which the inter-pixel isolation regions 44 are to be formed, and also the upper surfaces of the portions of the semiconductor substrate 11 where the N-type regions of the photodiodes 15 are to be formed.

(e) Formation of P-Type Region 14 and Inter-Pixel Isolation Regions 44

Figure 24E:
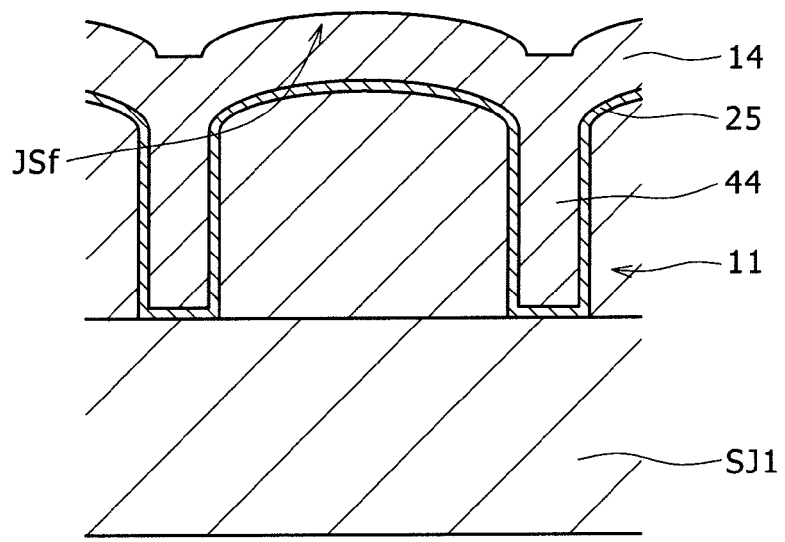

As illustrated in FIG. 24E, the P-type region 14 and inter-pixel isolation regions 44 are next formed.

In this fabrication process, the P-type region 14 is formed, in a similar manner as illustrated in FIG. 17D, on the back side of the semiconductor substrate 11 at each area where the N-type region 13 is to be formed. The back side has been covered at the area by the silicon carbide layer 25.

At the same time, the inter-pixel isolation regions 44 are also formed inside the trenches TR formed in the semiconductor substrate 11 and covered by the silicon carbide layer 25.

In this embodiment, the P-type region 14 and inter-pixel isolation regions 44 are formed by forming boron (B)-doped silicon semiconductor into a film by epitaxial growth.

(f) Formation of Antireflective Film HT

Figure 24F:
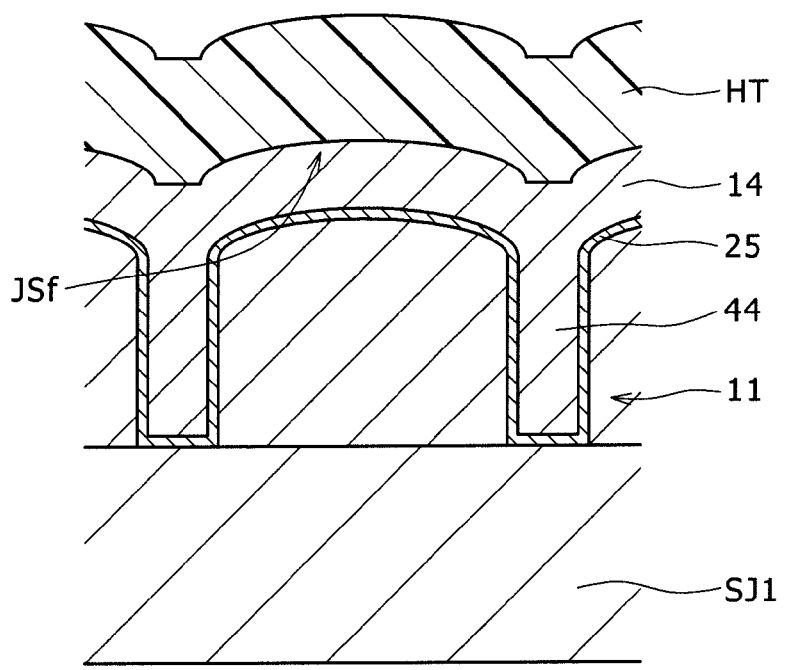
Figure 24F:
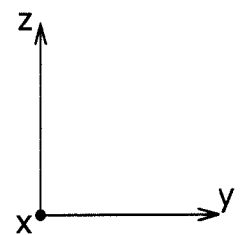

The antireflective film HT is next formed as illustrated in FIG. 24F.

In this fabricating process, the antireflective film HT is formed such that in a similar manner as illustrated in FIG. 17E, it covers the semiconductor substrate 11 at the back side thereof where the P-type region 14 is arranged.

As a result, the antireflective film HT is formed with its surface curved up and down along the curved surface of the semiconductor substrate 11.

(g) Planarization of Antireflective Film HT

Figure 24G:
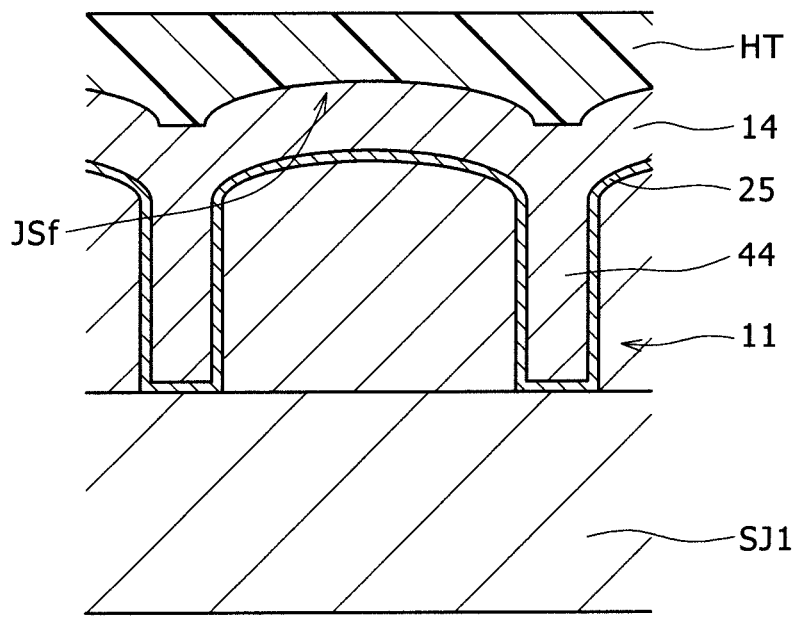
Figure 24G:
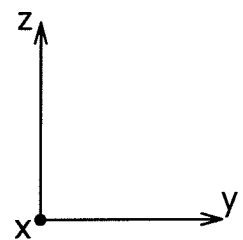

As illustrated in FIG. 24G, the surface of the antireflective film HT is next planarized.

In this fabrication process, CMP treatment or etch-back treatment is applied to planarize the antireflective film HT at the curved surface thereof on the side opposite to the side where the semiconductor substrate 11 is located.

(h) Formation of Individual Elements

By forming the individual elements next, the solid-state image pickup device 1 is completed as illustrated in FIG. 23.

In this fabrication process, the individual elements are formed in a similar manner as in the third embodiment (see FIGS. 17E to 17I).

[C] Conclusion

As has been described above, the silicon carbide layer 25 in this embodiment is constructed such that similar to the first embodiment, diffusion of the boron doped in the P-type region 14 and inter-pixel isolation regions 44 is blocked (see FIG. 23).

It is, therefore, possible in this embodiment to retain a steep PN junction in each photodiode 15 even after going through the respective fabrication steps, and to realize an increase in saturation charge quantity.

In this embodiment, the P-type region 14, silicon carbide layer 25 and N-type region 13 are all formed such that centers of their one sides, through which incident light L enters, are closer to a side, on which the incident light enters the photodiode, than peripheries of their one sides to condense the incident light L to a center of the photodiode. Therefore, the image quality can be improved.

It is to be noted that similar to the third embodiment, the individual elements which make up this embodiment correspond to the individual elements in the present invention.

[D] Modifications

Figure 25:
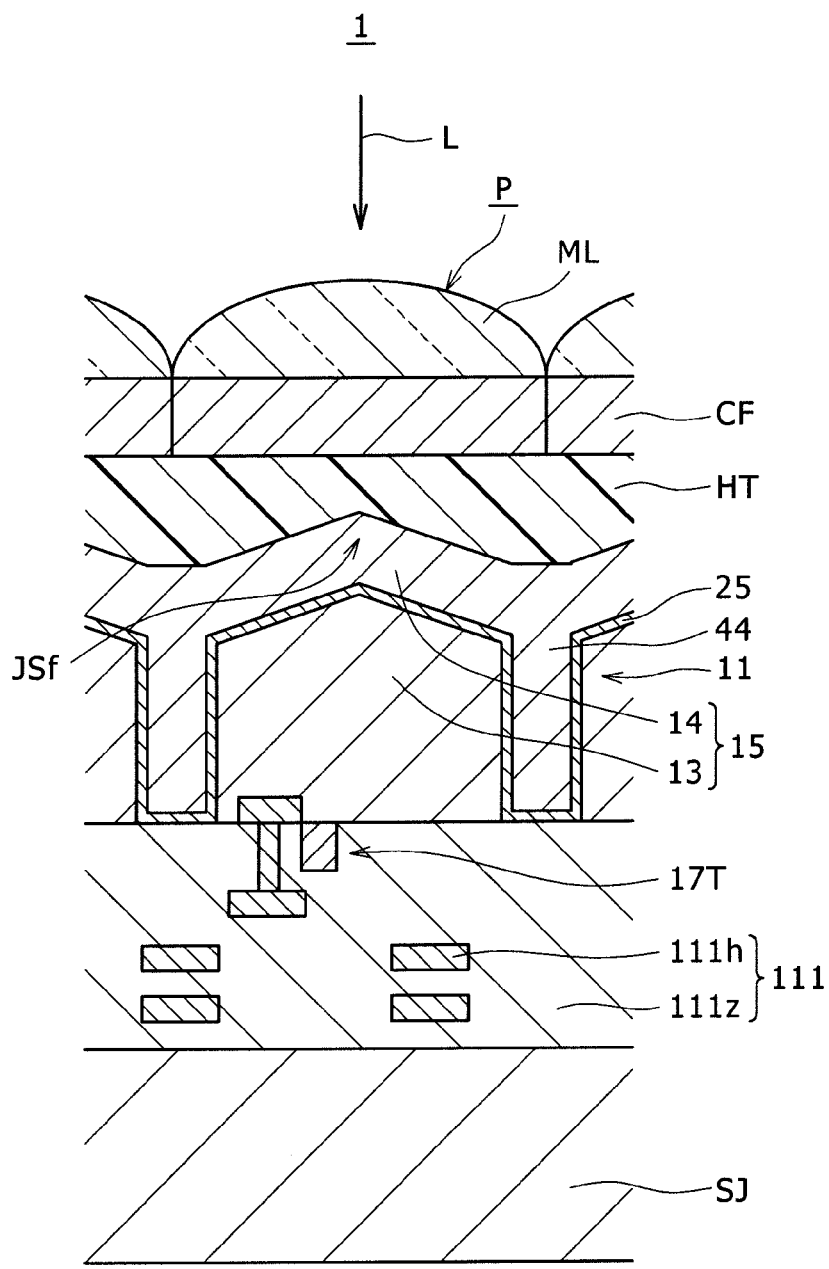
FIG. 25 is a fragmentary sectional view of a solid-state image pickup device in a first modification of the sixth embodiment according to the present invention.
Figure 25:
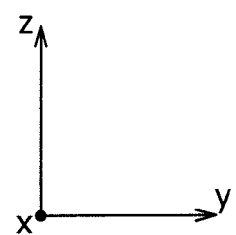
Figure 26:
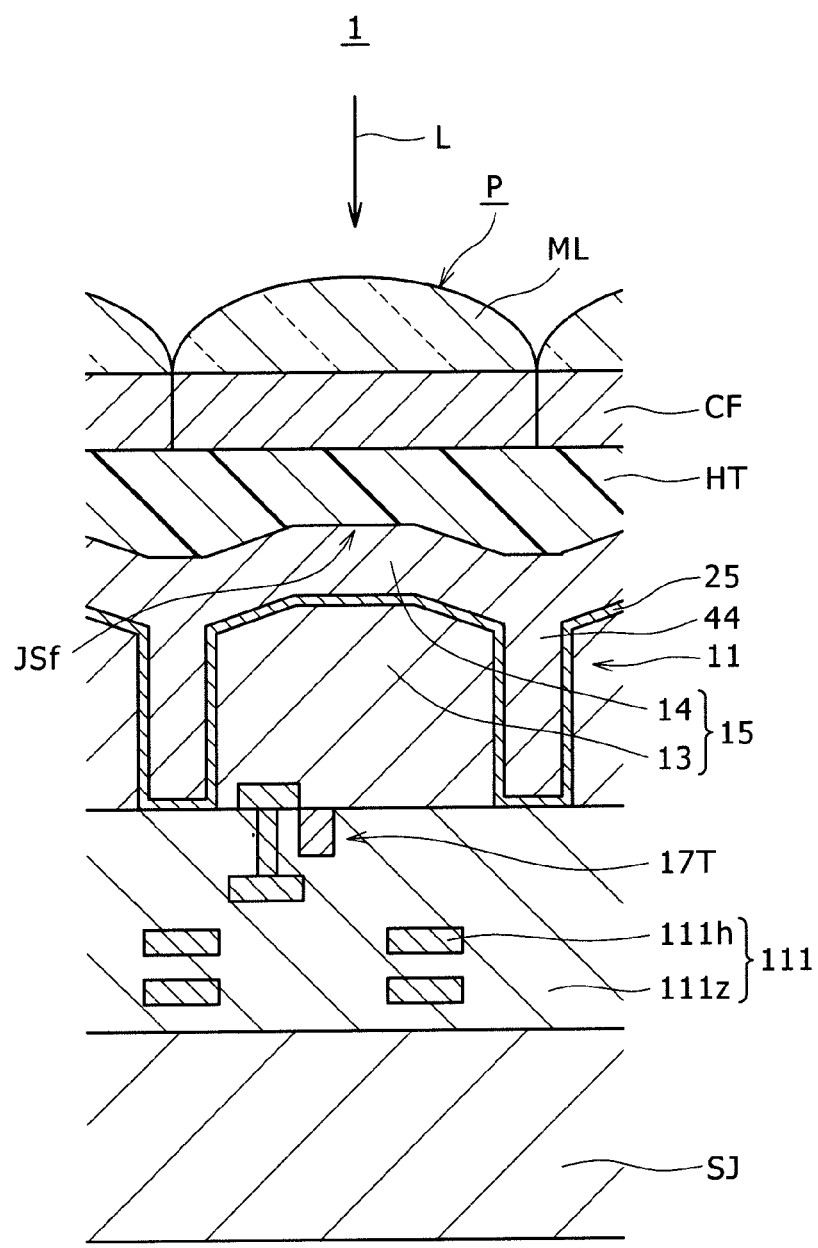
FIG. 26 is a fragmentary sectional view of a solid-state image pickup device in a second modification of the sixth embodiment according to the present invention.

FIG. 25 is a view showing certain essential parts of a solid-state image pickup device in a first modification of the sixth embodiment according to the present invention. On the other hand, FIG. 26 is a view showing certain essential parts of a solid-state image pickup device in a second modification of the sixth embodiment according to the present invention. Similar to FIG. 14, FIGS. 25 and 26 show sections of pixels P, respectively.

As illustrated in FIGS. 25 and 26, the acceptance surface JSf of each photodiode 15 may be formed into such a shape as including facets.

Described specifically, it is possible to form each photodiode 15 such that as illustrated in FIG. 25, a section of an upper part of the P-type region 14 has at a central part thereof a triangular shape protruding toward a side where incident light L enters. In addition, the photodiode 15 can also be formed such that a section of an upper part of the N-type region 13 has at a central part thereof a triangular shape protruding toward the side where incident light L enters.

As an alternative, it is also possible to form each photodiode 15 such that as illustrated in FIG. 26, a section of an upper part of the P-type region 14 has at a central part thereof a trapezoidal shape protruding toward a side where incident light L enters. In addition, the photodiode 15 can also be formed such that a section of an upper part of the N-type region 13 has at a central part thereof a trapezoidal shape protruding toward the side where incident light L enters.

In these modifications, the conditions of reflow treatment are adjusted as needed as described above to arrange resist patterns such that they conform to the shapes of the acceptance surfaces JSf, respectively. By performing etch-back treatment through the resist patterns as masks in a similar manner as described above, the above-described shapes can be formed.

7. Others

In practicing the present invention, the present invention is not limited to the above-described embodiments, and a variety of modifications can be adopted.

For example, the present invention is still applicable even if the conductivity type of each element is reversed. Upon epitaxially growing N-type silicon, for example, $PH_3$ is added in place of $B_2H_6$.

In addition, the above-described individual embodiments may be combined together as needed.

In the foregoing, the description was made about the cases in each of which the diffusion of boron (B) is prevented by the silicon carbide layer. However, the present invention shall not be limited to such a silicon carbide layer.

A silicon-germanium (SiGe) layer may be arranged in place of such a silicon carbide layer. The diffusion of boron (B) can also be prevented when such a silicon-germanium (SiGe) layer is used. Specifically, boron (B) binds to germanium (Ge) to form a Ge—B pair structure, and moreover, Ge itself hardly diffuses. It is, therefore, possible to suppress the diffusion of B (see, N. Moriya et al., "Boron Diffusion in Strained $Si_{1-x}$—$Ge_x$ Epitaxial Layers," Phys. Rev. Lett., 883 (1993)).

In a silicon-germanium (SiGe) layer, the higher the Ge concentration, the higher the diffusion preventing effect on B but the more prone to crystal defects (see, N. Moriya et al., "Boron Diffusion in Strained $Si_{1-x}$—$Ge_x$ Epitaxial Layers," Phys. Rev. Lett., 883 (1993)). It is, therefore, suitable to form a silicon-germanium (SiGe) layer, for example, under the below-described conditions.

[Forming Conditions for SiGe Layer]
Feed gases: $SiH_4$, $H_2$, $SiCl_2H_2$, $GeH_4$
Substrate temperature: 750° C.
Pressure: 1.33 kPa
Ge concentration: 20 atom %
Film thickness: 10 nm The present application contains subject matter related to that disclosed in Japanese Priority Patent Applications JP 2010-127690 and 2009-202301 filed in the Japan Patent Office on Jun. 3, 2010 and Sep. 2, 2009, respectively, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device having photodiodes, wherein the photodiodes are each comprised of:
    an N-type region formed in a semiconductor substrate, the semiconductor substrate being formed of a material other than silicon carbide;
    a first silicon carbide layer formed above the N-type region, and wherein the first silicon carbide layer is formed as a layer that is separate from the semiconductor substrate; and
    a P-type region formed in a first silicon layer formed above the first silicon carbide layer and doped with boron, and further wherein there are isolation regions formed at a level below the silicon carbide layer at opposite sides of the N-type region which prevent signal charge from passing to an adjacent pixel.

2. The solid-state image pickup device according to claim 1, wherein,
    the semiconductor substrate has element isolation regions defining regions for forming the photodiodes, respectively, and
    the element isolation regions each comprise:
        a second silicon carbide layer formed on an inner wall of an element isolation trench formed in the semiconductor substrate, and
        a second silicon layer filling an inside of the element isolation trench with the second silicon carbide layer interposed therebetween and doped with boron.

3. The solid-state image pickup device according to claim 2, wherein,
    P-type buried regions are formed as overflow drains in the semiconductor layer below the photodiodes, respectively, and
    silicon carbide layers are formed between the P-type buried regions and the photodiodes, respectively.

4. The solid-state image pickup device according to claim 2, wherein
    the first silicon carbide layer and second silicon carbide layer have been formed by epitaxial growth on the semiconductor substrate.

5. The solid-state image pickup device according to claim 4, wherein
    the first silicon carbide layer and second silicon carbide layer have been formed such that they become integral to each other.

6. The solid-state image pickup device according to claim 5, wherein
    the first silicon layer and second silicon layer have been formed by epitaxial growth on the first silicon carbide layer and second silicon carbide layer, respectively.

7. The solid-state image pickup device according to claim 6, wherein
    the first silicon layer and second silicon layer have been formed such that they become integral to each other.

8. The solid-state image pickup device according to claim 7, wherein,
    the photodiodes each further comprise a wiring layer with wirings arranged in an insulating layer,
    the wiring layer is formed on one of side of the semiconductor substrate, and
    the photodiodes are each arranged such that the photodiode captures light entered from the other side of the semiconductor substrate, said other side being located opposite to the one side, to generate signal charge.

9. The solid-state image pickup device according to claim 8, wherein
    the element isolation regions are each formed in a trench arranged in the semiconductor substrate from the other side partway toward the one side.

10. The solid-state image pickup device according to claim 8, wherein
    the first silicon layer has a higher impurity concentration of boron than the second silicon layer.

11. The solid-state image pickup device according to claim 8, wherein
    the first silicon layer, first silicon carbide layer and N-type region are formed such that centers of one sides of the first silicon layer, first silicon carbide layer and N-type region, through which incident light enters the photodiode, are closer to a side, on which the incident light enters, than peripheries of the one sides to condense the incident light.

12. The solid-state image pickup device according to claim 1, further comprising upper isolation elements formed on the silicon carbide layer at opposite sides of a light receiving portion of the pixel.

* * * * *